US010608663B2

(12) United States Patent
Gould et al.

(10) Patent No.: US 10,608,663 B2
(45) Date of Patent: Mar. 31, 2020

(54) REAL-NUMBER PHOTONIC ENCODING

(71) Applicant: Lighmatter, Inc., Boston, MA (US)

(72) Inventors: Michael Gould, Boston, MA (US);
Darius Bunandar, Boston, MA (US);
Shashank Gupta, Somerville, MA
(US); Nicholas C. Harris, Jamaica
Plain, MA (US)

(73) Assignee: Lightmatter, Inc., Boston, MA (US)

( * ) Notice: Subject to any disclaimer, the term of this patent is extended or adjusted under 35 U.S.C. 154(b) by 0 days.

(21) Appl. No.: 16/412,242

(22) Filed: May 14, 2019

(65) Prior Publication Data
US 2019/0372589 A1  Dec. 5, 2019

Related U.S. Application Data

(60) Provisional application No. 62/680,557, filed on Jun. 4, 2018, provisional application No. 62/755,402, filed on Nov. 2, 2018.

(51) Int. Cl.
*H04B 10/54* (2013.01)
*H04B 10/548* (2013.01)
(Continued)

(52) U.S. Cl.
CPC ............ *H03M 5/02* (2013.01); *H04B 10/524*
(2013.01); *H04L 27/02* (2013.01); *H04L 27/34*
(2013.01)

(58) Field of Classification Search
CPC ...... H04B 10/40; H04B 10/54; H04B 10/548; H04B 10/61
See application file for complete search history.

(56) References Cited

U.S. PATENT DOCUMENTS

| 3,872,293 A | 3/1975 | Green |
| 4,567,569 A | 1/1986 | Caulfield et al. |

(Continued)

FOREIGN PATENT DOCUMENTS

| CN | 101630178 A | 1/2010 |
| WO | WO 2005/029404 A2 | 3/2005 |

(Continued)

OTHER PUBLICATIONS

S. Kartalopoulos, "Introduction to DWDM Technology", IEEE Press, 2000, pp. 165-166.*

(Continued)

*Primary Examiner* — Shi K Li
(74) *Attorney, Agent, or Firm* — Wolf, Greenfield & Sacks, P.C.

(57) ABSTRACT

Optical encoders for encoding signed, real numbers using optical fields are described. The optical fields may be detected using coherent detection, without the need for independent phase and amplitude control. This encoding technique enables the use of simple and non-ideal modulators (e.g., modulators that provide neither pure phase nor pure amplitude modulation) for high-precision encoding. A photonic system implementing optical encoding techniques may include a modulator configured to be driven by a single electrical modulating signal and a coherent receiver. An optical transformation unit optically coupled between the modulator and the coherent receiver may transform the phase and/or the intensity of the modulated optical field. The optical encoding techniques described herein may be used in a variety of contexts, including high-speed telecommunications, on chip-phase sensitive measurements for sensing, communications and computing, and optical machine learning.

29 Claims, 35 Drawing Sheets

(51) Int. Cl.
| | |
|---|---|
| *H04B 10/61* | (2013.01) |
| *H03M 5/02* | (2006.01) |
| *H04B 10/524* | (2013.01) |
| *H04L 27/34* | (2006.01) |
| *H04L 27/02* | (2006.01) |

(56) References Cited

U.S. PATENT DOCUMENTS

| | | | |
|---|---|---|---|
| 4,607,344 A | 8/1986 | Athale et al. | |
| 4,633,428 A | 12/1986 | Byron | |
| 4,686,646 A | 8/1987 | Goutzoulis | |
| 4,739,520 A | 4/1988 | Collins, Jr. et al. | |
| 4,809,204 A | 2/1989 | Dagenais et al. | |
| 4,849,940 A | 7/1989 | Marks, II et al. | |
| 4,877,297 A | 10/1989 | Yeh | |
| 4,948,212 A | 8/1990 | Cheng et al. | |
| 5,004,309 A | 4/1991 | Caulfield et al. | |
| 5,077,619 A | 12/1991 | Toms | |
| 5,095,459 A | 3/1992 | Ohta et al. | |
| 5,333,117 A | 7/1994 | Ha et al. | |
| 5,383,042 A | 1/1995 | Robinson | |
| 5,394,257 A | 2/1995 | Horan et al. | |
| 5,428,711 A | 6/1995 | Akiyama et al. | |
| 5,495,356 A | 2/1996 | Sharony et al. | |
| 5,576,873 A | 11/1996 | Crossland et al. | |
| 5,640,261 A | 6/1997 | Ono | |
| 5,699,449 A | 12/1997 | Javidi | |
| 5,784,309 A | 7/1998 | Budil | |
| 5,953,143 A | 9/1999 | Sharony et al. | |
| 6,005,998 A | 12/1999 | Lee | |
| 6,060,710 A | 5/2000 | Carrieri et al. | |
| 6,178,020 B1 | 1/2001 | Schultz et al. | |
| 6,728,434 B2 | 4/2004 | Flanders | |
| 7,136,587 B1 | 11/2006 | Davis et al. | |
| 7,173,272 B2 | 2/2007 | Ralph | |
| 7,536,431 B2 | 5/2009 | Goren et al. | |
| 7,660,533 B1 | 2/2010 | Meyers et al. | |
| 7,876,248 B2 | 1/2011 | Berkley et al. | |
| 7,985,965 B2 | 7/2011 | Barker et al. | |
| 8,018,244 B2 | 9/2011 | Berkley | |
| 8,023,828 B2 | 9/2011 | Beausoleil et al. | |
| 8,026,837 B1 | 9/2011 | Valley et al. | |
| 8,027,587 B1 | 9/2011 | Watts | |
| 8,035,540 B2 | 10/2011 | Berkley et al. | |
| 8,129,670 B2 | 3/2012 | Laycock et al. | |
| 8,190,553 B2 | 5/2012 | Routt | |
| 8,223,414 B2 | 7/2012 | Goto | |
| 8,386,899 B2 | 2/2013 | Goto et al. | |
| 8,560,282 B2 | 10/2013 | Macready et al. | |
| 8,604,944 B2 | 12/2013 | Berkley et al. | |
| 8,620,855 B2 | 12/2013 | Bonderson | |
| 8,837,544 B2 | 9/2014 | Santori | |
| 9,009,560 B1 | 4/2015 | Matache et al. | |
| 9,250,391 B2 | 2/2016 | McLaughlin et al. | |
| 9,354,039 B2 | 5/2016 | Mower et al. | |
| 9,513,276 B2 | 12/2016 | Tearney et al. | |
| 9,791,258 B2 | 10/2017 | Mower | |
| 10,095,262 B2 | 10/2018 | Valley et al. | |
| 10,268,232 B2 | 4/2019 | Harris et al. | |
| 10,359,272 B2 | 7/2019 | Mower et al. | |
| 10,382,139 B2 | 8/2019 | Rosenhouse et al. | |
| 2003/0086138 A1 | 5/2003 | Pittman et al. | |
| 2003/0235363 A1 | 12/2003 | Pfeiffer | |
| 2003/0235413 A1 | 12/2003 | Cohen et al. | |
| 2004/0243657 A1 | 12/2004 | Goren et al. | |
| 2005/0036786 A1* | 2/2005 | Ramachandran | H04B 10/272 398/70 |
| 2006/0215949 A1 | 9/2006 | Lipson et al. | |
| 2007/0180586 A1 | 8/2007 | Amin | |
| 2008/0031566 A1 | 2/2008 | Matsubara et al. | |
| 2008/0212186 A1 | 9/2008 | Zoller et al. | |
| 2008/0212980 A1 | 9/2008 | Weiner | |
| 2008/0273835 A1 | 11/2008 | Popovic | |
| 2009/0028554 A1 | 1/2009 | Anderson et al. | |
| 2010/0165432 A1 | 7/2010 | Laycock et al. | |
| 2010/0215365 A1* | 8/2010 | Fukuchi | H04B 10/5053 398/43 |
| 2013/0011093 A1 | 1/2013 | Goh et al. | |
| 2013/0121706 A1* | 5/2013 | Yang | H04B 10/506 398/187 |
| 2014/0003761 A1 | 1/2014 | Dong | |
| 2014/0056585 A1* | 2/2014 | Qian | H04B 10/27 398/58 |
| 2014/0241657 A1 | 8/2014 | Manouvrier | |
| 2014/0299743 A1 | 10/2014 | Miller | |
| 2015/0354938 A1 | 12/2015 | Mower et al. | |
| 2015/0382089 A1 | 12/2015 | Mazed | |
| 2016/0103281 A1 | 4/2016 | Matsumoto | |
| 2016/0112129 A1 | 4/2016 | Chang | |
| 2016/0118106 A1 | 4/2016 | Yoshimura et al. | |
| 2016/0162781 A1 | 6/2016 | Lillicrap et al. | |
| 2016/0162798 A1 | 6/2016 | Marandi et al. | |
| 2016/0182155 A1* | 6/2016 | Taylor | H04B 10/615 398/208 |
| 2016/0245639 A1 | 8/2016 | Mower et al. | |
| 2016/0301478 A1* | 10/2016 | Luo | H04B 10/516 |
| 2016/0352515 A1 | 12/2016 | Bunandar et al. | |
| 2017/0031101 A1 | 2/2017 | Miller | |
| 2017/0201813 A1* | 7/2017 | Sahni | H04B 10/40 |
| 2017/0237505 A1 | 8/2017 | Lucamarini et al. | |
| 2017/0285373 A1 | 10/2017 | Zhang et al. | |
| 2017/0351293 A1 | 12/2017 | Carolan et al. | |
| 2018/0107237 A1 | 4/2018 | Andregg et al. | |
| 2018/0274900 A1 | 9/2018 | Mower et al. | |
| 2018/0323825 A1 | 11/2018 | Cioffi et al. | |
| 2018/0335574 A1 | 11/2018 | Steinbrecher et al. | |
| 2019/0110084 A1* | 4/2019 | Jia | H04N 19/94 |
| 2019/0346685 A1 | 11/2019 | Miller | |
| 2019/0354894 A1 | 11/2019 | Lazovich et al. | |
| 2019/0356394 A1 | 11/2019 | Bunandar et al. | |
| 2019/0370644 A1 | 12/2019 | Kenney et al. | |

FOREIGN PATENT DOCUMENTS

| | | |
|---|---|---|
| WO | WO 2006/023067 A2 | 3/2006 |
| WO | WO 2008/069490 A1 | 6/2008 |
| WO | WO 2018/098230 A1 | 5/2018 |
| WO | WO 2019/217835 A1 | 11/2019 |

OTHER PUBLICATIONS

International Search Report and Written Opinion from International Application No. PCT/US2015/034500, dated Mar. 15, 2016, 7 pages.

Invitation to Pay Additional Fees for International Application No. PCT/US19/32181 dated Jul. 23, 2019.

Invitation to Pay Additional Fees for International Application No. PCT/US2019/032272 dated Jun. 27, 2019.

International Search Report and Written Opinion for International Application No. PCT/US2019/032272 dated Sep. 4, 2019.

[No Author Listed], Optical Coherent Receiver Analysis. 2009 Optiwave Systems, Inc. 16 pages. URL:https://dru5cjyjifvrg.cloudfront.net/wp-content/uploads/2017/03/OptiSystem-Applications-Coherent-Receiver-Analysis.pdf [retrieved on Aug. 17, 2019].

Liu et al., Towards 1-Tb/s Per-Channel Optical Transmission Based on Multi-Carrier Modulation. 19th Annual Wireless and Optical Communications Conference. May 2010. 4 pages. DOI: 10.1109/WOCC.2010.5510630.

International Search Report and Written Opinion for International Application No. PCT/US19/32181 dated Sep. 23, 2019.

Aaronson et al., Computational complexity of linear optics. Proceedings of the 43rd Annual ACM Symposium on Theory of Computing. 2011. 101 pages. ISBN 978-1-4503-0691-1.

Abu-Mostafa et al., Optical neural computers. Scientific American 256.3 (1987):88-95.

Albert et al., Statistical mechanics of com-plex networks. Reviews of Modern Physics. 2002;(74):47-97.

Almeida et al., All-optical control of light on a silicon chip. Nature. 2004;431:1081-1084.

(56) References Cited

OTHER PUBLICATIONS

Amir et al., Classical diffusion of a quantum particle in a noisy environment. Physical Review E. 2009;79. 5 pages. DOI: 10.1103/PhysRevE.79.050105.

Amit et al., Spin-glass models of neural networks. Physical Review A. 1985;32(2):1007-1018.

Anitha et al., Comparative Study of High performance Braun's multiplier using FPGAs. IOSR Journal of Electrontrics and Communication Engineering (IOSRJECE). 2012;1:33-37.

Appeltant et al., Information processing using a single dynamical node as complex system. Nature Communications. 2011. 6 pages. DOI: 10.1038/ncomms1476.

Arjovsky et al., Unitary Evolution Recurrent Neural Networks. arXiv:1511.06464. 2016. 9 pages.

Aspuru-Guzik et al., Photonic quantum simulators. Nature Physics. 2012;8:285-291. DOI: 10.1038/NPHYS2253.

Aspuru-Guzik et al., Simulated Quantum Computation of Molecular Energies. Science. 2005;309:1704-7.

Atabaki et al., Integrating photonics with silicon nanoelectronics for the next generation of systems on a chip. Nature. 2018;556(7701):349-354. 10 pages. DOI: 10.1038/s41586-018-0028-z.

Baehr-Jones et al., A 25 Gb/s Silicon Photonics Platform. arXiv:1203.0767. 2012. 11 pages.

Bao et al., Atomic-Layer Graphene as a Saturable Absorber for Ultrafast Pulsed Lasers. 24 pages. 2009.

Bao et al., Monolayer graphene as a saturable absorber in a mode-locked laser. Nano Research. 2011;4:297-307. DOI: 10.1007/s12274-010-0082-9.

Barahona, On the computational complexity of Ising spin glass models. Journal of Physics A: Mathematical and General. 1982;15:3241-3253.

Bertsimas et al., Robust optimization with simulated annealing. Journal of Global Optimization. 2010;48:323-334. DOI: 10.1007/s10898-009-9496-x.

Bewick, Fast multiplication: algorithms and implementation. Ph.D. thesis, Stanford University. 1994.170 pages.

Bonneau et al., Quantum interference and manipulation of entanglement in silicon wire waveguide quantum circuits. New Journal of Physics. 2012;14:045003. 13 pages. DOI: 10.1088/1367-2630/14/4/045003.

Brilliantov, Effective magnetic Hamiltonian and Ginzburg criterion for fluids. Physical Review E. 1998;58:2628-2631.

Bromberg et al., Bloch oscillations of path-entangled photons. Physical Review Letters. 2010;105:263604-1-2633604-4. 4 pages. DOI: 10.1103/PhysRevLett.105.263604.

Bromberg et al., Quantum and Classical Correlations in Waveguide Lattices. Physical Review Letters. 2009;102:253904-1-253904-4. 4 pages. DOI: 10.1103/PhysRevLett.102.253904.

Broome et al., Photonic Boson Sampling in a Tunable Circuit. Science. 2012;339:794-8.

Bruck et al., On the power of neural networks for solving hard problems. American Institute of Physics. 1988. pp. 137-143. 7 pages.

Canziani et al., Evaluation of neural network architectures for embedded systems. Circuits and Systems (ISCAS). 2017 IEEE International Symposium. 4 pages.

Cardenas et al., Low loss etchless silicon photonic waveguides. Optics Express. 2009;17(6):4752-4757.

Carolan et al., Universal linear optics. Science. 2015;349:711-716.

Caves, Quantum-mechanical noise in an interferometer. Physical Review D. 1981;23(8):1693-1708. 16 pages.

Centeno et al., Optical bistability in finite-size nonlinear bidimensional photonic crystals doped by a microcavity. Physical Review B. 2000;62(12):R7683-R7686.

Chan, Optical flow switching networks. Proceedings of the IEEE. 2012;100(5):1079-1091.

Chen et al., Compact, low-loss and low-power 8×8 broadband silicon optical switch. Optics Express. 2012;20(17):18977-18985.

Chen et al., DianNao: A small-footprint high-throughput accelerator for ubiquitous machine-learning. ACM Sigplan Notices. 2014;49:269-283.

Chen et al., Efficient photon pair sources based on silicon-on-insulator microresonators. Proc. of SPIE. 2010;7815. 10 pages.

Chen et al., Frequency-bin entangled comb of photon pairs from a Silicon-on-Insulator micro-resonator. Optics Express. 2011;19(2):1470-1483.

Chen et al., Universal method for constructing N-port nonblocking optical router based on 2×2 optical switch for photonic networks-on-chip. Optics Express. 2014;22(10);12614-12627. DOI: 10.1364/OE.22.012614.

Cheng et al., In-Plane Optical Absorption and Free Carrier Absorption in Graphene-on-Silicon Waveguides. IEEE Journal of Selected Topics in Quantum Electronics. 2014;20(1). 6 pages.

Chetlur et al., cuDNN: Efficient primitives for deep learning. arXiv preprint arXiv:1410.0759. 2014. 9 pages.

Childs et al., Spatial search by quantum walk. Physical Review A. 2004;70(2):022314. 11 pages.

Chung et al., A monolithically integrated large-scale optical phased array in silicon-on-insulator cmos. IEEE Journal of Solid-State Circuits. 2018;53:275-296.

Cincotti, Prospects on planar quantum computing. Journal of Lightwave Technology. 2009;27(24):5755-5766.

Clements et al., Optimal design for universal multiport interferometers. Optica. 2016;3(12):1460-1465.

Crespi et al., Integrated multimode interferometers with arbitrary designs for photonic boson sampling. Nature Photonics. 2013;7:545-549. DOI: 10.1038/NPHOTON.2013.112.

Crespi, et al., Anderson localization of entangled photons in an integrated quantum walk. Nature Photonics. 2013;7:322-328. DOI: 10.1038/NPHOTON.2013.26.

Dai et al., Novel concept for ultracompact polarization splitter-rotator based on silicon nanowires. Optics Express. 2011;19(11):10940-9.

Di Giuseppe et al., Einstein-Podolsky-Rosen Spatial Entanglement in Ordered and Anderson Photonic Lattices. Physical Review Letters. 2013;110:150503-1-150503-5. DOI: 10.1103/PhysRevLett.110.150503.

Dunningham et al., Efficient comparison of path-lengths using Fourier multiport devices. Journal of Physics B: Atomic, Molecular and Optical Physics. 2006;39:1579-1586. DOI:10.1088/0953-4075/39/7/002.

Esser et al., Convolutional networks for fast, energy-efficient neuromorphic computing. Proceedings of the National Academy of Sciences. 2016:113(41):11441-11446.

Farhat et al., Optical implementation of the Hopfield model. Applied Optics. 1985;24(10):1469-1475.

Feinberg et al., Making memristive neural network accelerators reliable. IEEE International Symposium on High Performance Computer Architecture (HPCA). 2018. pp. 52-65. DOI 10.1109/HPCA.2018.00015.

Fushman et al., Controlled Phase Shifts with a Single Quantum Dot. Science. 2008;320:769-772. DOI: 10.1126/science.1154643.

George et al., A programmable and configurable mixed-mode FPAA SoC. IEEE Transactions on Very Large Scale Integration (VLSI) Systems. 2016;24:2253-2261.

Gilmer et al., Neural message passing for quantum chemistry. arXiv preprint arXiv:1704.01212. Jun. 2017. 14 pages.

Golub et al., Calculating the singular values and pseudo-inverse of a matrix. Journal of the Society for Industrial and Applied Mathematics Series B Numerical Analysis. 1965;2(2):205-224.

Graves et al., Hybrid computing using a neural network with dynamic external memory. Nature. 2016;538. 21 pages. DOI:10.1038/nature20101.

Grote et al., First long-term application of squeezed states of light in a gravitational-wave observatory. Physical Review Letter. 2013;110:181101. 5 pages. DOI: 10.1103/PhysRevLett.110.181101.

Gruber et al., Planar-integrated optical vector-matrix multiplier. Applied Optics. 2000;39(29):5367-5373.

Gullans et al., Single-Photon Nonlinear Optics with Graphene Plasmons. Physical Review Letter. 2013;111:247401-1-247401-5. DOI: 10.1103/PhysRevLett.111.247401.

(56) References Cited

OTHER PUBLICATIONS

Gunn, CMOS photonics for high-speed interconnects. IEEE Micro. 2006;26:58-66.
Haffner et al., Low-loss plasmon-assisted electro-optic modulator. Nature. 2018;556:483-486. 17 pages. DOI: 10.1038/s41586-018-0031-4.
Halasz et al., Phase diagram of QCD. Physical Review D. 1998;58:096007. 11 pages.
Hamerly et al., Scaling advantages of all-to-all connectivity in physical annealers: the Coherent Ising Machine vs. D-Wave 2000Q. arXiv preprints, May 2018. 17 pages.
Harris et al. Efficient, Compact and Low Loss Thermo-Optic Phase Shifter in Silicon. Optics Express. 2014;22(9);10487-93. DOI:10.1364/OE.22.010487.
Harris et al., Bosonic transport simulations in a large-scale programmable nanophotonic processor. arXiv:1507.03406. 2015. 8 pages.
Harris et al., Integrated source of spectrally filtered correlated photons for large-scale quantum photonic systems. Physical Review X. 2014;4:041047. 10 pages. DOI: 10.1103/PhysRevX.4.041047.
Harris et al., Quantum transport simulations in a programmable nanophotonic processor. Nature Photonics. 2017;11:447-452. DOI: 10.1038/NPHOTON.2017.95.
Hinton et al., Reducing the dimensionality of data with neural networks. Science. 2006;313:504-507.
Hochberg et al., Silicon Photonics: The Next Fabless Semiconductor Industry. IEEE Solid-State Circuits Magazine. 2013. pp. 48-58. DOI: 10.1109/MSSC.2012.2232791.
Honerkamp-Smith et al., An introduction to critical points for biophysicists; observations of compositional heterogeneity in lipid membranes. Biochimica et Biophysica Acta (BBA). 2009;1788:53-63. DOI: 10.1016/j.bbamem.2008.09.010.
Hong et al., Measurement of subpicosecond time intervals between two photons by interference. Physical Review Letters. 1987;59(18):2044-2046.
Hopfield et al., Neural computation of decisions in optimization problems. Biological Cybernetics. 1985;52;141-152.
Hopfield, Neural networks and physical systems with emergent collective computational abilities. PNAS. 1982;79:2554-2558. DOI: 10.1073/pnas.79.8.2554.
Horowitz, Computing's energy problem (and what we can do about it). Solid-State Circuits Conference Digest of Technical Papers (ISSCC), 2014 IEEE International. 5 pages.
Horst et al., Cascaded Mach-Zehnder wavelength filters in silicon photonics for low loss and flat pass-band WDM (de-)multiplexing. Optics Express. 2013;21(10):11652-8. DOI:10.1364/OE.21.011652.
Humphreys et al., Linear Optical Quantum Computing in a Single Spatial Mode. Physical Review Letters. 2013;111:150501. 5 pages. DOI: 10.1103/PhysRevLett.111.150501.
Inagaki et al., Large-scale ising spin network based on degenerate optical parametric oscillators. Nature Photonics. 2016;10:415-419. 6 pages. DOI: 10.1038/NPHOTON.2016.68.
Isichenko, Percolation, statistical topography, and trans-port in random media. Reviews of Modern Physics. 1992;64(4):961-1043.
Jaekel et al., Quantum limits in interferometric measurements. Europhysics Letters. 1990;13(4):301-306.
Jalali et al., Silicon Photonics. Journal of Lightwave Technology. 2006;24(12):4600-15. DOI: 10.1109/JLT.2006.885782.
Jia et al., Caffe: Convolutional architecture for fast feature embedding. Proceedings of the 22nd ACM International Conference on Multimedia. Nov. 2014. 4 pages. URL:http://doi.acm.org/10.1145/2647868.2654889.
Jiang et al., A planar ion trapping microdevice with integrated waveguides for optical detection. Optics Express. 2011;19(4):3037-43.
Jonsson, An empirical approach to finding energy efficient ADC architectures. 2011 International Workshop on ADC Modelling, Testing and Data Converter Analysis and Design and IEEE 2011 ADC Forum. 6 pages.
Jouppi et al. In-datacenter performance analysis of a tensor processing unit. Proceeding of Computer Architecture (ISCA). Jun. 2017. 12 pages. URL:https://doi.org/10.1145/3079856.3080246.
Kahn et al., Communications expands its space. Nature Photonics. 2017;11:5-8.
Kardar et al., Dynamic Scaling of Growing Interfaces. Physical Review Letters. 1986;56(9):889-892.
Karpathy, CS231n Convolutional Neural Networks for Visual Recognition. Class notes. 2019. URL:http://cs231n.github.io/ 2 pages. [last accessed Sep. 24, 2019].
Keckler et al., GPUs and the future of parallel computing. IEEE Micro. 2011;31:7-17. DOI: 10.1109/MM.2011.89.
Kieling et al., On photonic Controlled Phase Gates. New Journal of Physics. 2010;12:0133003. 17 pages. DOI: 10.1088/1367-2630/12/1/013003.
Kilper et al., Optical networks come of age. Optics Photonics News. 2014;25:50-57. DOI: 10.1364/OPN.25.9.000050.
Kim et al., A functional hybrid memristor crossbar-array/cmos system for data storage and neuromorphic applications. Nano Letters. 2011;12:389-395.
Kirkpatrick et al., Optimization by simulated annealing. Science. 1983;220(4598):671-680.
Knill et al., A scheme for efficient quantum computation with linear optics. Nature. 2001;409(4652):46-52.
Knill et al., The Bayesian brain: the role of uncertainty in neural coding and computation. Trends in Neurosciences. 2004;27(12):712-719.
Knill, Quantum computing with realistically noisy devices. Nature. 2005;434:39-44.
Kok et al., Linear optical quantum computing with photonic qubits. Reviews of Modern Physics. 2007;79(1):135-174.
Koos et al., Silicon-organic hybrid (SOH) and plasmonic-organic hybrid (POH) integration. Journal of Lightwave Technology. 2016;34(2):256-268.
Krizhevsky et al., ImageNet classification with deep convolutional neural networks. Advances in Neural Information Processing Systems (NIPS). 2012. 9 pages.
Kucherenko et al., Application of Deterministic Low-Discrepancy Sequences in Global Optimization. Computational Optimization and Applications. 2005;30:297-318.
Kwack et al., Monolithic InP strictly non-blocking 8×8 switch for high-speed WDM optical interconnection. Optics Express. 2012;20(27):28734-41.
Lahini et al., Anderson Localization and Nonlinearity in One-Dimensional Disordered Photonic Lattices. Physical Review Letters. 2008;100:013906. 4 pages. DOI: 10.1103/PhysRevLett.100.013906.
Lahini et al., Quantum Correlations in Two-Particle Anderson Localization. Physical Review Letters. 2010;105:163905. 4 pages. DOI: 10.1103/PhysRevLett.105.163905.
Laing et al., High-fidelity operation of quantum photonic circuits. Applied Physics Letters. 2010;97:211109. 5 pages. DOI: 10.1063/1.3497087.
Landauer, Irreversibility and heat generation in the computing process. IBM Journal of Research and Development. 1961. pp. 183-191.
Lanyon et al., Towards quantum chemistry on a quantum computer. Nature Chemistry. 2010;2:106-10. DOI: 10.1038/NCHEM.483.
Lawson et al., Basic linear algebra subprograms for Fortran usage. ACM Transactions on Mathematical Software (TOMS). 1979;5(3):308-323.
Lecun et al., Deep learning. Nature. 2015;521:436-444. DOI:10.1038/nature14539.
Lecun et al., Gradient-based learning applied to document recognition. Proceedings of the IEEE. Nov. 1998. 46 pages.
Levi et al., Hyper-transport of light and stochastic acceleration by evolving disorder. Nature Physics. 2012;8:912-7. DOI: 10.1038/NPHYS2463.
Li et al., Efficient and self-adaptive in-situ learning in multilayer memristor neural networks. Nature Communications. 2018;9:2385. 8 pages. DOI: 10.1038/s41467-018-04484-2.

(56) References Cited

OTHER PUBLICATIONS

Lin et al., All-optical machine learning using diffractive deep neural networks. Science. 2018;361:1004-1008. 6 pages. DOI: 10.1126/science.aat8084.
Little, The existence of persistent states in the brain. Mathematical Biosciences. 1974;19:101-120.
Lu et al., 16×16 non-blocking silicon optical switch based on electro-optic Mach-Zehnder interferometers. Optics Express. 2016:24(9):9295-9307. DOI: 10.1364/OE.24.009295.
Ma et al., Optical switching technology comparison: Optical mems vs. Other technologies. IEEE Optical Communications. 2003;41(11):S16-S23.
Macready et al., Criticality and Parallelism in Combinatorial Optimization. Science. 1996;271:56-59.
Marandi et al., Network of time-multiplexed optical parametric oscillators as a coherent Ising machine. Nature Photonics. 2014;8:937-942. DOI: 10.1038/NPHOTON.2014.249.
Martin-Lopez et al., Experimental realization of Shor's quantum factoring algorithm using qubit recycling. Nature Photonics. 2012;6:773-6. DOI: 10.1038/NPHOTON.2012.259.
McMahon et al., A fully programmable 100-spin coherent Ising machine with all-to-all connections. Science. 2016;354(6312):614-7. DOI: 10.1126/science.aah5178.
Mead, Neuromorphic electronic systems. Proceedings of the IEEE. 1990;78(10):1629-1636.
Migdall et al., Tailoring single-photon and multiphoton probabilities of a single-photon on-demand source. Physical Review A. 2002;66:053805. 4 pages. DOI: 10.1103/PhysRevA.66.053805.
Mikkelsen et al., Dimensional variation tolerant silicon-on-insulator directional couplers. Optics Express. 2014;22(3):3145-50. DOI:10.1364/OE.22.003145.
Miller, Are optical transistors the logical next step? Nature Photonics. 2010;4:3-5.
Miller, Attojoule optoelectronics for low-energy information processing and communications. Journal of Lightwave Technology. 2017;35(3):346-96. DOI: 10.1109/JLT.2017.2647779.
Miller, Energy consumption in optical modulators for interconnects. Optics Express. 2012;20(S2):A293-A308.
Miller, Perfect optics with imperfect components. Optica. 2015;2(8):747-750.
Miller, Reconfigurable add-drop multiplexer for spatial modes. Optics Express. 2013;21(17):20220-9. DOI:10.1364/OE.21.020220.
Miller, Self-aligning universal beam coupler, Optics Express. 2013;21(5):6360-70.
Miller, Self-configuring universal linear optical component [Invited]. Photonics Research. 2013;1(1):1-15. URL:http://dx.doi.org/10.1364/PRJ.1.000001.
Misra et al., Artificial neural networks in hardware: A survey of two decades of progress. Neurocomputing. 2010;74:239-255.
Mohseni et al., Environment-assisted quantum walks in photosynthetic complexes. The Journal of Chemical Physics. 2008;129:174106. 10 pages. DOI: 10.1063/1.3002335.
Moore, Cramming more components onto integrated circuits. Proceeding of the IEEE. 1998;86(1):82-5.
Mower et al., Efficient generation of single and entangled photons on a silicon photonic integrated chip. Physical Review A. 2011;84:052326. 7 pages. DOI: 10.1103/PhysRevA.84.052326.
Mower et al., High-fidelity quantum state evolution in imperfect photonic integrated circuits. Physical Review A. 2015;92(3):032322. 7 pages. DOI : 10.1103/PhysRevA.92.032322.
Nagamatsu et al., A 15 NS 32×32-bit CMOS multiplier with an improved parallel structure. IEEE Custom Integrated Circuits Conference. 1989. 4 pages.
Najafi et al., On-Chip Detection of Entangled Photons by Scalable Integration of Single-Photon Detectors. arXiv:1405.4244. May 16, 2014. 27 pages.
Najafi et al., On-Chip detection of non-classical light by scalable integration of single-photon detectors. Nature Communications. 2015;6:5873. 8 pages. DOI: 10.1038/ncomms6873.
Naruse, Nanophotonic Information Physics. Nanointelligence and Nanophotonic Computing. Springer. 2014. 261 pages. DOI 10.1007/978-3-642-40224-1.
Nozaki et al., Sub-femtojoule all-optical switching using a photonic-crystal nanocavity. Nature Photonics. 2010;4:477-483. DOI: 10.1038/NPHOTON.2010.89.
O'Brien et al., Demonstration of an all-optical quantum controlled-NOT gate. Nature. 2003;426:264-7.
Onsager, Crystal Statistics. I. A Two-Dimensional Model with an Order-Disorder Transition. Physical Review. 1944;65(3,4):117-149.
Orcutt et al., Nanophotonic integration in state-of-the-art CMOS foundries. Optics Express. 2011;19(3):2335-46.
Pelissetto et al., Critical phenomena and renormalization-group theory. Physics Reports. Apr. 2002. 150 pages.
Peng, Implementation of AlexNet with Tensorflow. https://github.com/ykpengba/AlexNet-A-Practical-Implementation. 2018. 2 pages. [last accessed Sep. 24, 2019].
Peretto, Collective properties of neural networks: A statistical physics approach. Biological Cybernetics. 1984;50:51-62.
Pernice et al., High-speed and high-efficiency travelling wave single-photon detectors embedded in nanophotonic circuits. Nature Communications 2012;3:1325. 10 pages. DOI: 10.1038/ncomms2307.
Peruzzo et al., Quantum walk of correlated photons. Science. 2010;329;1500-3. DOI: 10.1126/science.1193515.
Politi et al., Integrated Quantum Photonics, IEEE Journal of Selected Topics in Quantum Electronics, 2009;5(6):1-12. DOI: 10.1109/JSTQE.2009.2026060.
Politi et al., Silica-on-Silicon Waveguide Quantum Circuits. Science. 2008;320:646-9. DOI: 10.1126/science.1155441.
Poon et al., Neuromorphic silicon neurons and large-scale neural networks: challenges and opportunities. Frontiers in Neuroscience. 2011;5:1-3. DOI: 10.3389/fnins.2011.00108.
Prucnal et al., Recent progress in semiconductor excitable lasers for photonic spike processing. Advances in Optics and Photonics. 2016;8(2):228-299.
Psaltis et al., Holography in artificial neural networks. Nature. 1990;343:325-330.
Qiao et al., 16×16 non-blocking silicon electro-optic switch based on mach zehnder interferometers. Optical Fiber Communication Conference. Optical Society of America. 2016. 3 pages.
Ralph et al., Linear optical controlled-NOT gate in the coincidence basis. Physical Review A. 2002;65:062324-1-062324-5. DOI: 10.1103/PhysRevA.65.062324.
Ramanitra et al., Scalable and multi-service passive optical access infrastructure using variable optical splitters. Optical Fiber Communication Conference. Optical Society of America. 2005. 3 pages.
Raussendorf et al., A one-way quantum computer. Physical Review Letter. 2001;86(22):5188-91. DOI: 10.1103/PhysRevLett.86.5188.
Rechtsman et al., Photonic floquet topological insulators. Nature. 2013;496:196-200. doi: 10.1038/nature12066.
Reck et al., Experimental realization of any discrete unitary operator. Physical review letters. 1994;73(1):58-61. 6 pages.
Reed et al., Silicon optical modulators. Nature Photonics. 2010;4:518-26. DOI: 10.1038/NPHOTON.2010.179.
Rendl et al., Solving Max-Cut to optimality by intersecting semidefinite and polyhedral relaxations. Mathematical Programming. 2010;121:307-335. DOI : 10.1007/s10107-008-0235-8.
Rios et al., Integrated all-photonic non-volatile multilevel memory. Nature Photonics. 2015;9:725-732. DOI: 10.1038/NPHOTON.2015.182.
Rogalski, Progress in focal plane array technologies. Progress in Quantum Electronics. 2012;36:342-473.
Rohit et al., 8×8 space and wavelength selective cross-connect for simultaneous dynamic multi-wavelength routing. Optical Fiber Communication Conference. OFC/NFOEC Technical Digest. 2013. 3 pages.
Rosenblatt, The perceptron: A probabilistic model for information storage and organization in the brain. Psychological Review. 1958;65(6):386-408.
Russakovsky et al., ImageNet Large Scale Visual Recognition Challenge. arXiv:1409.0575v3. Jan. 2015. 43 pages.

(56) References Cited

OTHER PUBLICATIONS

Saade et al., Random projections through multiple optical scattering: Approximating Kernels at the speed of light. arXiv:1510.06664v2. Oct. 25, 2015. 6 pages.
Salandrino et al., Analysis of a three-core adiabatic directional coupler. Optics Communications. 2009;282:4524-6. DOI:10.1016/j.optcom.2009.08.025.
Schaeff et al., Scalable fiber integrated source for higher-dimensional path-entangled photonic quNits. Optics Express. 2012;20(15):16145-153.
Schirmer et al., Nonlinear mirror based on two-photon absorption. Journal of the Optical Society of America B. 1997;14(11):2865-8.
Schmidhuber, Deep learning in neural networks: An overview. Neural Networks. 2015;61:85-117.
Schreiber et al., Decoherence and Disorder in Quantum Walks: From Ballistic Spread to Localization. Physical Review Letters. 2011;106:180403. 4 pages. DOI: 10.1103/PhysRevLett.106.180403.
Schwartz et al., Transport and Anderson localization in disordered two-dimensional photonic lattices. Nature. 2007;446:52-5. DOI:10.1038/nature05623.
Selden, Pulse transmission through a saturable absorber. British Journal of Applied Physics. 1967;18:743-8.
Shafiee et al., ISAAC: A convolutional neural network accelerator with in-situ analog arithmetic in crossbars. ACM/IEEE 43rd Annual International Symposium on Computer Architecture. Oct. 2016. 13 pages.
Shen et al., Deep learning with coherent nanophotonic circuits. Nature Photonics. 2017;11:441-6. DOI: 10.1038/NPHOTON.2017.93.
Shoji et al., Low-crosstalk 2×2 thermo-optic switch with silicon wire waveguides. Optics Express.2010;18(9):9071-5.
Silver et al. Mastering chess and shogi by self-play with a general reinforcement learning algorithm. arXiv preprint arXiv:1712.01815. 19 pages. 2017.
Silver et al., Mastering the game of go with deep neural networks and tree search. Nature. 2016;529:484-9. 20 pages. DOI:10.1038/nature16961.
Silver et al., Mastering the game of Go without human knowledge. Nature. 2017;550:354-9. 18 pages. DOI:10.1038/nature24270.
Silverstone et al., On-chip quantum interference between silicon photon-pair sources. Nature Photonics. 2014;8:104-8. DOI: 10.1038/NPHOTON.2013.339.
Smith et al., Phase-controlled integrated photonic quantum circuits. Optics Express. 2009;17(16):13516-25.
Soljacic et al., Optimal bistable switching in nonlinear photonic crystals. Physical Review E. vol. 66, p. 055601, Nov. 2002. 4 pages.
Solli et al., Analog optical computing. Nature Photonics. 2015;9:704-6.
Spring et al., Boson sampling on a photonic chip. Science. 2013;339:798-801. DOI: 10.1126/science.1231692.
Srinivasan et al., 56 Gb/s germanium waveguide electro-absorption modulator. Journal of Lightwave Technology. 2016;34(2):419-24. DOI: 10.1109/JLT.2015.2478601.
Steinkraus et al., Using GPUs for machine learning algorithms. Proceedings of the 2005 Eight International Conference on Document Analysis and Recognition. 2005. 6 pages.
Suda et al., Quantum interference of photons in simple networks. Quantum Information Process. 2013;12:1915-45. DOI: 10.1007/s11128-012-0479-3.
Sun et al., Large-scale nanophotonic phased array. Nature. 2013;493:195-9. DOI: 10.1038/nature11727.
Sun et al., Single-chip microprocessor that communicates directly using light. Nature. 2015;528:534-8. DOI: 10.1038/nature16454.
Suzuki et al., Ultra-compact 8×8 strictly-non-blocking Si-wire PILOSS switch. Optics Express. 2014;22(4):3887-94. DOI: 10.1364/OE.22.003887.
Sze et al., Efficient processing of deep neural networks: A tutorial and survey. Proceedings of the IEEE. 2017;105(12):2295-2329. DOI: 10.1109/JPROC.2017.276174.
Tabia, Experimental scheme for qubit and qutrit symmetric informationally complete positive operator-valued measurements using multiport devices. Physical Review A. 2012;86:062107. 8 pages. DOI: 10.1103/PhysRevA.86.062107.
Tait et al., Broadcast and weight: An integrated network for scalable photonic spike processing. Journal of Lightwave Technology. 2014;32(21):3427-39. DOI: 10.1109/JLT.2014.2345652.
Tait et al., Chapter 8 Photonic Neuromorphic Signal Processing and Computing. Springer, Berlin, Heidelberg. 2014. pp. 183-222.
Tait et al., Neuromorphic photonic networks using silicon photonic weight banks. Scientific Reports. 2017;7:7430. 10 pages.
Tanabe et al., Fast bistable all-optical switch and memory on a silicon photonic crystal on-chip. Optics Letters. 2005;30(19):2575-7.
Tanizawa et al., Ultra-compact 32×32 strictly-non-blocking Si-wire optical switch with fan-out LGA interposer. Optics Express. 2015;23(13):17599-606. DOI:10.1364/OE.23.017599.
Thompson et al., Integrated waveguide circuits for optical quantum computing. IET Circuits, Devices, & Systems. 2011;5(2):94-102. DOI: 10.1049/iet-cds.2010.0108.
Timurdogan et al., An ultralow power athermal silicon modulator. Nature Communications. 2014;5:4008. 11 pages. DOI: 10.1038/ncomms5008.
Vandoorne et al., Experimental demonstration of reservoir computing on a silicon photonics chip. Nature Communications. 2014;5:3541. 6 pages. DOI: 10.1038/ncomms4541.
Vazquez et al., Optical NP problem solver on laser-written waveguide plat-form. Optics Express. 2018;26(2):702-10.
Vivien et al., Zero-bias 40gbit/s germanium waveguide photodetector on silicon. Optics Express. 2012;20(2):1096-1101.
Wang et al., Coherent Ising machine based on degenerate optical parametric oscillators. Physical Review A. 2013;88:063853. 9 pages. DOI: 10.1103/PhysRevA.88.063853.
Wang et al., Deep learning for identifying metastatic breast cancer. arXiv preprint arXiv:1606.05718. Jun. 18, 2016. 6 pages.
Werbos, Beyond regression: New tools for prediction and analysis in the behavioral sciences. Ph.D. dissertation, Harvard University. Aug. 1974. 454 pages.
Whitfield et al., Simulation of electronic structure Hamiltonians using quantum computers. Molecular Physics. 2010;109(5,10):735-50. DOI: 10.1080/00268976.2011.552441.
Wu et al., An optical fiber network oracle for NP-complete problems. Light: Science & Applications. 2014;3: e147. 5 pages. DOI: 10.1038/lsa.2014.28.
Xia et al., Mode conversion losses in silicon-on-insulator photonic wire based racetrack resonators. Optics Express. 2006;14(9):3872-86.
Xu et al., Experimental observations of bistability and instability in a two-dimensional nonlinear optical superlattice. Physical Review Letters. 1993;71(24):3959-62.
Yang et al., Non-Blocking 4×4 Electro-Optic Silicon Switch for On-Chip Photonic Networks. Optics Express 2011;19(1):47-54.
Yao et al., Serial-parallel multipliers. Proceedings of 27th Asilomar Conference on Signals, Systems and Computers. 1993. pp. 359-363.
Young et al., Recent trends in deep learning based natural language processing. IEEE Computational Intelligence Magazine. arXiv:1708.02709v8. Nov. 2018. 32 pages.
Zhou et al., Calculating Unknown Eigenvalues with a Quantum Algorithm. Nature Photonics. 2013;7:223-8. DOI: 10.1038/NPHOTON.2012.360.
PCT/US19/32181, Sep. 23, 2019, International Search Report and Written Opinion.

\* cited by examiner

| Real number to encode | V (applied voltage) | α (amplitude modulation) | θ (phase modulation) |
|---|---|---|---|
| -10 | $V=V_1$ | $\alpha_1$ | $\theta_1$ |
| -9 | $V=V_2$ | $\alpha_2$ | $\theta_2$ |
| ⋮ | ⋮ | ⋮ | ⋮ |
| 10 | $V=V_N$ | $\alpha_N$ | $\theta_N$ |

FIG. 1-3D

| Reference phase Φ | Projection $\overline{OA}$ | Decoded real number |
|---|---|---|
| 0 | -1 | -9.6 |
| 0 | -0.8 | 0.2 |
| 0 | ... | ... |
| 0 | 1 | 8.7 |
| π/6 | -0.4 | 3.1 |
| π/6 | 0.6 | -5 |
| π/6 | ... | ... |
| π/6 | 0.9 | 10 |
| ... | ... | ... |
| ... | ... | ... |
| ... | ... | ... |
| ... | ... | ... |

FIG. 1-6

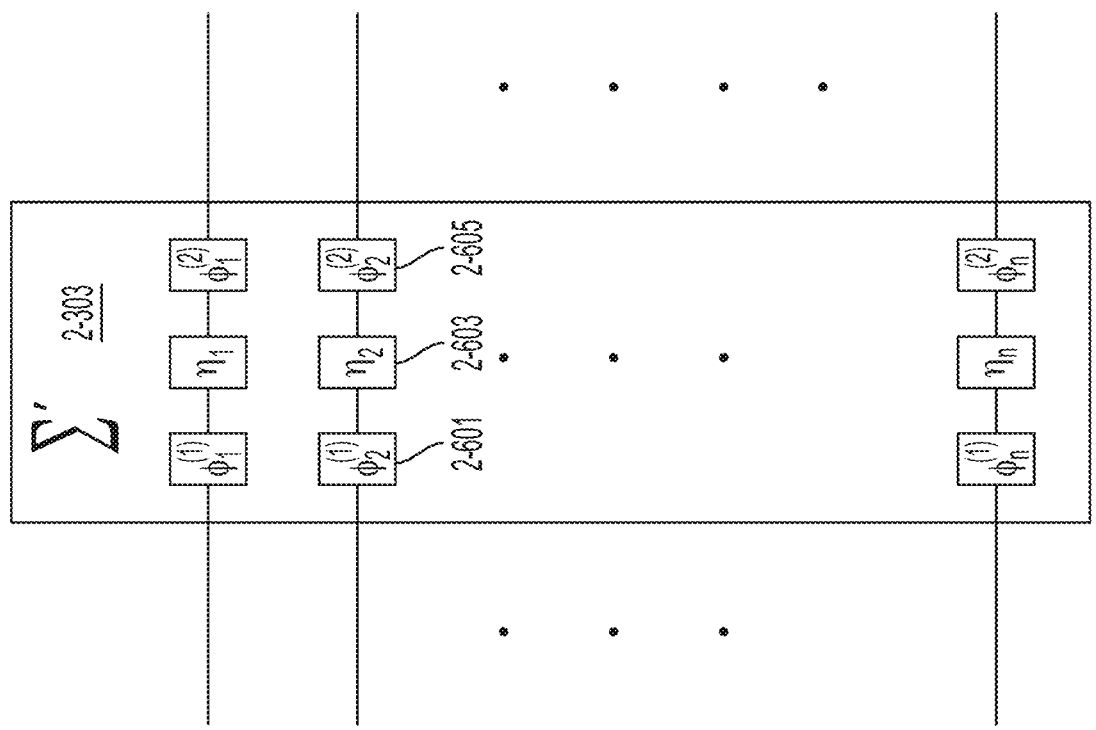

REAL-NUMBER PHOTONIC ENCODING

CROSS-REFERENCE TO RELATED APPLICATIONS

This application claims priority under 35 U.S.C. § 119(e) to U.S. Provisional Patent Application Ser. No. 62/680,557, entitled "PHOTONICS PROCESSING SYSTEMS AND METHODS," filed on Jun. 4, 2018, which is hereby incorporated herein by reference in its entirety.

This application claims priority under 35 U.S.C. § 119(e) to U.S. Provisional Patent Application Ser. No. 62/755,402, entitled "REAL-NUMBER PHOTONIC ENCODING," filed on Nov. 2, 2018, which is hereby incorporated herein by reference in its entirety.

FIELD OF INVENTION

This disclosure is related to methods and systems for encoding real numbers in the optical domain.

BACKGROUND

Optical linear transformations are becoming increasingly important for a number of applications including computing. Such linear transformations may be performed using optical processors, e.g., photonic circuits.

SUMMARY

Some embodiments relate to a photonic system comprising a modulator configured to be driven by a single electrical modulating signal; a coherent receiver; and an optical transformation unit optically coupled between the modulator and the coherent receiver.

In some embodiments, the photonic system further comprises an electronic encoder configured to encode a signed, real number onto the single electrical modulating signal.

In some embodiments, the modulator, the coherent receiver and the optical transformation unit are disposed on a common semiconductor substrate.

In some embodiments, the modulator is configured to modulate an optical input signal based on the single electrical modulating signal in accordance with an on-off keying (OOK) modulation scheme.

In some embodiments, the modulator is configured to modulate an intensity and a phase of an optical input signal based on the single electrical modulating signal.

In some embodiments, the modulator is configured to impart the single electrical modulating signal onto the intensity of the optical input signal.

In some embodiments, the modulator is configured to output a modulated optical signal and a reference signal including an optical carrier, and wherein the coherent receiver is configured to beat the modulated optical signal as transformed by the optical transformation unit with the reference signal.

In some embodiments, the coherent receiver comprises a local oscillator and a photodetector.

In some embodiments, the optical transformation unit comprises an optical fiber.

In some embodiments, the optical transformation unit comprises: a first array of interconnected variable beam splitters (VBSs) comprising a first plurality of optical inputs and a first plurality of optical outputs.

In some embodiments, the optical transformation unit further comprises a second array of interconnected VBSs comprising a second plurality of optical inputs and a second plurality of optical outputs; and a plurality of controllable optical elements, each of the plurality of optical elements coupling a single one of the first plurality of optical outputs of the first array to a respective single one of the second plurality of optical inputs of the second array.

In some embodiments, each of the VBSs of the first and second array comprises a Mach-Zehnder interferometer comprising a first beam splitter; a second beam splitter; and a first phase modulator configured to modulate a phase of light of an optical mode that couples the first beam splitter and the second beam splitter.

Some embodiments relate to a method for optically processing signed, real numbers. The method comprises providing a value representative of a first real number; modulating, based on the value, a phase of an optical signal and an intensity of the optical signal, the modulating comprising driving a modulator using a single electrical modulating signal; transforming the modulated optical signal; mixing the transformed, modulated optical signal with a reference optical signal to obtain an electric output signal; and obtaining a second value representative of a second real number based on the electric output signal.

In some embodiments, transforming the modulated optical signal comprises modulating a phase of the modulated optical signal and an intensity of the modulated optical signal.

In some embodiments, mixing the transformed, modulated optical signal with the reference optical signal comprises mixing the transformed, modulated optical signal with the reference optical signal using a coherent receiver.

In some embodiments, the method further comprises transmitting the reference optical signal from the modulator to the coherent receiver.

In some embodiments, the method further comprises generating the reference optical signal having a wavelength substantially equal to a wavelength of the optical signal.

In some embodiments, the modulator comprises a resonant modulator, and wherein the modulating comprises varying a resonance characteristic of the resonant modulator based on the single electrical modulating signal.

In some embodiments, the method further comprises setting a phase of the reference optical signal to a reference phase, and determining the second real number from the second value based on the reference phase.

In some embodiments, determining the second real number from the second value based on the reference phase comprises accessing a look-up table (LUT) mapping real numbers based on reference phase values.

In some embodiments, transforming the modulated optical signal comprises transmitting the modulated optical signal through an optical fiber.

In some embodiments, transforming the modulated optical signal comprises coupling a plurality of optical pulses to a first array of interconnected variable beam splitters (VBSs).

In some embodiments, transforming the modulated optical signal further comprises coupling each of a plurality of optical outputs of the first array to one of a plurality of controllable electro-optic elements; and coupling each of a plurality of optical outputs of the plurality of controllable electro-optic elements to a second to a second array of interconnected VBSs.

Some embodiments relate to an optical transmitter comprising an optical modulator configured to: receive an optical signal having an optical carrier; modulate the optical signal based on a single electrical modulating signal; transmit the modulated optical signal through an optical communication channel; and transmit the optical carrier through the optical communication channel.

In some embodiments, the optical transmitter further comprises an electronic encoder configured to encode a signed, real number onto the single electrical modulating signal.

In some embodiments, the modulator is configured to modulate a phase and an intensity of the optical signal based on the single electrical modulating signal.

Some embodiments relate to a method for fabricating a photonic system. The method comprises fabricating a modulator configured to be driven by a single electrical modulating signal; fabricating a coherent receiver; and fabricating an optical transformation unit optically coupled between the modulator and the coherent receiver.

In some embodiments, fabricating the modulator, coherent receiver and optical transformation unit comprises fabricating the modulator, coherent receiver and optical transformation unit on a common substrate.

In some embodiments, fabricating an optical transformation unit comprises: fabricating a first array of interconnected variable beam splitters (VBSs) comprising a first plurality of optical inputs and a first plurality of optical outputs.

In some embodiments, fabricating the optical transformation unit further comprises: fabricating a second array of interconnected VBSs comprising a second plurality of optical inputs and a second plurality of optical outputs; and fabricating a plurality of controllable electro-optic elements, each of the plurality of electro-optic elements coupling a single one of the first plurality of optical outputs of the first array to a respective single one of the second plurality of optical inputs of the second array.

In some embodiments, fabricating the coherent receiver comprises fabricating a local oscillator and a photodetector.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 1-2A is a block diagram illustrating an example of a photonic system, in accordance with some embodiments.

FIG. 1-2B is a flowchart illustrating an example of a method for processing signed, real numbers in the optical domain, in accordance with some embodiments.

FIG. 1-3A is schematic diagram illustrating an example of a modulator that may be used in connection with the photonic system of FIG. 1-2A, in accordance with some embodiments.

FIG. 1-3B is a plot illustrating the intensity and phase spectral responses of the modulator of FIG. 1-3A when no voltage is applied, in accordance with some embodiments.

FIG. 1-3C is a plot illustrating the intensity and phase spectral responses of the modulator of FIG. 1-3A when driven at a certain voltage, in accordance with some embodiments.

FIG. 1-3D is an example of an encoding table associated with the modulator of FIG. 1-3A, in accordance with some embodiments.

FIG. 1-3E is a visual representation, in the complex plane, of the spectral response of the modulator of FIG. 1-3A, in accordance with some embodiments.

FIGS. 1-4A though 1-4C are visual representations, in the complex plane, of different spectral responses at the output of an optical transformation unit, in accordance with some embodiments.

FIG. 1-5 is a visual representation, in the complex plane, of how detection of an optical signal may be performed, in accordance with some embodiments.

FIG. 1-6 is an example of a decoding table, in accordance with some embodiments.

FIG. 1-7 is a block diagram of an optical communication system, in accordance with some embodiments.

FIG. 1-8 is a plot illustrating an example of a power spectral density output by the modulator of FIG. 1-7, in accordance with some embodiments.

FIG. 1-9 is a flowchart illustrating an example of a method for fabricating a photonic system, in accordance with some embodiments.

FIG. 2-1 is a schematic diagram of a photonic processing system, in accordance with some non-limiting embodiments.

FIG. 2-2 is a schematic diagram of an optical encoder, in accordance with some non-limiting embodiments.

FIG. 2-3 is a schematic diagram of a photonic processor, in accordance with some non-limiting embodiments.

FIG. 2-4 is a schematic diagram of an interconnected variable beam splitter array, in accordance with some non-limiting embodiments.

FIG. 2-5 is a schematic diagram of a variable beam splitter, in accordance with some non-limiting embodiments.

FIG. 2-6 is a schematic diagram of a diagonal attenuation and phase shifting implementation, in accordance with some non-limiting embodiments.

FIG. 2-7 is a schematic diagram of an attenuator, in accordance with some non-limiting embodiments.

FIG. 2-8 is a schematic diagram of a power tree, in accordance with some non-limiting embodiments.

FIG. 2-9 is a schematic diagram of an optical receiver, in accordance with some non-limiting embodiments, in accordance with some non-limiting embodiments.

FIG. 2-10 is a schematic diagram of a homodyne detector, in accordance with some non-limiting embodiments, in accordance with some non-limiting embodiments.

FIG. 2-11 is a schematic diagram of a folded photonic processing system, in accordance with some non-limiting embodiments.

FIG. 2-12A is a schematic diagram of a wavelength-division-multiplexed (WDM) photonic processing system, in accordance with some non-limiting embodiments.

FIG. 2-12B is a schematic diagram of the frontend of the wavelength-division-multiplexed (WDM) photonic processing system of FIG. 2-12A, in accordance with some non-limiting embodiments.

FIG. 2-12C is a schematic diagram of the backend of the wavelength-division-multiplexed (WDM) photonic processing system of FIG. 2-12A, in accordance with some non-limiting embodiments.

FIG. 2-13 is a schematic diagram of a circuit for performing analog summation of optical signals, in accordance with some non-limiting embodiments.

FIG. 2-14 is a schematic diagram of a photonic processing system with column-global phases shown, in accordance with some non-limiting embodiments.

FIG. 2-15 is a plot showing the effects of uncorrected global phase shifts on homodyne detection, in accordance with some non-limiting embodiments.

FIG. 2-16 is a plot showing the quadrature uncertainties of coherent states of light, in accordance with some non-limiting embodiments.

FIG. 2-17 is an illustration of matrix multiplication, in accordance with some non-limiting embodiments.

FIG. 2-18 is an illustration of performing matrix multiplication by subdividing matrices into sub-matrices, in accordance with some non-limiting embodiments.

FIG. 2-19 is a flowchart of a method of manufacturing a photonic processing system, in accordance with some non-limiting embodiments.

FIG. 2-20 is a flowchart of a method of manufacturing a photonic processor, in accordance with some non-limiting embodiments.

FIG. 2-21 is a flowchart of a method of performing an optical computation, in accordance with some non-limiting embodiments.

DETAILED DESCRIPTION

I. Real Number Photonic Encoding

The inventors have recognized and appreciated that phase-intensity relationships, whereby phase and intensity modulation of optical signals are interdependent of one another, pose a challenge for precisely encoding vectors in light fields for optical processing.

Some optical modulators encode numeric vectors in the optical domain, where numbers are encoded onto the phase or the intensity of an optical signal. In an ideal world, an optical intensity modulator is capable of modulating the intensity of an optical signal while maintaining the phase of the optical signal unchanged, and an optical phase modulator is capable of modulating the phase of an optical signal while maintaining the intensity of the optical signal unchanged. In the real world, however, the phase and the intensity of an optical signal are mutually interdependent. As such, intensity modulation gives rise to a corresponding phase modulation and phase modulation gives rise to a corresponding intensity modulation.

Consider for example integrated photonics platforms, in which intensity and phase are related to one another by the Kramers-Kronig equations (bidirectional mathematical relations connecting the real and imaginary parts of a complex analytic function). In these cases, the optical field can be represented by a complex function where the real part and the imaginary part of the function (and as a result, the intensity and the phase) are related to one another. In addition, realistic implementations of intensity and phase modulators generally suffer from dynamic loss whereby the amount of modulation they impart (phase or intensity) depends on their current settings. These modulators experience a certain power loss when no phase modulation occurs, and experience a different power loss when phase modulation occurs. For example, the power loss experienced at no phase modulation may be L1, the power loss experienced at a $\pi/2$-phase modulation may be L2, and the power loss experienced at a $\pi$-phase modulation may be L3, with L1, L2 and L3 being different from each other. This behavior is undesirable because, in addition to phase modulation, the signal further experiences intensity modulation.

Figure 1:
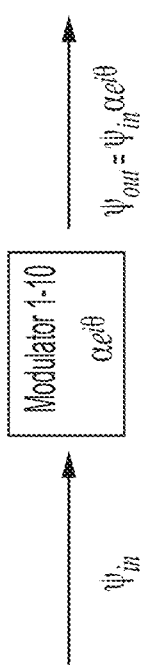
FIG. 1-1 is a block diagram illustrating an optical modulator, in accordance with some embodiments.

An example of an optical modulator (1-10) is depicted in FIG. 1-1, where $\psi_{in}$ represents an input optical field, $\psi_{out}$ represents the optical field output by modulator 1-10, α represents the amplitude modulation factor and θ represents the phase modulation factor. Ideally, modulator 1-10 would be able to set the entries of the optical field $\psi_{in}$ to any phase in combination with any attenuation as $\psi_{out} = \alpha e^{i\theta}$, with $\alpha \leq 1$ and $\theta \in [0, 2\pi]$. Because modulators typically have an associated Kramers-Kronig relation, and/or are subject to dynamic loss, simply setting the values of α and θ cannot be easily accomplished. Conventionally, two or more modulators with two independently controllable modulating signals are used to encode both the amplitude and phase of the optical field in a way that is representative of a real, signed number. However, having multiple controllable modulating signals calls for complicated multi-variable encoding schemes, often involving feedback loops for simultaneously controlling the phase and intensity of the optical signal.

Optical modulators that are capable of modulating intensity without affecting the phase exist, including modulators based on electro-optic materials. Unfortunately, electro-optic modulators are challenging to work with in large-scale commercial contexts due the fact that they involve use of materials impractical to fabricate.

Conventional computers do not natively perform complex arithmetic. Rather, they use signed arithmetic where numbers can be positive or negative and complex arithmetic can be built up by performing several calculations and combining the results. The inventors have recognized and appreciated that this fact may be exploited to dramatically simplify the implementation of real, signed linear transformations, even in the presence of dynamic loss and/or non-ideal phase or intensity modulators.

Some embodiments relate to techniques for encoding vectors of signed, real numbers using non-ideal optical modulators (modulators in which intensity modulation gives rise to phase modulation and phase modulation gives rise to intensity modulation). Contrary to other implementations, some such embodiments involve use of a single modulating signal to control the phase as well as the intensity of an optical signal. The inventors have appreciated that, when encoding signed, real numbers onto optical field using a single modulating signal, the exact location of the optical signal in phase space (e.g., the real and imaginary part, or the amplitude and phase) is not important for purposes of decoding. What matters for accurate decoding, according to some embodiments, is the projection of the optical signal on the real axis (or other arbitrary axes pre-selected as the measurement axis). To perform the projection on the pre-selected axis, in some embodiments, coherent detection schemes are used.

Optical domain encoding techniques of the types described herein may be used in a variety of contexts, including but not limited to high-speed telecommunications for short, mid and long-haul applications, on chip-phase sensitive measurements for sensing, communications and computing, and optical machine learning using photonic processors.

More generally, encoding techniques of the types described herein may be used in any context in which optical signals are processed according to real transformations (as opposed to complex transformations). Conventional computers do not directly perform complex arithmetic. Rather, conventional computers use signed, real arithmetic where numbers can be positive or negative. In some embodiments, complex arithmetic can be built up in the optical domain by performing several calculations involving real number arithmetic. Consider for example an optical linear system configured to transform optical signals according to the following expression:

$$y = Mx = [\text{Re}(M) + i\text{Im}(M)][\text{Re}(x) + i\text{Im}(x)]$$
$$= [\text{Re}(M)\text{Re}(x) - \text{Im}(M)\text{Im}(x)] + i[\text{Re}(m)\text{Im}(x) + \text{Im}(M)(\text{Re}(x)]$$

where x represents an input vector, M represents a transformation matrix, y represents the output vector and i represents the imaginary number defined such that $i^2=-1$. Considering real transformations (such that $\text{Im}(M)=0$), y can be rewritten as follows:

$$y = e^{i\gamma}M[\text{Re}(x) + i\text{Im}(x)] = e^{i\gamma}M\text{Re}(x) + e^{i(\gamma+\frac{\pi}{2})}M\text{Im}(x)$$

It should be noted that, based on this equation, the real and imaginary parts of the input field x contribute only to linear independent components of the resulting field y. The inventors have recognized and appreciated that y can be decoded using a coherent receiver by projecting y on any arbitrary axis in the complex plane.

Figures 1, 2, 2A:
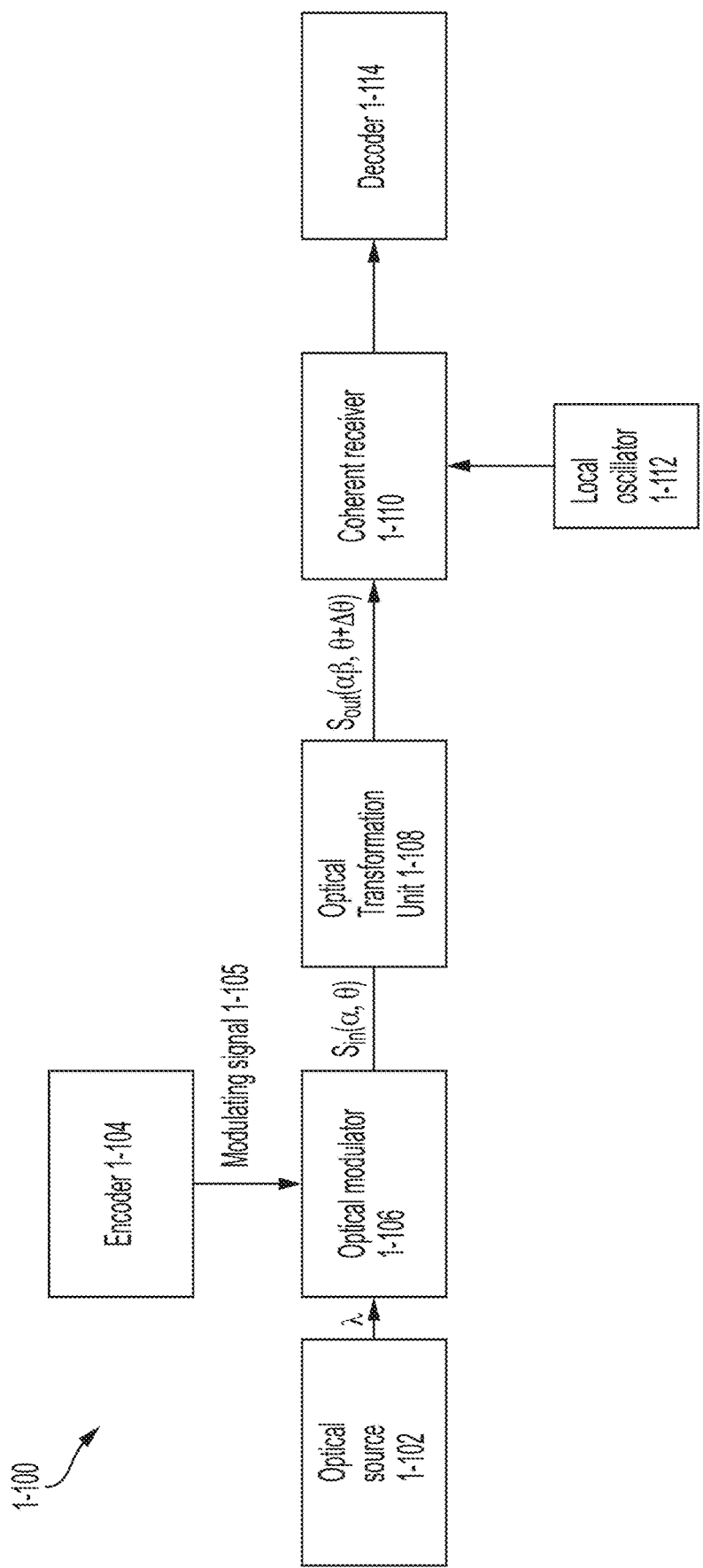

FIG. 1-2A is a block diagram of a photonic system implementing optical encoding techniques according to some embodiments. Photonic system 1-100 includes an optical source 1-102, an encoder 1-104, an optical modulator 1-106, and optical transformation unit 1-108, a coherent receiver 1-110, a local oscillator 1-112 and a decoder 1-114. In some embodiments, photonic system 1-100 may include additional or alternative components not illustrated in FIG. 1-2A. In some embodiments, some or all of the components of FIG. 1-2A may be disposed on the same semiconductor substrate (e.g., a silicon substrate).

Optical source 1-102 may be implemented in a number of ways, including, for example, using optical coherent sources. In one example, optical source 1-102 includes a laser configured to emit light at wavelength $\lambda_0$. The wavelength of emission may be in the visible, infrared (including near infrared, mid infrared and far infrared) or ultraviolet portion of the electromagnetic spectrum. In some embodiments, $\lambda_0$ may be in the O-band, C-band or L-band. Light emitted by optical source 1-102 is modulated using optical modulator 1-106. Optical modulator 1-106 is a non-ideal modulator, such that a phase modulation gives rise to an intensity modulation and an intensity modulation gives rise to a phase modulation. In some embodiments, the phase modulation may be related to the intensity modulation according to the Kramers-Kronig equations. Alternatively, or additionally, modulator 1-106 may suffer from dynamic loss where a phase shift leads to attenuation.

In some embodiments, modulator 1-106 is driven by a single electrical modulating signal 1-105. Thus, a single modulating signal modulates both the phase and the amplitude of the optical field. This is in contrast to modulators conventionally used in optical communications to encode symbols in the complex amplitude of an optical field, where each symbol represents more than one bit. In such types of modulators, in fact, multiple modulating signals modulate the optical field. Consider for example optical modulators configured to provide quadrature phase-shift keying (QPSK) modulation schemes. In these types of modulators, one modulating signal modulates the real part of the optical field and one modulating field modulates the imaginary part of the optical field. Thus, in QPSK modulators, the phase and the amplitude of the optical field are modulated, collectively, using two modulating signals.

Examples of modulators that may be used for modulator 1-106 include Mach Zehnder modulators, electro-optical modulators, ring or disk modulators or other types of resonant modulators, electro-absorption modulators, Franz-Keldysh modulators, acousto-optical modulators, Stark-effect modulators, magneto-optical modulators, thermo-optical modulators, liquid crystal modulators, quantum-confinement optical modulators, and photonic crystal modulators, among other possible types of modulators.

Encoder 1-104 generates modulating signal 1-105 based on the real number to be encoded. For example, in some embodiments, encoder 1-104 may include a table mapping real numbers to amplitudes for the modulating signal.

Optical transformation unit 1-108 may be configured to transform the intensity and/or the phase of the received optical field. For example, optical transformation unit 1-108 may include an optical fiber, an optical waveguide, an optical attenuator, an optical amplifier (such as an erbium-doped fiber amplifier), a beam splitter, a beam combiner, a modulator (such as an electro-optic modulator, a Franz-Keldysh modulator, a resonant modulator, or a Mach Zehnder modulator, among others), a phase shifter (such as a thermal phase shifter or a phase shifter based on the plasma dispersion effect), an optical resonator, a laser, or any suitable combination thereof. In the context of optical communications, optical transformation unit 1-108 may include a fiber optic communication channel. The optical communication channel may include for example optical fibers, and optionally, optical repeaters (e.g., erbium-doped fiber amplifiers). In the context of optical processing, optical transformation unit 1-108 may include a photonic processing unit, an example of which is discussed in detail further below. In some embodiments, optical transformation unit 1-108 implements a real transformation, such that the imaginary part of the transformation is substantially equal to zero.

The optical field output by optical transformation unit 1-108 is provided, directly or indirectly (e.g., after passing through one or more other photonic components), to coherent receiver 1-110. Coherent receiver 1-110 may include a homodyne optical receiver or a heterodyne optical receiver. The reference signal with which the received signal is beaten may be provided by local oscillator 1-112, as shown in FIG. 1-2A, or may be provided together with the modulated optical field after passing through optical transformation unit 1-108. Decoder 1-114 may be arranged to extract a real number (or a vector of real numbers) from the signal output by coherent receiver 1-112.

Figures 1, 2, 2B:
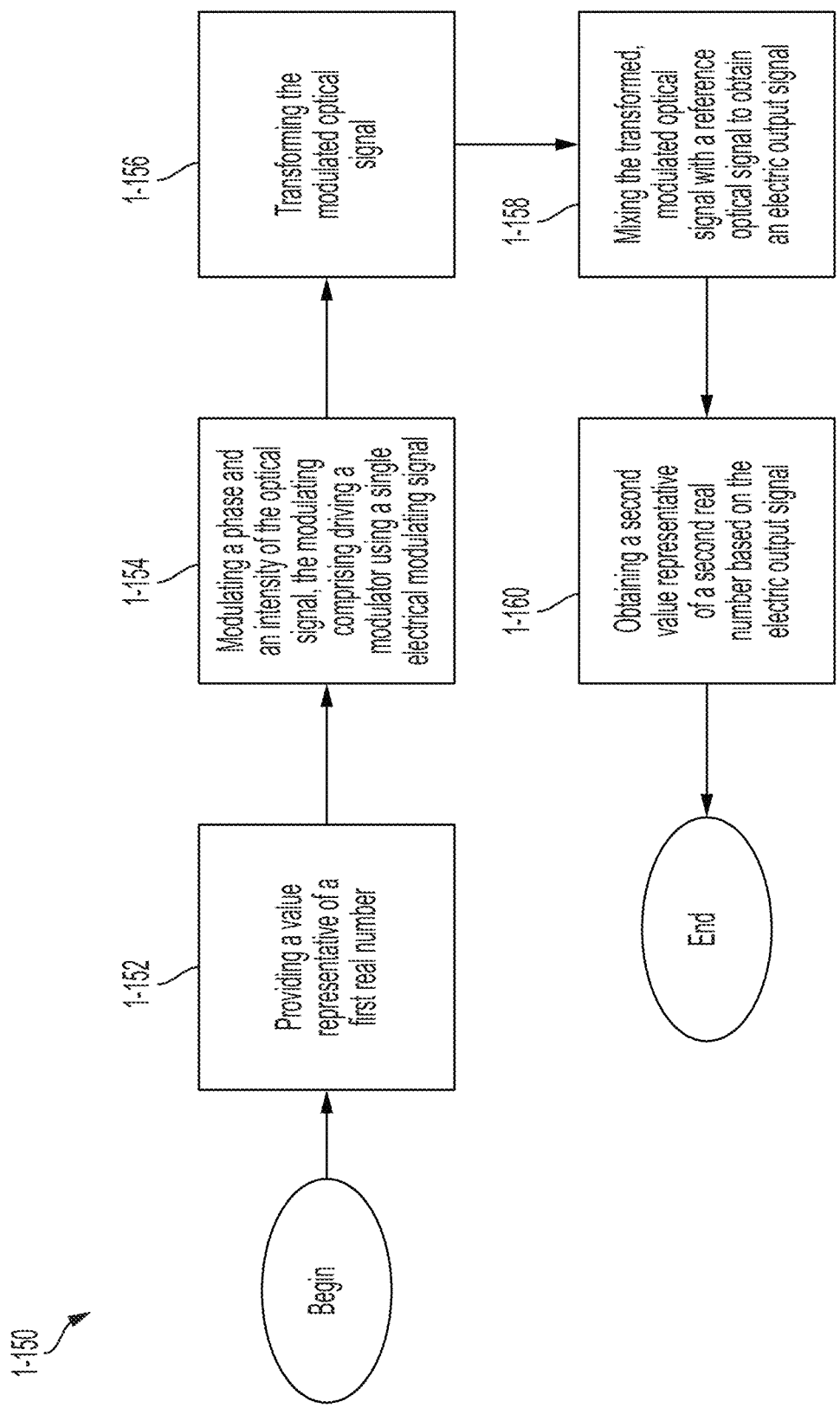

FIG. 1-2B is a flowchart illustrating a method for processing real numbers in the optical domain, in accordance with some embodiments. Method 1-150 may be performed using the system of FIG. 1-2A, or using any other suitable system. Method 1-150 begins at act 1-152, in which a value representative of a real number is provided. The real number may be signed (i.e., may be positive or negative) in some embodiments. The real number may represent a certain environmental variable or parameter, such as a physical condition (e.g., temperature, pressure, etc.), information associated with an object (e.g., position, motion, velocity, rate of rotation, acceleration, etc.), information associated with a multimedia file (e.g., acoustic intensity of audio files, pixel color and/or intensity of image or video files), information associated with a certain chemical/organic element or compound (e.g., concentration), information associated with financial assets (e.g., price of a certain security), or any other suitable type of information including information derived from the examples described above. The information represented by the signed, real number may be useful for a variety of reasons, including for example to train a machine learning algorithm, to perform forecasting, data analytics, troubleshooting, or simply to collect data for future use.

At act 1-154, the value representative of the real number may be encoded onto an optical field. In some embodiments, encoding the value onto an optical field involves modulating the phase and the intensity of an optical field based on the value. As a result, the phase and the amplitude of the optical field reflect the encoded value. Act 1-154 may be performed in some embodiments using encoder 1-104 and modulator 1-106 (see FIG. 1-2A). In some such embodiments, modulating the phase and amplitude based on the value involves driving a single modulator with a single electrical modulating signal. Thus, a single modulating signal modulates both the phase and the amplitude of an optical field. Referring back to FIG. 1-2A by way of example and not limitation, encoder 1-104 may drive optical modulator 1-106 using a single modulating signal 1-105.

It should be noted that the fact that a single modulating signal is used to drive the modulator does not preclude the use of other control signals for controlling the environment in which the modulator operates. For example, one or more control signals may be used to control the temperature of the modulator or the temperature of a certain portion of the modulator. One or more control signals may be used to power the operations of the modulator. One or more control signals may be used to bias the modulator in a certain regime of operation, such as to bias the modulator in its linear region or to set the wavelength of the modulator to match the wavelength of the optical source (e.g., $\lambda_o$ of FIG. 1-2A).

A specific type of modulator is illustrated in FIG. 1-3A, in accordance with some embodiments. Modulator 1-206 is a ring resonant modulator. It should be noted that ring modulators are described herein merely by way of example, as any other suitable type of modulator, including those listed above, may alternatively be used. Modulator 1-206 includes a waveguide 1-208, a ring 1-210, and a phase shifter 1-212. Ring 1-210 exhibits a resonant wavelength, the value of which depends, among other parameters, the length of the ring's perimeter. When an optical field $\psi_{in}$ is launched into waveguide 1-208, the optical field may or may not couple to ring 1-210 depending on the wavelength of $\psi_{in}$ relative to the resonant wavelength of ring 1-210. For example, if the wavelength of $\psi_{in}$ matches the resonant wavelength, at least part of the energy of $\psi_{in}$ is transferred, via evanescent coupling, to ring 1-210. The power transferred to the ring will oscillate indefinitely inside the ring until it is completely scattered or otherwise dissipated. By contrast, if the wavelength of $\psi_{in}$ does not match the resonant wavelength, $\psi_{in}$ may proceed straight through waveguide 1-208 without any significant attenuation.

Thus, the optical field may vary depending on the wavelength of $\psi_{in}$ relative to the resonant wavelength. More particularly, the phase and the intensity of the optical field may vary depending on the wavelength of $\psi_{in}$ relative to the resonant wavelength. FIG. 1-3B is a plot illustrating how the intensity (top chart) and the phase (bottom chart) may vary depending on the wavelength of $\psi_{in}$ relative to the resonant wavelength. The top chart illustrates the intensity spectral response a as a function of all possible wavelengths ($\lambda$) that $\psi_{in}$ may have. The bottom chart illustrates the phase spectral response $\theta$ as a function of the same wavelength. At the resonant frequency, the intensity response exhibits a dip and the phase response exhibits an inflection point. Wavelengths substantially lower that the resonant frequency are subject to a low intensity attenuation ($\alpha \sim 1$) and a low phase change ($\theta \sim 0$). Wavelengths substantially greater that the resonant frequency are subject to a low intensity attenuation ($\alpha \sim 1$) and a change in sign ($\theta \sim -\pi$). At the resonant wavelength, the intensity of $\psi_{in}$ is attenuated by the value corresponding to the dip and is subject to a phase shift equal to the value of the inflection point (i.e., $-\pi/2$). In the example of FIG. 1-3B, the wavelength ($\lambda_o$) of $\psi_{in}$ is slightly offset relative to the resonant frequency. In this case, the intensity of $\psi_{in}$ is attenuated by $\alpha_{V0}$ (where $0 < \alpha_{V0} < 1$) and the phase is shifted by $\theta_{V0}$ (where $-\pi < \theta_{V0} < -\pi/2$).

Referring back to FIG. 1-3A, modulation of the amplitude and phase of $\psi_{in}$ may be performed using voltage V, which in this case embodies modulating signal 1-105 of FIG. 1-2A. When a voltage V is applied to phase shifter 1-212, the refractive index of the phase shifter changes and so does, as a result, the effective length of the ring's perimeter. This, in turn, leads to a variation in the resonant frequency of the ring. The extent to which the effective perimeter length (and accordingly, the resonant frequency) varies depends upon the amplitude of V.

In the example of FIG. 1-3B, voltage V is set to zero. In the example of FIG. 1-3C, the voltage is set to $V_1$. As shown in FIG. 1-3C, application of $V_1$ to phase shifter 1-212 leads to a shift in the intensity and phase spectral responses of the modulator along the wavelength axis. In this case, the responses exhibit a redshift (i.e., a shift towards greater wavelengths). The result is that the intensity of $\psi_{in}$ is now attenuated by $\alpha_{V1}$ ($\alpha_{V1}$ being different than $\alpha_{V0}$) and the phase is shifted by $\theta_{V1}$ ($\theta_{V1}$ being different than $\theta_{V0}$).

Thus, varying voltage V leads to a change in intensity and phase of $\psi_{in}$. In other words, V may be viewed as a modulating signal. In some embodiments, voltage V may be the only modulating signal driving modulator 1-210. Voltage V may assume the following expression in some embodiments $V = V_{DC} + V(t)$, where $V_{DC}$ is a constant and V(t) is varied over time depending on the real numbers to encode. $V_{DC}$ may pre-bias the ring so that resonant frequency is in proximity to the wavelength ($\lambda_o$) of $\psi_{in}$.

FIG. 1-3D is an encoder table (e.g., a look-up table) providing an example of how real numbers may be encoded, using modulator 1-206, into the phase and intensity of an optical field, in accordance with some embodiments. In this case it will be assumed, by way of example, that real numbers between –10 and 10 with increments equal to 1 are to be encoded in the optical domain (see column labeled "real number to encode"). Of course, any suitable set of real numbers may be encoded using the techniques described herein. The column labeled "V (applied voltage)" indicates the voltage being applied to phase shifter 1-212. The column labeled "$\alpha$ (amplitude modulation)" indicates the value of the intensity spectral response at the wavelength ($\lambda_o$) of $\psi_{in}$ (see FIGS. 1-3B and 1-3C, top charts). The column labeled "$\theta$ (phase modulation)" indicates the value of the phase spectral response at the wavelength ($\lambda_o$) of $\psi_{in}$ (see FIGS. 1-3B and 1-3C, bottom charts). In this case, real number "–10" is mapped to a certain voltage $V_1$, which leads to an amplitude modulation $\alpha_1$ and a phase modulation $\theta_1$; real number "–9" is mapped to a certain voltage $V_2$, which leads to an amplitude modulation $\alpha_2$ and a phase modulation $\theta_2$; and so on. Real number "10" is mapped to a certain voltage $V_N$, which leads to an amplitude modulation $\alpha_N$ and a phase modulation $\theta_N$. Thus, different real numbers are encoded with different intensity/phase pairs.

FIG. 1-3E provides a visual representation, in the complex plane, of the encoding table of FIG. 1-3D, in accordance with some embodiments. Different points along the line 1-300 represent different intensity/phase pairs, in accordance with the spectral responses of FIGS. 1-3B and 1-3C, as the voltage is varied. The symbol $S_{in}$, for example, represents a specific symbol characterized by intensity modulation $\alpha$ and a phase modulation $\theta$. $S_{in}$ represents a certain row from the table of FIG. 1-3D. Each row of the table is mapped on a different point of line 1-300.

Referring back to FIG. 1-2B, at act 1-156, a transformation is applied to the modulated optical signal output by the modulator. The transformation may involve an intensity transformation and/or a phase transformation, depending on the way one desires to process the encoded real numbers. In some embodiments, optical transformation unit 1-108 may be used for the transformation of the signal output by modulator 1-106. Optical transformation unit 1-108 may be configured to transform a symbol $S_{in}$, which is characterized by an intensity $\alpha$ and phase $\theta$, into a symbol $S_{out}$, which is characterized by an intensity $\alpha\beta$ and phase $\theta+\Delta\theta$. In other words, optical transformation unit 1-108 introduces an intensity modulation $\beta$ and a phase shift $\Delta\theta$. The values of $\beta$ and $\Delta\theta$ depend upon the specific optical transformation unit being used.

Considering by way of example the input symbol $S_{in}$ of FIG. 1-3E, FIGS. 1-4A through 1-4C provide examples of how the optical transformation unit may perform the transformation. The transformation of FIG. 1-4A is such that $\beta<1$ and $\Delta\theta=0$. That is, the optical transformation unit introduces an attenuation but does not alter the phase of the input optical field. This may be the case, for example, of an optical fiber with no optical repeaters, the optical fiber having a length selected to maintain the input phase. The result is that line 1-300 is transformed to line 1-401, where line 1-401 is a compressed version of line 1-300. The output sample, $S_{out}$, has the same phase as the $S_{in}$, but the intensity is equal to $\alpha\beta$ (i.e., is attenuated by $\beta$).

The transformation of FIG. 1-4B introduces an attenuation as well as a phase shift. This may be the case, for example, of an optical fiber with no optical repeaters, the optical fiber having an arbitrary length. The result is that line 1-300 is transformed to line 1-402, where line 1-402 is a compressed and rotated version of line 1-300. The output sample, $S_{out}$, has phase $\theta+\Delta\theta$ and intensity $\alpha\beta$.

The transformation of FIG. 1-4C involves a multi-mode transformation. This may occur when the input optical field is combined with one or more other optical fields. With multi-mode transformations, line 1-403 can be re-shaped in any suitable manner. Examples of multi-mode transformations include optical processing units, some of which are described in detail further below.

Referring back to FIG. 1-2B, at act 1-158, a coherent receiver may mix the transformed, modulated optical field with a reference optical signal to obtain an electric output signal. In some embodiments, the mixing may be performed using coherent receiver 1-110 of FIG. 1-2A. The reference optical signal may be a signal generated by a local oscillator (e.g., local oscillator 1-112 of FIG. 1-2A), or may be a signal transmitted together with the modulated optical field through the optical transformation unit. The effect of the mixing is illustrated in FIG. 1-5 by way of example and not limitation. Line 1-403 (the same line shown in FIG. 1-4C) represents all possible intensity/phase pairs coming out of a certain multi-mode transformation. Suppose that $S_{out}$ is the symbol coming out of the transformation at a certain time. As described above, symbol $S_{out}$ is characterized by an intensity $\alpha\beta$ and a phase $\theta+\Delta\theta$. When the transformed field is mixed with the reference signal, points along line 1-403 are projected on a reference axis 1-500. Thus, for example, symbol $S_{out}$ is projected onto point A on the axis 1-500. Point A represents the electric output signal arising out of the mixing, and is characterized by an amplitude equal to the distance between 0 and A ($\overline{OA}$). It should be noted that the angle of the axis 1-500 relative to the real axis (i.e., angle $\varphi$), depends upon the phase of the reference signal relative to the transformed, modulated optical field. In this example, $0<\varphi<\pi/4$.

Referring back to FIG. 1-2B, at act 1-160, a decoder may obtain a value representative of a decoded real number based on the electric output signal obtained at act 1-158. In some embodiments, when decoding symbols obtained through an optical transformation, the exact location of the symbol in the complex plane may be unimportant. What matters for accurate decoding, according to some embodiments, is the projection of the optical signal on a known reference axis. In other words, symbols along the line 1-403 can be mapped to points along the reference axis, much like symbol $S_{out}$ is mapped to point A. Thus, some embodiments implement optical decoding schemes in which points along a reference axis correspond to specific symbols in the complex plane.

The manner in which points along the reference axis are mapped to symbols in the complex plane may be determined using a calibration procedure. During the calibration procedure, a set of input symbols of known intensity and phase (the symbols representative of a set of real numbers), are passed through a certain optical transformation unit, and the resulting symbols are coherently detected using a reference signal having a known phase. The amplitude of the resulting electric output signal (i.e., the amplitude of the projection along the reference axis) is recorded and stored in a table (e.g., a look-up table). The table may subsequently be used during operation to decode real numbers based on the amplitude of the projection along the reference axis.

An example of such a table is illustrated in FIG. 1-6, in accordance with some embodiments. This table includes a column for the phase of the reference signal ("reference phase $\varphi$"), a column for the projection along the reference axis ("projection $\overline{OA}$," i.e., the amplitude of the electrical output signal), and a column for the decoded real number ("decoded real number"). The table may be populated during a calibration procedure involving 1) passing a symbol of known intensity and phase through a known optical transformation unit, 2) setting the phase of a reference signal to a known value, 3) mixing the transformed symbol with the reference signal thereby projecting the transformed symbol onto the known reference axis, 4) determining the amplitude of the projection along the reference axis, and 5) recording the expected output real number. During operation, a user may infer the decoded real number using the table based on the value of the reference phase and the measured projection.

In the example of FIG. 1-6, only two reference phases are considered by way of example and not limitation—0 and $\pi/6$. At $\varphi=0$, projections −1, −0.8 and 1 are mapped to real numbers −9.6, 0.2 and 8.7, respectively. At $\varphi=\pi/6$, projections −0.4, 0.6 and 0.9 are mapped to real numbers 3.1, −5 and 10, respectively. Thus, for example, if a user obtains a projection of −0.4 when using a reference phase of $\pi/6$, the user can infer that the decoded real number is 3.1.

FIG. 1-7 illustrates a specific example of a photonic system 1-700 in which the optical transformation unit includes an optical fiber 1-708, in accordance with some embodiments. This example illustrates how encoding techniques of the types described herein may be used in the context of optical communications. In this implementation, optical fiber 1-708 separates transmitter 1-701 from receiver 1-702.

Transmitter 1-701 includes optical source 1-102, encoder 1-104 and optical modulator 1-106 (described above in connection with FIG. 1-2A) and receiver 1-702 includes coherent receiver 1-110 and decoder 1-114 (also described above in connection with FIG. 1-2A). As described above, in some embodiments, optical modulator 1-106 may be driven using a single modulating signal 1-105. In some such embodiments, optical modulator 1-106 may implement an on-off keying (OOK) modulation scheme.

It should be noted that, in this implementation, the reference signal used for the coherent detection is provided directly from transmitter 1-701, rather than being generated locally at receiver 1-702 (though other implementations may involve local oscillators at receiver 1-702). To illustrate this concept, consider for example the plot of FIG. 1-8. FIG. 1-8 illustrates an example of a power spectral density of an optical field at the output of transmitter 1-701. As shown, the power spectral density includes a signal 1-800 as well as a carrier 1-801. Signal 1-800 represents the information encoded using modulator 1-106. Carrier 1-801 represents a tone at the wavelength of optical source 1-102 ($\lambda_0$). Upon transmission of this optical field through optical fiber 1-708, coherent receiver 1-110 may perform the mixing using carrier 1-801 itself as the reference signal.

Some embodiments relate to methods for fabricating photonic systems of the types described herein. One such method is depicted in FIG. 1-9, in accordance with some embodiments. Method 1-900 begins at act 1-902, in which a modulator is fabricated. The modulator may be fabricated to be driven with a single electrical modulating signal. An example of a modulator is modulator 1-106 (FIG. 1-2A). At act 1-904, a coherent receiver is fabricated. In some embodiments, the coherent receiver is fabricated on the same semiconductor substrate on which the modulator is fabricated. At act 1-906, an optical transformation unit is fabricated. The optical transformation unit may be fabricated on the same substrate on which the coherent receiver is fabricated and/or on the same semiconductor substrate on which the modulator is fabricated. The optical transformation unit may be fabricated to be coupled between the modulator and the coherent receiver. An example of an optical transformation unit is optical transformation unit 1-108 (FIG. 1-2A).

II. Examples of Optical Transformation Units

As described above, certain optical transformation units may operate in a multi-mode fashion, in which multiple optical fields are combined together to produce arbitrary transformations. Multi-mode optical transformation units may include or be part of a photonic processing systems in some embodiments.

Referring to FIG. 2-1, a photonic processing system 2-100 includes an optical encoder 2-101, a photonic processor 2-103, an optical receiver 2-105, and a controller 2-107, according to some embodiments. In some embodiments, optical transformation unit 1-108 includes a photonic processing system 2-100 (or parts thereof).

The photonic processing system 2-100 receives, as an input from an external processor (e.g., a CPU), an input vector represented by a group of input bit strings and produces an output vector represented by a group of output bit strings. For example, if the input vector is an n-dimensional vector, the input vector may be represented by n separate bit strings, each bit string representing a respective component of the vector. The input bit string may be received as an electrical or optical signal from the external processor and the output bit string may be transmitted as an electrical or optical signal to the external processor. In some embodiments, the controller 2-107 does not necessarily output an output bit string after every process iteration. Instead, the controller 2-107 may use one or more output bit strings to determine a new input bit stream to feed through the components of the photonic processing system 2-100. In some embodiments, the output bit string itself may be used as the input bit string for a subsequent iteration of the process implemented by the photonic processing system 2-100. In other embodiments, multiple output bit streams are combined in various ways to determine a subsequent input bit string. For example, one or more output bit strings may be summed together as part of the determination of the subsequent input bit string.

The optical encoder 2-101 is configured to convert the input bit strings into optically encoded information to be processed by the photonic processor 2-103. In some embodiments, each input bit string is transmitted to the optical encoder 2-101 by the controller 2-107 in the form of electrical signals. The optical encoder 2-101 converts each component of the input vector from its digital bit string into an optical signal. In some embodiments, the optical signal represents the value and sign of the associated bit string as an amplitude and a phase of an optical pulse. In some embodiments, the phase may be limited to a binary choice of either a zero phase shift or a $\pi$ phase shift, representing a positive and negative value, respectively. Embodiments are not limited to real input vector values. Complex vector components may be represented by, for example, using more than two phase values when encoding the optical signal. In some embodiments, the bit string is received by the optical encoder 2-101 as an optical signal (e.g., a digital optical signal) from the controller 2-107. In these embodiments, the optical encoder 2-101 converts the digital optical signal into an analog optical signal of the type described above.

The optical encoder 2-101 outputs n separate optical pulses that are transmitted to the photonic processor 2-103. Each output of the optical encoder 2-101 is coupled one-to-one to a single input of the photonic processor 2-103. In some embodiments, the optical encoder 2-101 may be disposed on the same substrate as the photonic processor 2-103 (e.g., the optical encoder 2-101 and the photonic processor 2-103 are on the same chip). In such embodiments, the optical signals may be transmitted from the optical encoder 2-101 to the photonic processor 2-103 in waveguides, such as silicon photonic waveguides. In other embodiments, the optical encoder 2-101 may be disposed on a separate substrate from the photonic processor 2-103. In such embodiments, the optical signals may be transmitted from the optical encoder 2-101 to the photonic processor 103 in optical fiber.

The photonic processor 2-103 performs the multiplication of the input vector by a matrix M. As described in detail below, the matrix M is decomposed into three matrices using a combination of a singular value decomposition (SVD) and a unitary matrix decomposition. In some embodiments, the unitary matrix decomposition is performed with operations similar to Givens rotations in QR decomposition. For example, an SVD in combination with a Householder decomposition may be used. The decomposition of the matrix M into three constituent parts may be performed by the controller 2-107 and each of the constituent parts may be implemented by a portion of the photonic processor 2-103. In some embodiments, the photonic processor 2-103 includes three parts: a first array of variable beam splitters (VBSs) configured to implement a transformation on the array of input optical pulses that is equivalent to a first matrix multiplication (see, e.g., the first matrix implementation 2-301 of FIG. 2-3); a group of controllable optical elements configured to adjust the intensity and/or phase of each of the optical pulses received from the first array, the adjustment being equivalent to a second matrix multiplication by a diagonal matrix (see, e.g., the second matrix implementation 2-303 of FIG. 2-3); and a second array of VBSs configured to implement a transformation on the optical pulses received from the group of controllable electro-optical element, the transformation being equivalent to a third matrix multiplication (see, e.g., the third matrix implementation 2-305 of FIG. 3).

The photonic processor 2-103 outputs n separate optical pulses that are transmitted to the optical receiver 2-105. Each output of the photonic processor 2-103 is coupled one-to-one to a single input of the optical receiver 2-105. In some embodiments, the photonic processor 2-103 may be disposed on the same substrate as the optical receiver 2-105 (e.g., the photonic processor 2-103 and the optical receiver 2-105 are on the same chip). In such embodiments, the optical signals may be transmitted from the photonic processor 2-103 to the optical receiver 2-105 in silicon photonic waveguides. In other embodiments, the photonic processor 2-103 may be disposed on a separate substrate from the optical receiver 2-105. In such embodiments, the optical signals may be transmitted from the photonic processor 103 to the optical receiver 2-105 in optical fibers.

The optical receiver 2-105 receives the n optical pulses from the photonic processor 2-103. Each of the optical pulses is then converted to electrical signals. In some embodiments, the intensity and phase of each of the optical pulses is measured by optical detectors within the optical receiver. The electrical signals representing those measured values are then output to the controller 2-107.

The controller 2-107 includes a memory 2-109 and a processor 2-111 for controlling the optical encoder 2-101, the photonic processor 2-103 and the optical receiver 2-105. The memory 2-109 may be used to store input and output bit strings and measurement results from the optical receiver 2-105. The memory 2-109 also stores executable instructions that, when executed by the processor 2-111, control the optical encoder 2-101, perform the matrix decomposition algorithm, control the VBSs of the photonic processor 103, and control the optical receivers 2-105. The memory 2-109 may also include executable instructions that cause the processor 2-111 to determine a new input vector to send to the optical encoder based on a collection of one or more output vectors determined by the measurement performed by the optical receiver 2-105. In this way, the controller 2-107 can control an iterative process by which an input vector is multiplied by multiple matrices by adjusting the settings of the photonic processor 2-103 and feeding detection information from the optical receiver 2-105 back to the optical encoder 2-101. Thus, the output vector transmitted by the photonic processing system 2-100 to the external processor may be the result of multiple matrix multiplications, not simply a single matrix multiplication.

In some embodiments, a matrix may be too large to be encoded in the photonic processor using a single pass. In such situations, one portion of the large matrix may be encoded in the photonic processor and the multiplication process may be performed for that single portion of the large matrix. The results of that first operation may be stored in memory 2-109. Subsequently, a second portion of the large matrix may be encoded in the photonic processor and a second multiplication process may be performed. This "chunking" of the large matrix may continue until the multiplication process has been performed on all portions of the large matrix. The results of the multiple multiplication processes, which may be stored in memory 2-109, may then be combined to form the final result of the multiplication of the input vector by the large matrix.

In other embodiments, only collective behavior of the output vectors is used by the external processor. In such embodiments, only the collective result, such as the average or the maximum/minimum of multiple output vectors, is transmitted to the external processor.

III. Optical Encoder

Referring to FIG. 2-2, the optical encoder includes at least one light source 2-201, a power tree 2-203, an amplitude modulator 2-205, a phase modulator 2-207, a digital to analog converter (DAC) 2-209 associated with the amplitude modulator 2-205, and a 2-DAC 211 associated with the phase modulator 2-207, according to some embodiments. While the amplitude modulator 2-205 and phase modulator 2-207 are illustrated in FIG. 2-2 as single blocks with n inputs and n outputs (each of the inputs and outputs being, for example, a waveguide), in some embodiments each waveguide may include a respective amplitude modulator and a respective phase modulator such that the optical encoder includes n amplitude modulators and n phase modulators. Moreover, there may be an individual DAC for each amplitude and phase modulator. In some embodiments, rather than having an amplitude modulator and a separate phase modulator associated with each waveguide, a single modulator may be used to encode both amplitude and phase information. While using a single modulator to perform such an encoding limits the ability to precisely tune both the amplitude and phase of each optical pulse, there are some encoding schemes that do not require precise tuning of both the amplitude and phase of the optical pulses. Such a scheme is described later herein.

The light source 2-201 may be any suitable source of coherent light. In some embodiments, the light source 2-201 may be a diode laser or a vertical-cavity surface emitting lasers (VCSEL). In some embodiments, the light source 2-201 is configured to have an output power greater than 10 mW, greater than 25 mW, greater than 50 mW, or greater than 75 mW. In some embodiments, the light source 2-201 is configured to have an output power less than 100 mW. The light source 2-201 may be configured to emit a continuous wave of light or pulses of light ("optical pulses") at one or more wavelengths (e.g., the C-band or O-band). The temporal duration of the optical pulses may be, for example, about 100 ps.

While light source 2-201 is illustrated in FIG. 2-2 as being on the same semiconductor substrate as the other components of the optical encoder, embodiments are not so limited. For example, the light source 2-201 may be a separate laser packaging that is edge-bonded or surface-bonded to the optical encoder chip. Alternatively, the light source 2-201 may be completely off-chip and the optical pulses may be coupled to a waveguide 2-202 of the optical encoder 2-101 via an optical fiber and/or a grating coupler.

The light source 2-201 is illustrated as two light sources 2-201a and 2-201b, but embodiments are not so limited. Some embodiments may include a single light source. Including multiple light sources 201a-b, which may include more than two light sources, can provide redundancy in case one of the light sources fails. Including multiple light sources may extend the useful lifetime of the photonic processing system 2-100. The multiple light sources 2-201a-b may each be coupled to a waveguide of the optical encoder 2-101 and then combined at a waveguide combiner that is configured to direct optical pulses from each light source to the power tree 2-203. In such embodiments, only one light source is used at any given time.

Some embodiments may use two or more phase-locked light sources of the same wavelength at the same time to increase the optical power entering the optical encoder system. A small portion of light from each of the two or more light sources (e.g., acquired via a waveguide tap) may be directed to a homodyne detector, where a beat error signal may be measured. The bear error signal may be used to determine possible phase drifts between the two light sources. The beat error signal may, for example, be fed into a feedback circuit that controls a phase modulator that phase locks the output of one light source to the phase of the other light source. The phase-locking can be generalized in a master-slave scheme, where N≥1 slave light sources are phase-locked to a single master light source. The result is a total of N+1 phase-locked light sources available to the optical encoder system.

In other embodiments, each separate light source may be associated with light of different wavelengths. Using multiple wavelengths of light allows some embodiments to be multiplexed such that multiple calculations may be performed simultaneously using the same optical hardware.

The power tree 2-203 is configured to divide a single optical pulse from the light source 2-201 into an array of spatially separated optical pulses. Thus, the power tree 2-203 has one optical input and n optical outputs. In some embodiments, the optical power from the light source 2-201 is split evenly across n optical modes associated with n waveguides. In some embodiments, the power tree 2-203 is an array of 50:50 beam splitters 2-801, as illustrated in FIG. 2-8. The number "depth" of the power tree 2-203 depends on the number of waveguides at the output. For a power tree with n output modes, the depth of the power tree 2-203 is ceil($\log_2(n)$). The power tree 2-203 of FIG. 2-8 only illustrates a tree depth of three (each layer of the tree is labeled across the bottom of the power tree 2-203). Each layer includes $2^{m-1}$ beam splitters, where m is the layer number. Consequently, the first layer has a single beam splitter 2-801a, the second layer has two beam splitters 2-801b-2-801c, and the third layer has four beam splitters 2-801d-2-801g.

While the power tree 2-203 is illustrated as an array of cascading beam splitters, which may be implemented as evanescent waveguide couplers, embodiments are not so limited as any optical device that converts one optical pulse into a plurality of spatially separated optical pulses may be used. For example, the power tree 2-203 may be implemented using one or more multimode interferometers (MMI), in which case the equations governing layer width and depth would be modified appropriately.

No matter what type of power tree 2-203 is used, it is likely that manufacturing a power tree 2-203 such that the splitting ratios are precisely even between the n output modes will be difficult, if not impossible. Accordingly, adjustments can be made to the setting of the amplitude modulators to correct for the unequal intensities of the n optical pulses output by the power tree. For example, the waveguide with the lowest optical power can be set as the maximum power for any given pulse transmitted to the photonic processor 2-103. Thus, any optical pulse with a power higher than the maximum power may be modulated to have a lower power by the amplitude modulator 2-205, in addition to the modulation to the amplitude being made to encode information into the optical pulse. A phase modulator may also be placed at each of the n output modes, which may be used to adjust the phase of each output mode of the power tree 2-203 such that all of the output signals have the same phase.

Alternatively or additionally, the power tree 2-203 may be implemented using one or more Mach-Zehnder Interferometers (MZI) that may be tuned such that the splitting ratios of each beam splitter in the power tree results in substantially equal intensity pulses at the output of the power tree 2-203.

The amplitude modulator 2-205 is configured to modify, based on a respective input bit string, the amplitude of each optical pulse received from the power tree 2-203. The amplitude modulator 2-205 may be a variable attenuator or any other suitable amplitude modulator controlled by the DAC 2-209, which may further be controlled by the controller 2-107. Some amplitude modulators are known for telecommunication applications and may be used in some embodiments. In some embodiments, a variable beam splitter may be used as an amplitude modulator 2-205, where only one output of the variable beam splitter is kept and the other output is discarded or ignored. Other examples of amplitude modulators that may be used in some embodiments include traveling wave modulators, cavity-based modulators, Franz-Keldysh modulators, plasmon-based modulators, 2-D material-based modulators and nano-opto-electro-mechanical switches (NOEMS).

The phase modulator 2-207 is configured to modify, based on the respective input bit string, the phase of each optical pulse received from the power tree 2-203. The phase modulator may be a thermo-optic phase shifter or any other suitable phase shifter that may be electrically controlled by the 2-211, which may further be controlled by the controller 2-107.

While FIG. 2-2 illustrates the amplitude modulator 2-205 and phase modulator 2-207 as two separate components, they may be combined into a single element that controls both the amplitudes and phases of the optical pulses. However, there are advantages to separately controlling the amplitude and phase of the optical pulse. Namely, due to the connection between amplitude shifts and phase shifts via the Kramers-Kronenig relations, there is a phase shift associated with any amplitude shift. To precisely control the phase of an optical pulse, the phase shift created by the amplitude modulator 2-205 should be compensated for using the phase modulator 2-207. By way of example, the total amplitude of an optical pulse exiting the optical encoder 2-101 is $A=a_0 a_1 a_2$ and the total phase of the optical pulse exiting the optical encoder is $\theta=\Delta\theta+\Delta\varphi+\varphi$, where $a_0$ is the input intensity of the input optical pulse (with an assumption of zero phase at the input of the modulators), $a_1$ is the amplitude attenuation of the amplitude modulator 2-205, $\Delta\theta$ is the phase shift imparted by the amplitude modulator 2-205 while modulating the amplitude, $\Delta\varphi$ is the phase shift imparted by the phase modulator 2-207, $a_2$ is the attenuation associated with the optical pulse passing through the phase modulator 2-209, and $\varphi$ is the phase imparted on the optical signal due to propagation of the light signal. Thus, setting the amplitude and the phase of an optical pulse is not two independent determinations. Rather, to accurately encode a particular amplitude and phase into an optical pulse output from the optical encoder 2-101, the settings of both the amplitude modulator 2-205 and the phase modulator 2-207 should be taken into account for both settings.

In some embodiments, the amplitude of an optical pulse is directly related to the bit string value. For example, a high amplitude pulse corresponds to a high bit string value and a low amplitude pulse corresponds to a low bit string value. The phase of an optical pulse encodes whether the bit string value is positive or negative. In some embodiments, the phase of an optical pulse output by the optical encoder 2-101 may be selected from two phases that are 180 degrees (π radians) apart. For example, positive bit string values may be encoded with a zero degree phase shift and negative bit string values may be encoded with a 180 degree (π radians) phase shift. In some embodiments, the vector is intended to be complex-valued and thus the phase of the optical pulse is chosen from more than just two values between 0 and 2π.

In some embodiments, the controller 2-107 determines the amplitude and phase to be applied by both the amplitude modulator 2-205 and the phase modulator 2-207 based on the input bit string and the equations above linking the output amplitude and output phase to the amplitudes and phases imparted by the amplitude modulator 2-204 and the phase modulator 2-207. In some embodiments, the controller 2-107 may store in memory 2-109 a table of digital values for driving the amplitude modulator 2-205 and the phase modulator 2-207. In some embodiments, the memory may be placed in close proximity to the modulators to reduce the communication temporal latency and power consumption.

The digital to analog converter (DAC) 2-209, associated with and communicatively coupled to the amplitude modulator 2-205, receives the digital driving value from the controller 2-107 and converts the digital driving value to an analog voltage that drives the amplitude modulator 2-205. Similarly, the DAC 2-211, associated with and communicatively coupled to the phase modulator 2-207, receives the digital driving value from the controller 2-107 and converts the digital driving value to an analog voltage that drives the phase modulator 2-207. In some embodiments, the DAC may include an amplifier that amplifies the analog voltages to sufficiently high levels to achieve the desired extinction ratio within the amplitude modulators (e.g., the highest extinction ratio physically possible to implement using the particular phase modulator) and the desired phase shift range within the phase modulators (e.g., a phase shift range that covers the full range between 0 and 2π). While the DAC 2-209 and the DAC 2-211 are illustrated in FIG. 2-2 as being located in and/or on the chip of the optical encoder 2-101, in some embodiments, the DACs 2-209 and 2-211 may be located off-chip while still being communicatively coupled to the amplitude modulator 2-205 and the phase modulator 2-207, respectively, with electrically conductive traces and/or wires.

After modulation by the amplitude modulator 2-205 and the phase modulator 2-207, the n optical pulses are transmitted from the optical encoder 2-101 to the photonic processor 2-103.

IV. Photonic Processor

Figures 1, 2, 3, 3A:
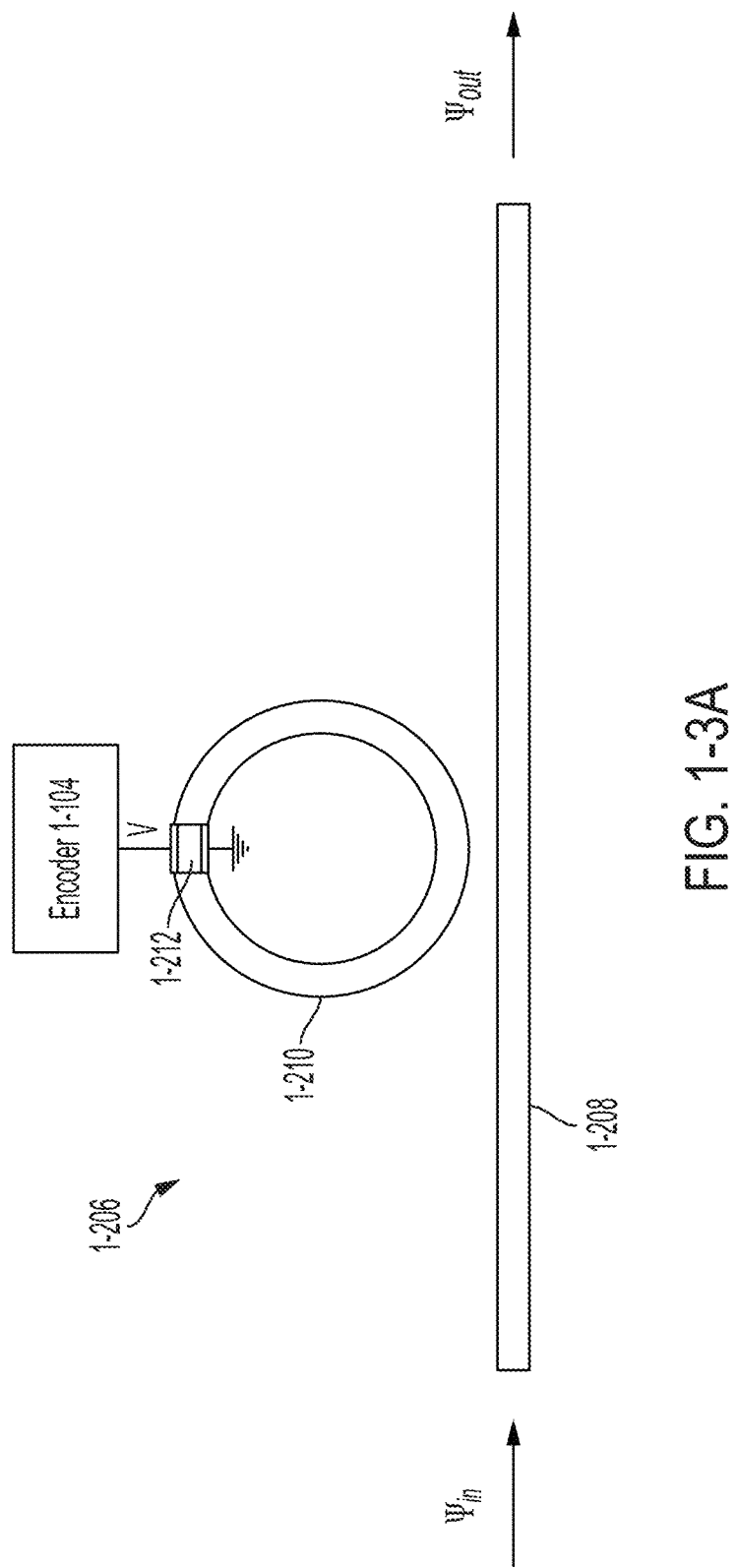
Figures 1, 2, 3, 3C:
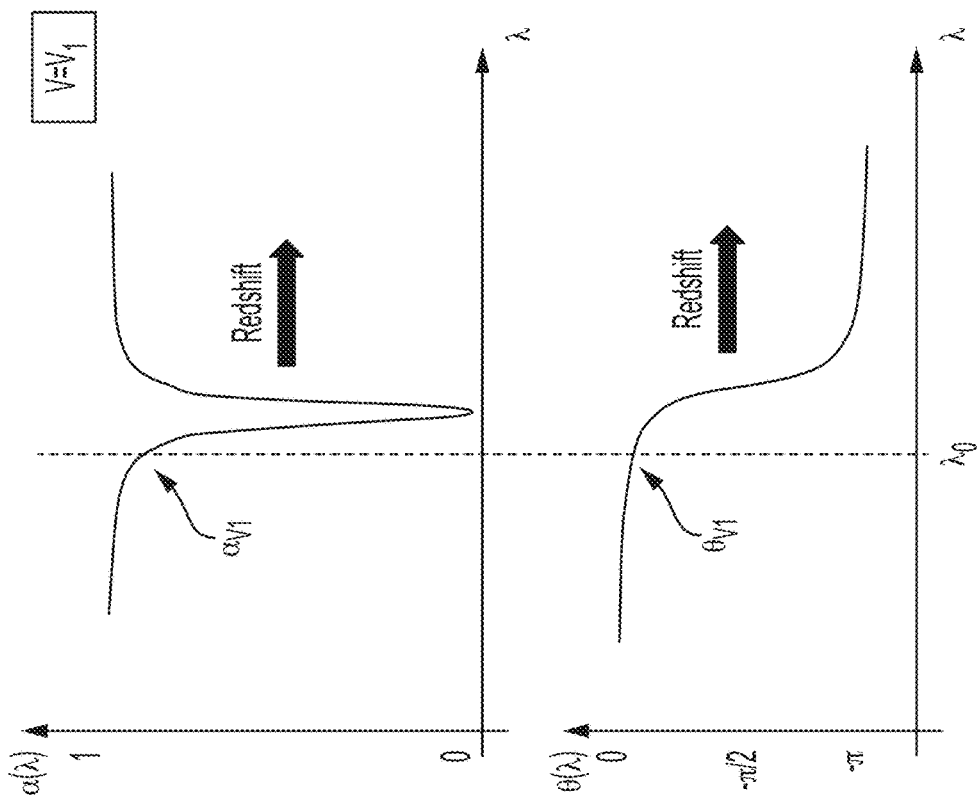
Figures 1, 2, 3, 3B:
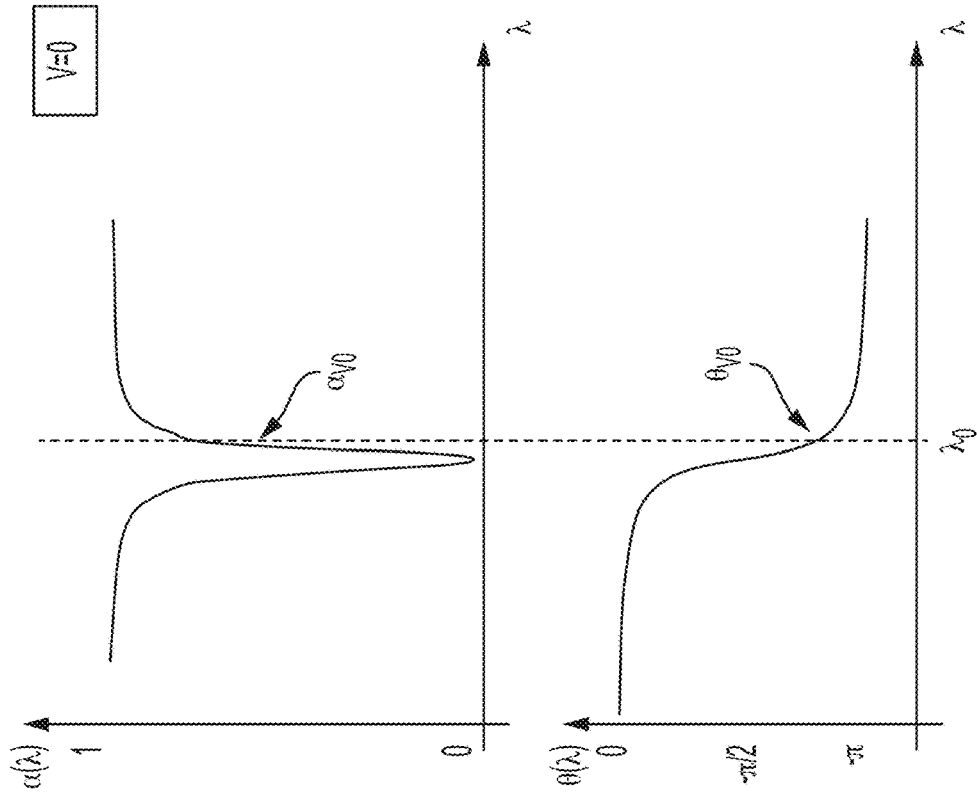
Figures 1, 2, 3, 3E:
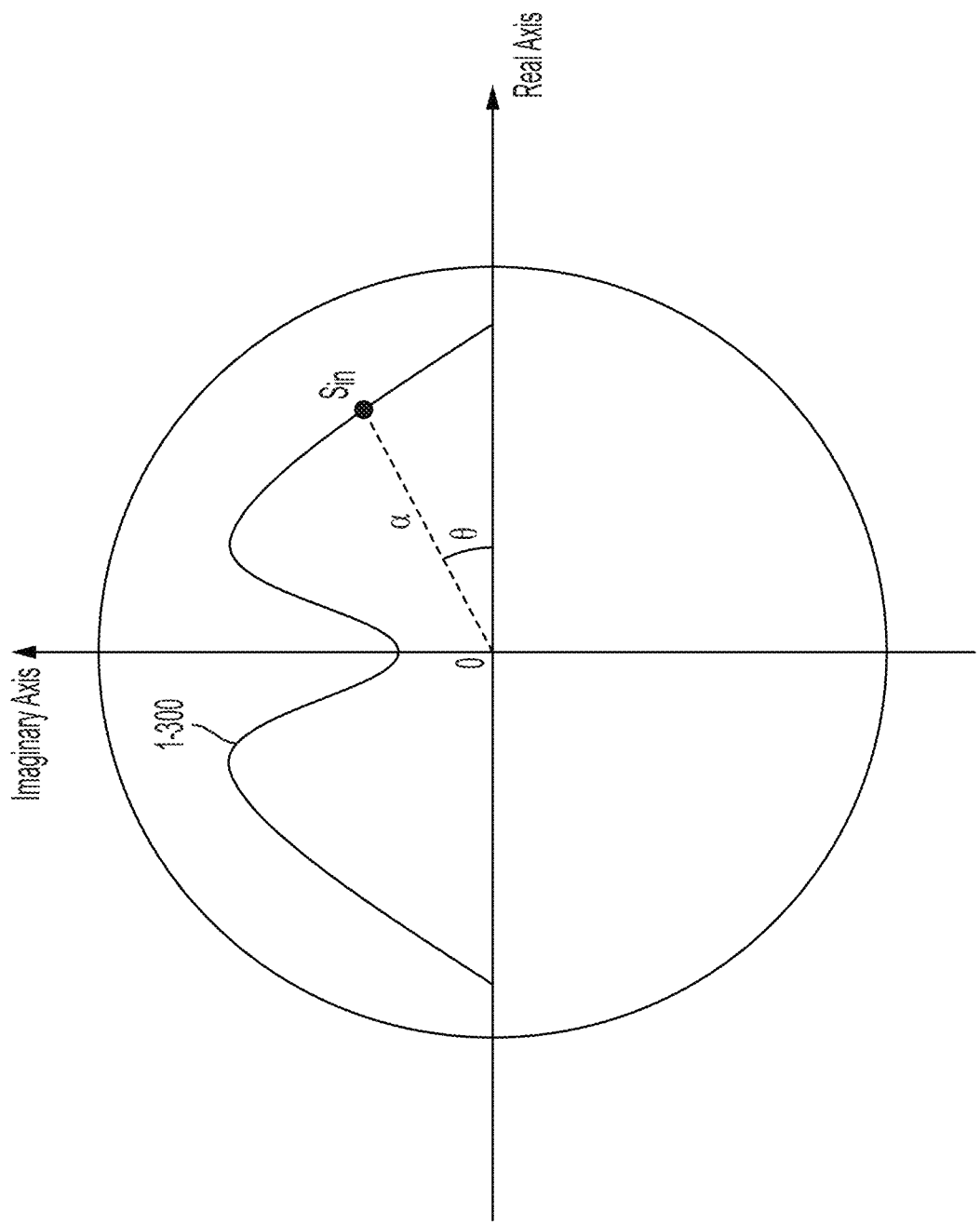

Referring to FIG. 2-3, the photonic processor 2-103 implements matrix multiplication on an input vector represented by the n input optical pulse and includes three main components: a first matrix implementation 2-301, a second matrix implementation 2-303, and a third matrix implementation 2-305. In some embodiments, as discussed in more detail below, the first matrix implementation 2-301 and the third matrix implementation 2-305 include an interconnected array of programmable, reconfigurable, variable beam splitters (VBSs) configured to transform the n input optical pulses from an input vector to an output vector, the components of the vectors being represented by the amplitude and phase of each of the optical pulses. In some embodiments, the second matrix implementation 2-303 includes a group of electro-optic elements.

The matrix by which the input vector is multiplied, by passing the input optical pulses through the photonic processor 2-103, is referred to as M. The matrix M is a general m×n known to the controller 2-107 as the matrix that should be implemented by the photonic processor 2-103. As such, the controller 2-107 decomposes the matrix M using a singular value decomposition (SVD) such that the matrix M is represented by three constituent matrices: $M=V^T \Sigma U$, where U and V are real orthogonal n×n and m×m matrices, respectively ($U^T U=UU^T=1$ and $V^T V=VV^T=1$), and $\Sigma$ is an m×n diagonal matrix with real entries. The superscript "T" in all equations represents the transpose of the associated matrix. Determining the SVD of a matrix is known and the controller 2-107 may use any suitable technique to determine the SVD of the matrix M. In some embodiments, the matrix M is a complex matrix, in which case the matrix M can be decomposed into $M=V^\dagger \Sigma U$, where V and U are complex unitary n×n and m×m matrices, respectively $U^\dagger U=UU^\dagger=I$ and $V^\dagger V=VV^\dagger=I$), and $\Sigma$ is an m×n diagonal matrix with real or complex entries. The values of the diagonal singular values may also be further normalized such that the maximum absolute value of the singular values is 1.

Once the controller 2-107 has determined the matrices U, $\Sigma$ and V for the matrix M, in the case where the matrices U and V are orthogonal real matrices, the control may further decompose the two orthogonal matrices U and V into a series of real-valued Givens rotation matrices. A Givens rotation matrix G (i, j, θ) is defined component-wise by the following equations:

$g_{kk}=1$ for $k \neq i,j$ $g_{kk}=\cos(\theta)$ for $k=i,j$ $g_{ij}=-g_{ji}=-\sin(\theta)$, $g_{kl}=0$ otherwise, where $g_{ij}$ represents the element in the i-th row and j-th column of the matrix G and θ is the angle of rotation associated with the matrix. Generally, the matrix G is an arbitrary 2×2 unitary matrix with determinant 1 (SU(2) group) and it is parameterized by two parameters. In some embodiments, those two parameters are the rotation angle θ and another phase value φ. Nevertheless, the matrix G can be parameterized by other values other than angles or phases, e.g. by reflectivities/transmissivities or by separation distances (in the case of NOEMS).

Algorithms for expressing an arbitrary real orthogonal matrix in terms of a product of sets of Givens rotations in the complex space are provided in M. Reck, et al., "Experimental realization of any discrete unitary operator," Physical Review Letters 73, 58 (1994) ("Reck"), and W. R. Clements, et al., "Optimal design for universal multiport interferometers," Optica 3, 12 (2016) ("Clements"), both of which are incorporated herein by reference in their entirety and at least for their discussions of techniques for decomposing a real orthogonal matrix in terms of Givens rotations. (In the case that any terminology used herein conflicts with the usage of that terminology in Reck and/or Clements, the terminology should be afforded a meaning most consistent with how a person of ordinary skill would understand its usage herein.). The resulting decomposition is given by the following equation:

$$U = D \prod_{k=1}^{n} \prod_{(i,j) \in S_k} G(i, j, \theta_{ij}^{(k)}),$$

where U is an n×n orthogonal matrix, $S_k$ is the set of indices relevant to the k-th set of Givens rotations applied (as defined by the decomposition algorithm), $\theta_{ij}^{(k)}$ represents the angle applied for the Givens rotation between components i and j in the k-th set of Givens rotations, and D is a diagonal matrix of either +1 or −1 entries representing global signs on each component. The set of indices $S_k$ is dependent on whether n is even or odd. For example, when n is even:

$S_k = \{(1,2),(3,4),\ldots,(n-1,n)\}$ for odd $k$ $S_k = \{(2,3),(4,5),\ldots,(n-2,n-1)\}$ for even $k$ When n is odd:

$S_k = \{(1,2),(3,4),\ldots,(n-2,n-1)\}$ for odd $k$ $S_k = \{(2,3),(4,5),\ldots,(n-1,n)\}$ for even $k$ By way of example and not limitation, the decomposition of a 4×4 orthogonal matrix can be represented as:

$U=DG(1,2,\theta_{12}^{(1)})G(3,4,\theta_{34}^{(1)})G(2,3,\theta_{12}^{(2)})G(1,2,\theta_{12}^{(3)})G(3,4,\theta_{34}^{(3)})G(2,3,\theta_{23}^{(4)})$ A brief overview of one embodiment of an algorithm for decomposing an n×n matrix U in terms of n sets of real-valued Givens rotations, which may be implemented using the controller 2-107, is as follows:
U'←U
For i from 1 to n−1;
If is odd:|
  For j=0 to i−1:
    Find $G^T_{i-j, i-j+1}(\theta)$ that nullifies element $U'_{n-j, i-j}$ i.e.
    $\theta=\tan^{-1}(U'_{n-j, i-j}/U'_{n-j,i-j+1})$ U'←U'$G^T_{i-j, i-j+1}(\theta)$
  Else if i is even:
    For j=1 to i:
    Find $G_{n-j-i-1, n+j-i}(\theta)$ that nullifies element $U'_{n+j-i,j}$
    i.e. $\theta=\tan^{-1}(-U'_{n+j-i,j}/U'_{n+j-i-1,j})$ U'←$G_{n+j-i-1, n+j-i}(\theta)$U'

The resultant matrix U' of the above algorithm is lower triangular and is related to the original matrix U by the equation:

$$U = \prod_{(j,k) \in S_L} G^T_{jk} U' \prod_{(i,j) \in S_k} G_{jk} = D_U \prod_{(i,j) \in S} G_{jk},$$

where the label $S_L$ labels the set of two modes connected by the VBS to the left of U' and the label $S_R$ labels the set of two modes connected by the VBS to the right of U'. Because U is an orthogonal matrix, U' is a diagonal matrix with {−1,1} entries along the diagonal. This matrix, U'=$D_U$, is referred to as a "phase screen."

The next step of the algorithm, is to repeatedly find $G^T_{jk}(\theta_1)D_U=D_U G_{jk}(\theta_2)$ which is accomplished using the following algorithm, which may be implemented using the controller 2-107:
For every (j,k) in $S_L$:
  if $U_{j,j}'$ and $U_{k,k}'$ have different signs:
    $\theta_2=-\theta_1$
  Else:
    $\theta_2=\theta_1$ The above algorithm may also be used to decompose V and/or $V^T$ to determine the m layers of VBS values and the associated phase screen.

The above concept of decomposing an orthogonal matrix into real-valued Givens rotation matrices can be expanded to complex matrices, e.g., unitary matrices rather than orthogonal matrices. In some embodiments, this may be accomplished by including an additional phase in the parameterization of the Givens rotation matrices. Thus, a general form of the Givens matrices with the addition of the additional phase term is T(i,j,θ,φ), where $t_{kk}=1$ for $k \neq i,j$, $t_{ii}=e^{i\phi} \cos(\theta)$, $t_{jj}=\cos(\theta)$, $t_{ij}=-\sin(\theta)$, $t_{ji}=e^{i\phi} \sin(\theta)$, $t_{kl}=0$ otherwise, where $t_{ij}$ represents the i-th row and j-th column of the matrix T, θ is the angle of rotation associated with the matrix, and φ is the additional phase. Any unitary matrix can be decomposed into matrices of the type T(i,j,θ,φ). By making the choice to set the phase φ=0, the conventional real-valued Givens rotation matrices described above are obtained. If, instead, the phase φ=π, then a set of matrices known as Householder matrices are obtained. A Householder matrix, H, has the form H=I−(v⊗v), where I is the n×n identity matrix, v is a unit vector, and ⊗ is the outer product. Householder matrices represent reflections about a hyperplane orthogonal to the unit vector v. In this parameterization the hyperplane is a two-dimensional subspace, rather than an n−1 dimensional subspace as is common in defining Householder matrices for the QR decomposition. Thus, a decomposition of a matrix into Givens rotations is equivalent to a decomposition of the matrix into Householder matrices.

Based on the aforementioned decomposition of an arbitrary unitary matrix into a restricted set of Givens rotations, any unitary matrix can be implemented by a particular sequence of rotations and phase shifts. And in photonics, rotations may be represented by variable beam splitters (VBS) and phase shifts are readily implemented using phase modulators. Accordingly, for the n optical inputs of the photonic processor 2-103, the first matrix implementation 2-301 and the third matrix implementation 2-305, representing the unitary matrices of the SVD of the matrix M may be implemented by an interconnected array of VBSs and phase shifters. Because of the parallel nature of passing optical pulses through a VBS array, matrix multiplication can be performed in O(1) time. The second matrix implementation 2-303 is a diagonal matrix of the SVD of the matrix M combined with the diagonal matrices D associated with each of the orthogonal matrices of the SVD. As mentioned above, each matrix D is referred to as a "phase screen" and can be labeled with a subscript to denote whether it is the phase screen associated with the matrix U or the matrix V. Thus, the second matrix implementation 303 is the matrix $\Sigma''=D_V \Sigma D_U$.

In some embodiments, the VBS unit cell of the photonic processor 2-103 associated with the first matrix implementation 2-301 and the third matrix implementation 2-305 may be a Mach-Zehnder interferometer (MZI) with an internal phase shifter. In other embodiments, the VBS unit cell may be a microelectromechanical systems (MEMS) actuator. An external phase shifter may be used in some embodiments to implement the additional phase needed for the Givens rotations.

The second matrix implementation 2-303, representing the diagonal matrix $D_V \Sigma D_U$ may be implemented using an amplitude modulator and a phase shifter. In some embodiments, a VBS may be used to split off a portion of light that can be dumped to variably attenuate an optical pulse. Additionally or alternatively, a controllable gain medium may be used to amplify an optical signal. For example, GaAs, InGaAs, GaN, or InP may be used as an active gain medium for amplifying an optical signal. Other active gain processes such as the second harmonic generation in materials with crystal inversion symmetric, e.g. KTP and lithium niobate, and the four-wave mixing processes in materials that lack inversion symmetry, e.g. silicon, can also be used. A phase shifter in each optical mode may be used to apply either a zero or a $\pi$ phase shift, depending on the phase screen being implemented. In some embodiments, only a single phase shifter for each optical mode is used rather than one phase shifter for each phase screen. This is possible because each of the matrices $D_V$, $\Sigma$, and $D_U$ are diagonal and therefore commute. Thus, the value of each phase shifter of the second matrix implementation 2-303 of the photonic processor 2-103 is the result of the product of the two phase screens: $D_V D_U$.

Figures 1, 2, 3, 4, 4A:
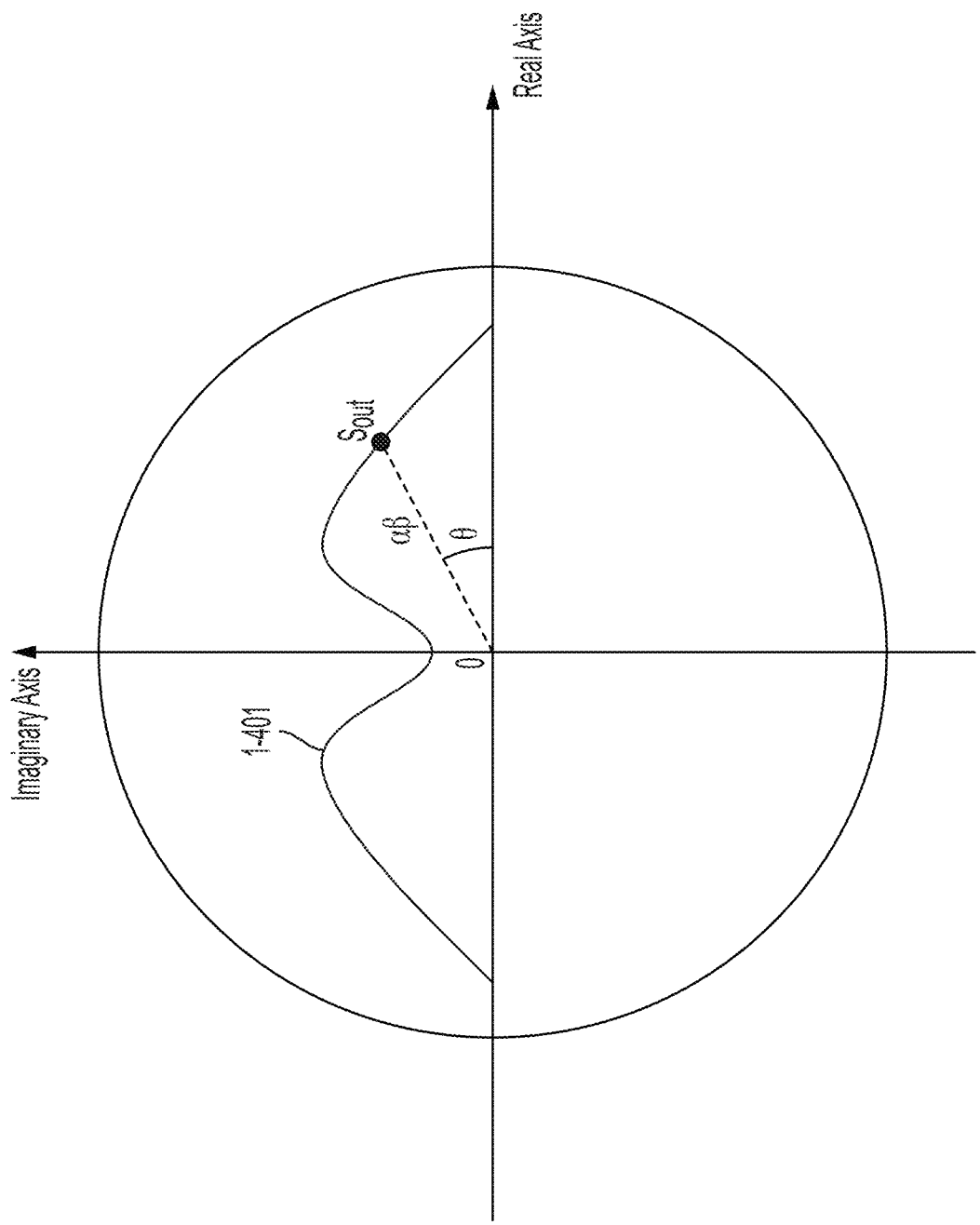
Figures 1, 2, 3, 4, 4B:
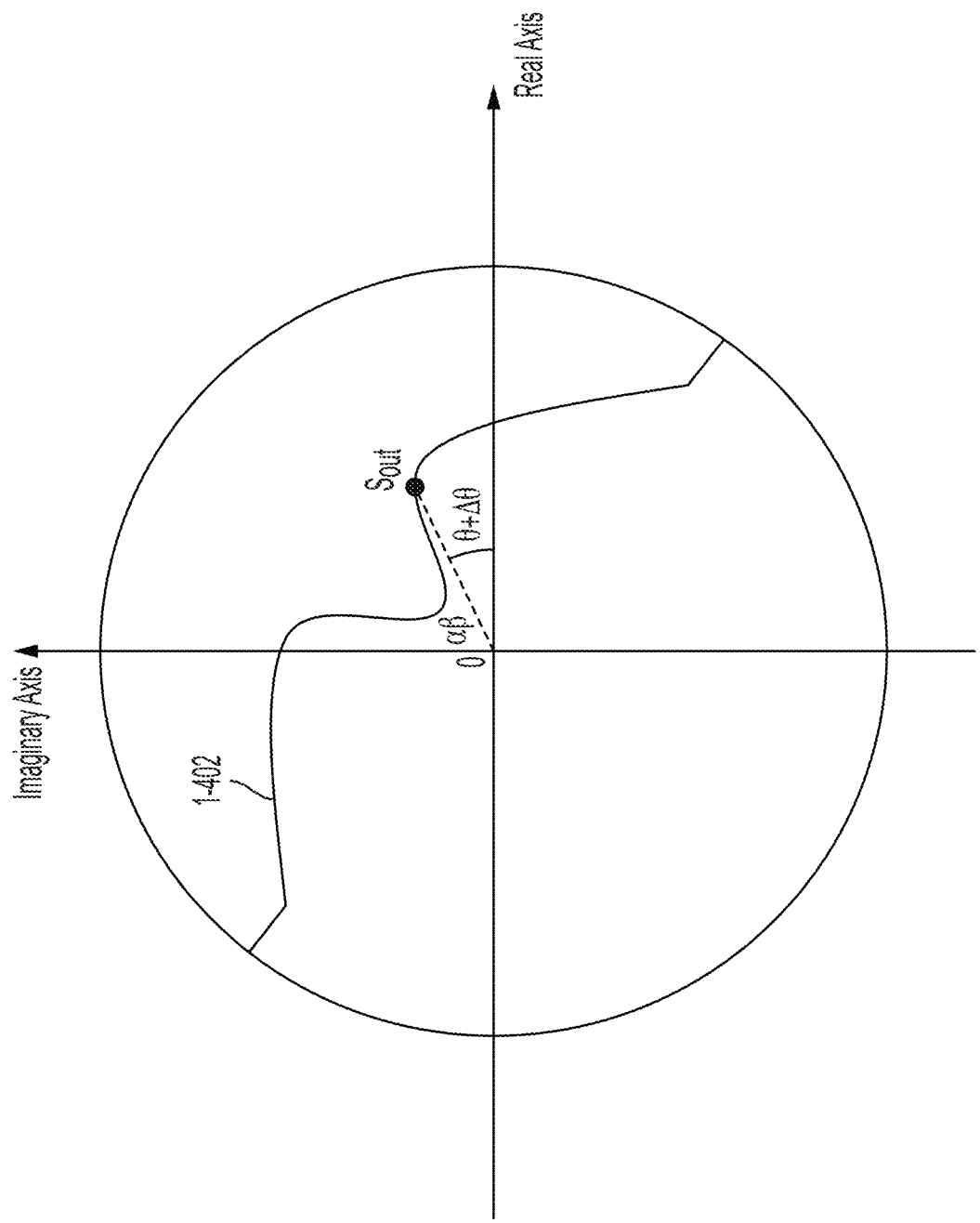
Figures 1, 2, 3, 4, 4C:
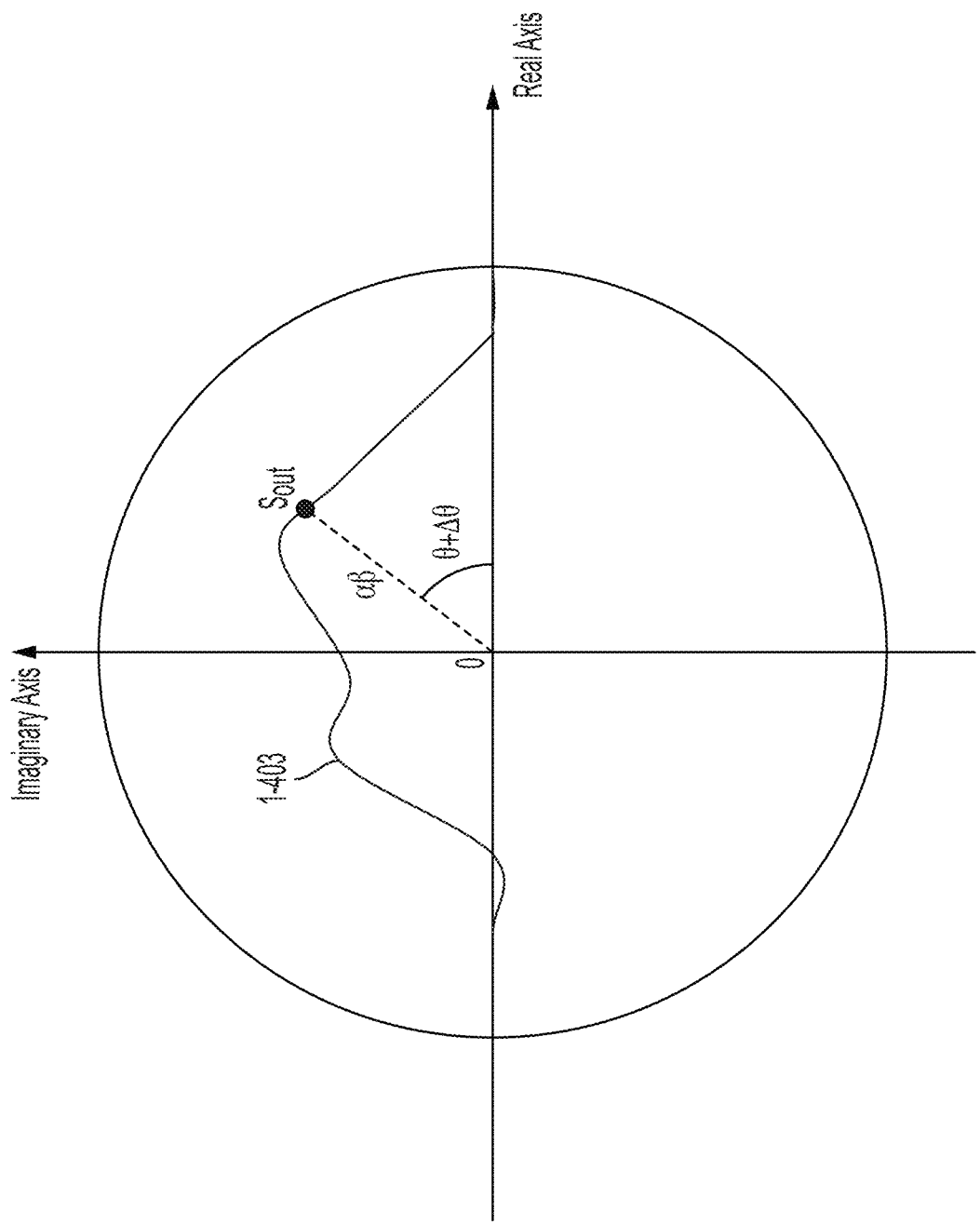
Figures 1, 2, 3, 4, 5:
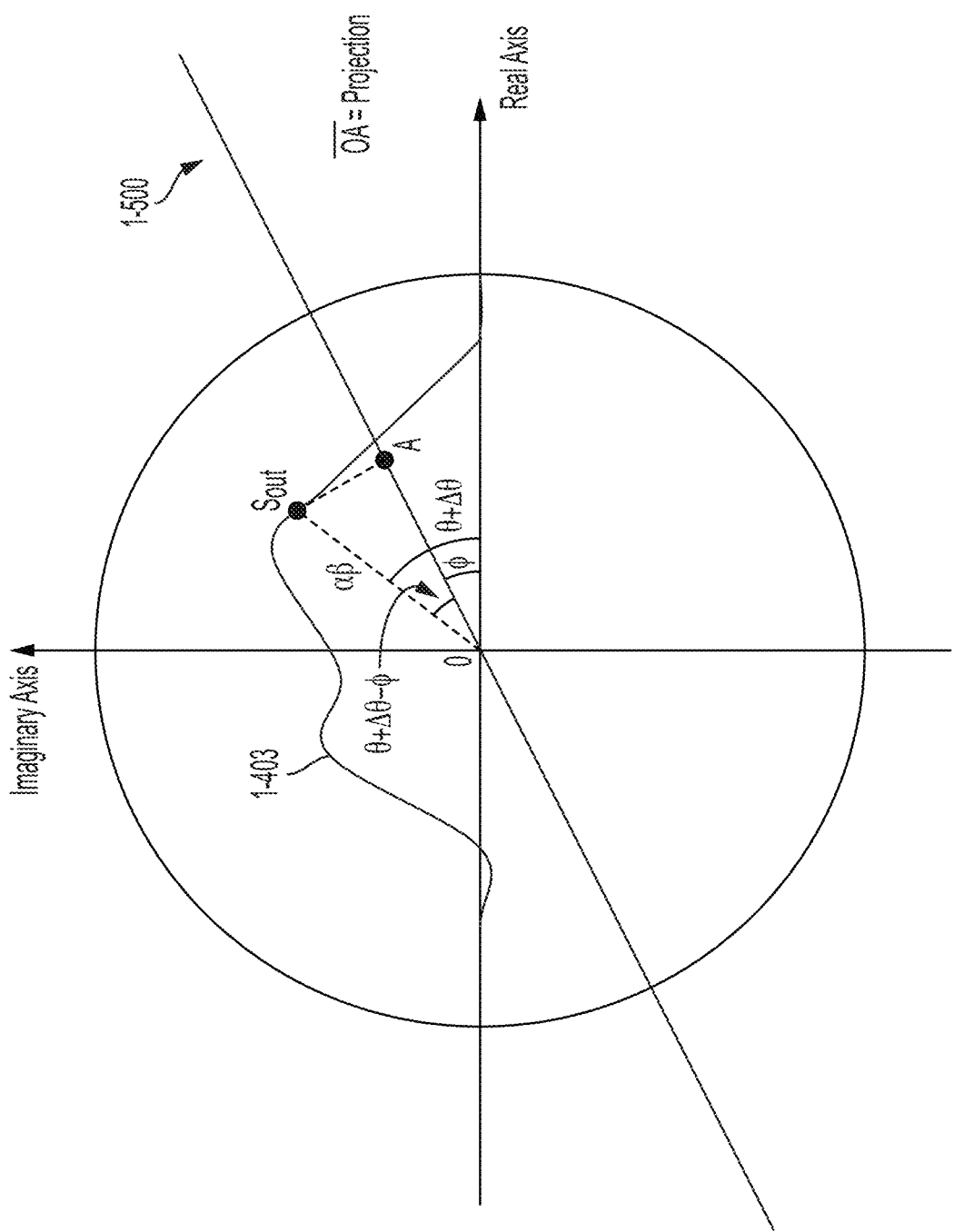
Figures 1, 2, 3, 4, 5, 6, 7:
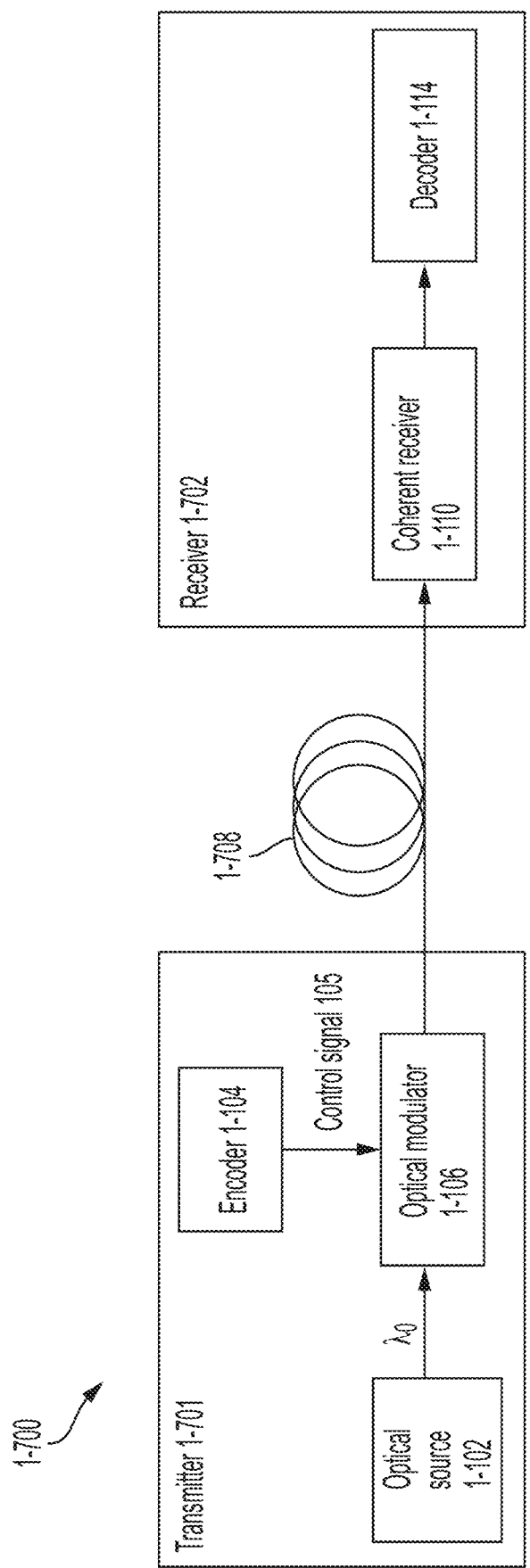
Figures 1, 2, 3, 4, 5, 6, 7, 8:
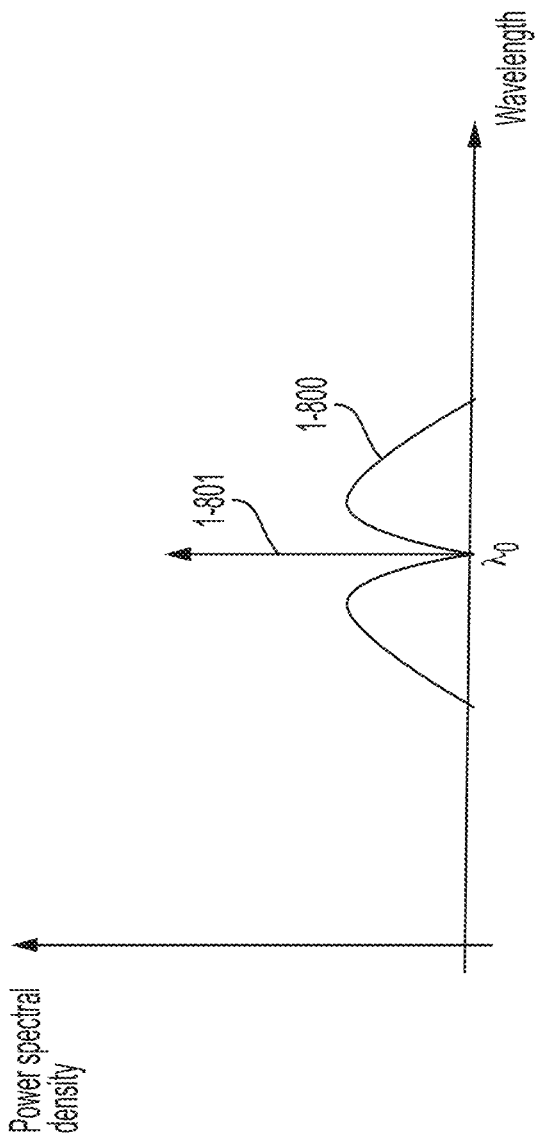
Figures 1, 2, 3, 4, 5, 6, 7, 8, 9:
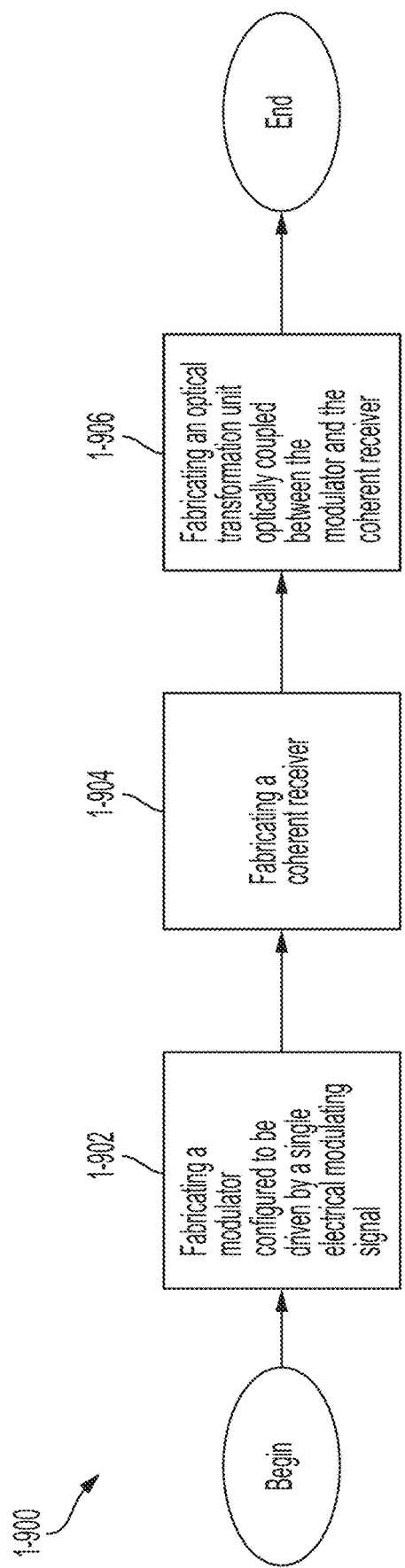
Figures 1, 2:
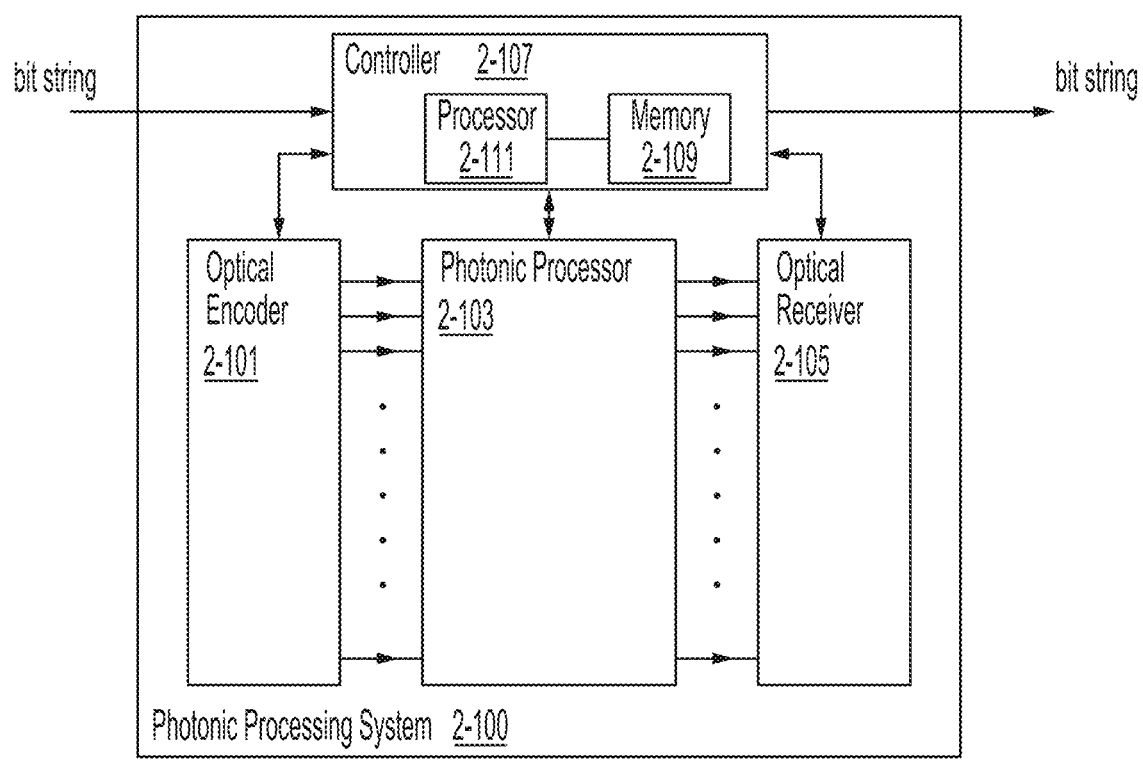
Figure 2:
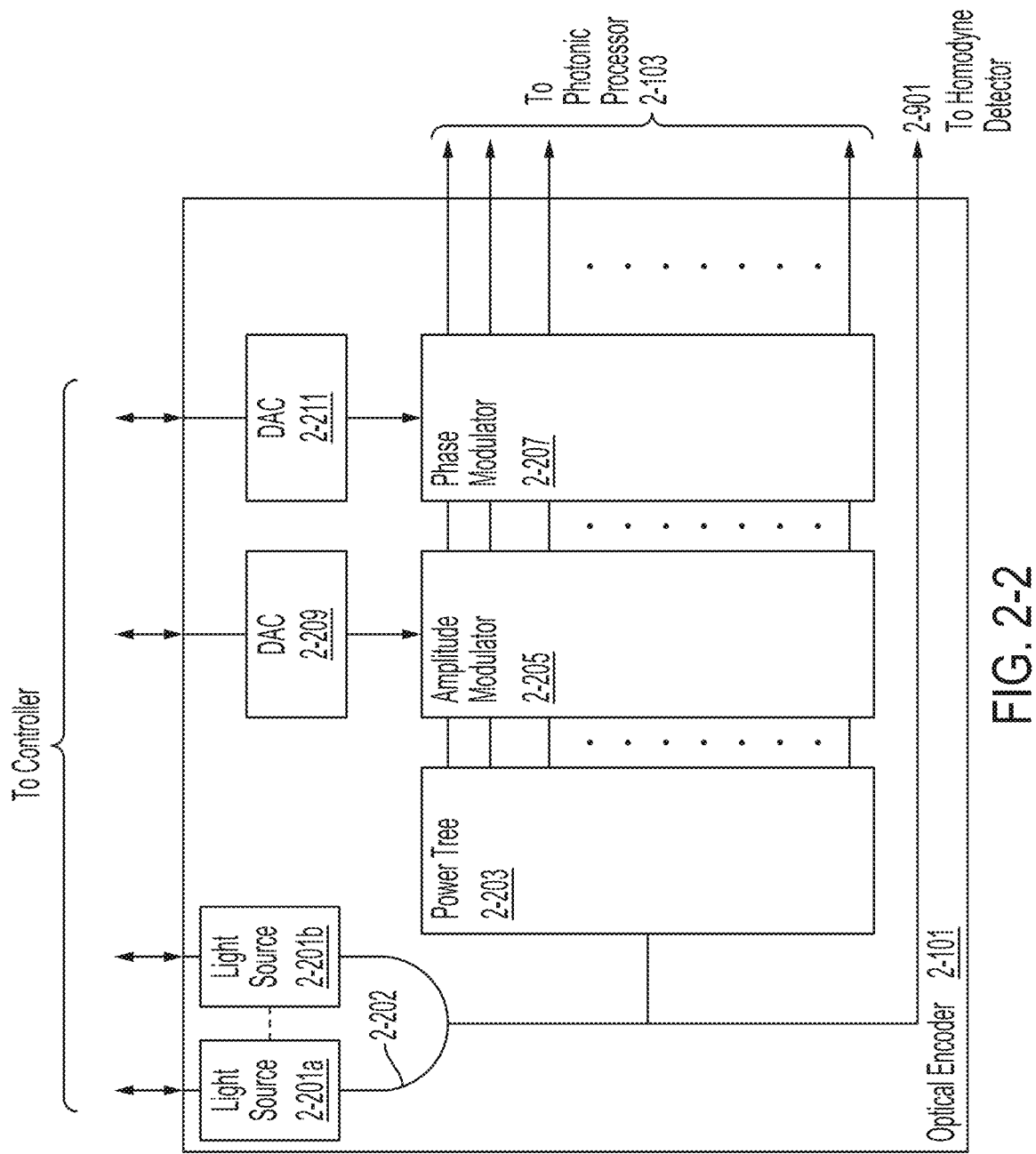
Figures 2, 3:
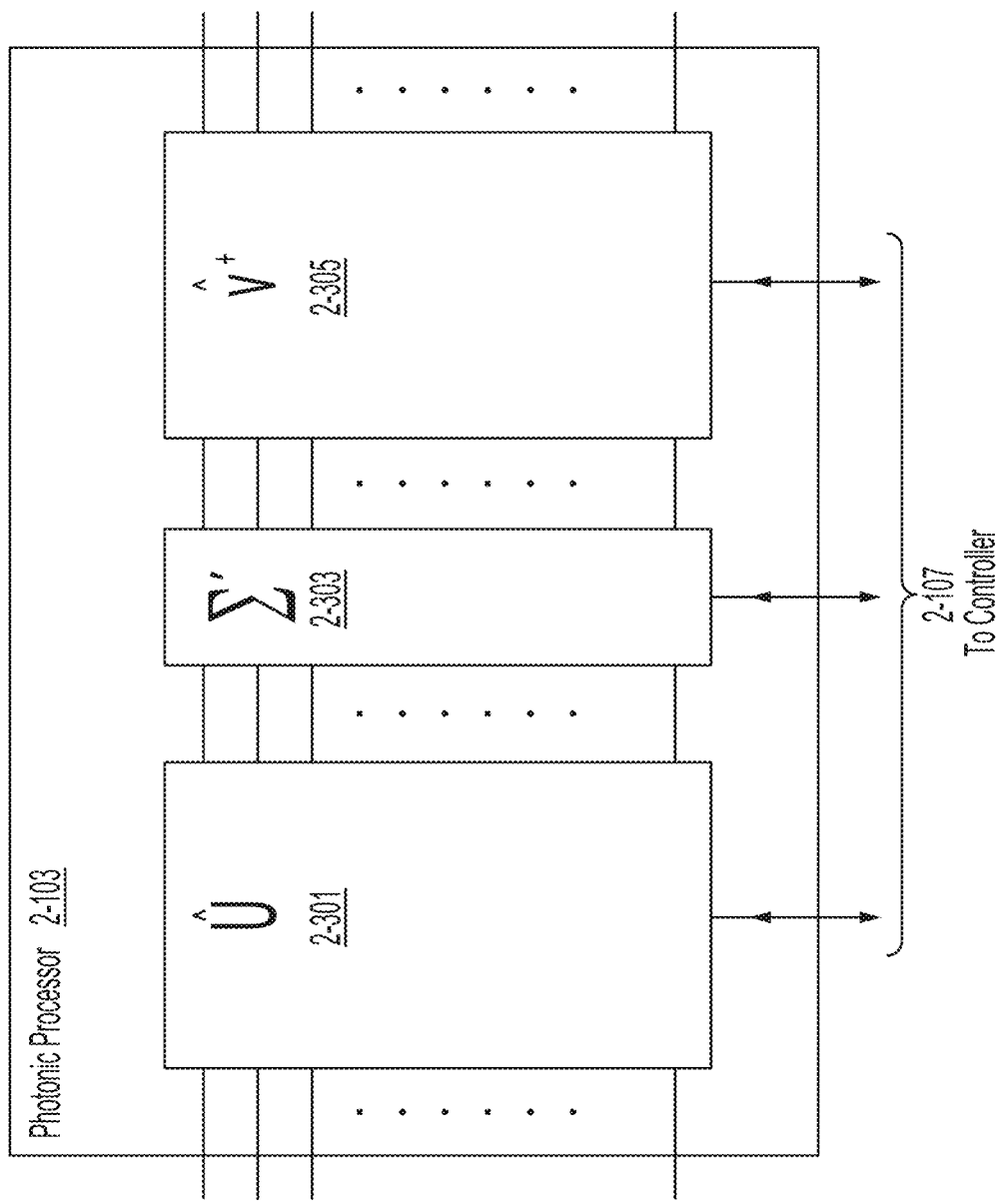
Figures 2, 3, 4:
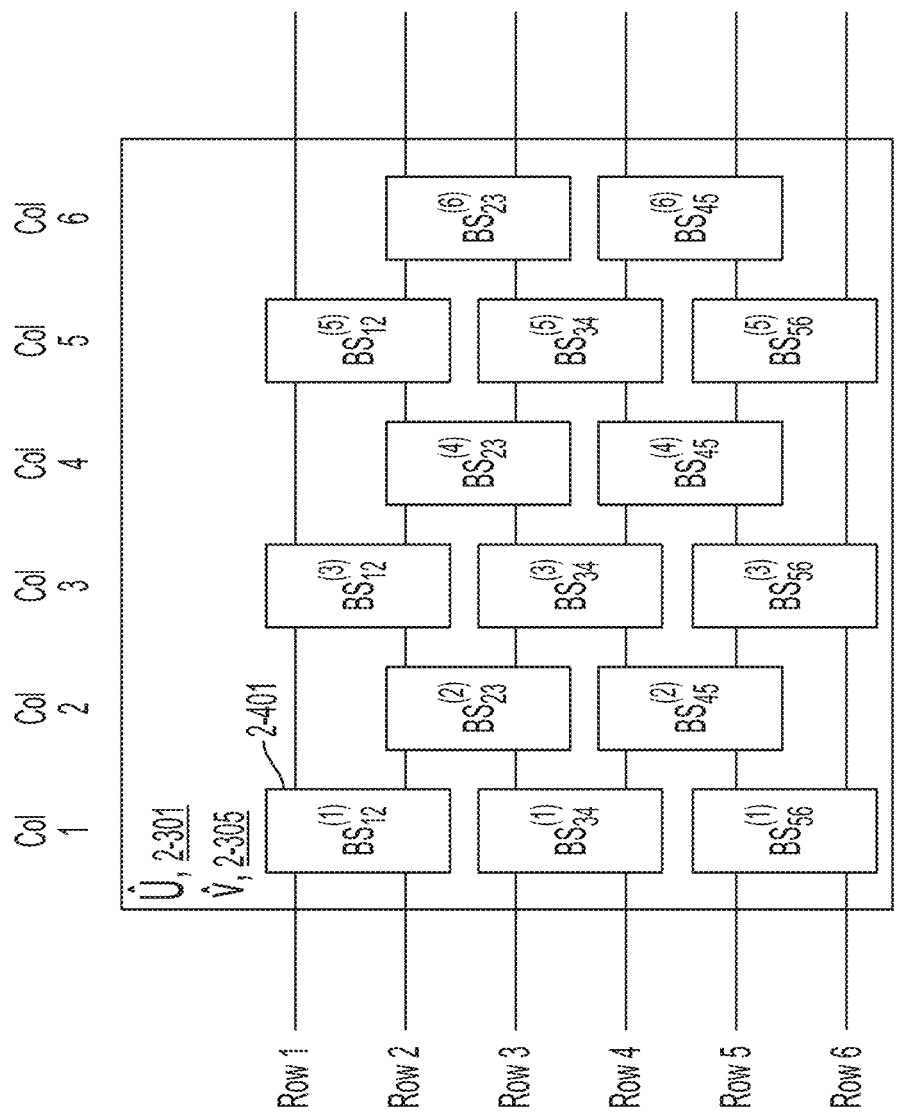
Figures 2, 3, 4, 5:
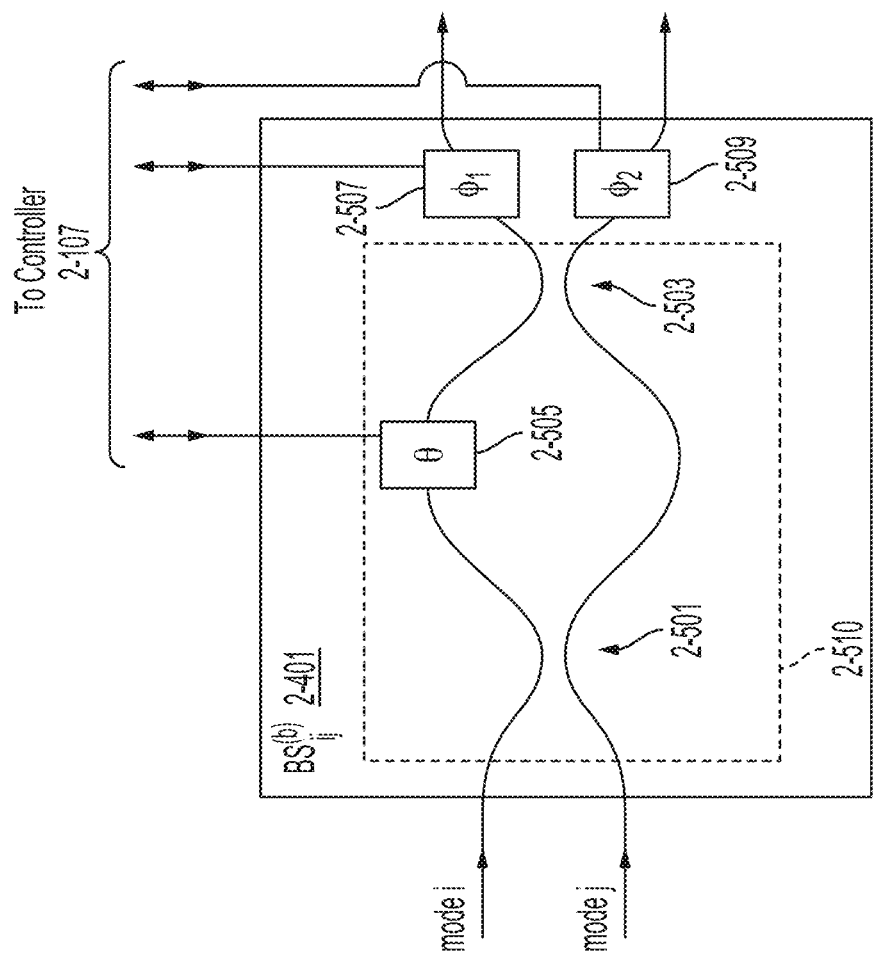
Figures 2, 3, 4, 5, 6, 7:
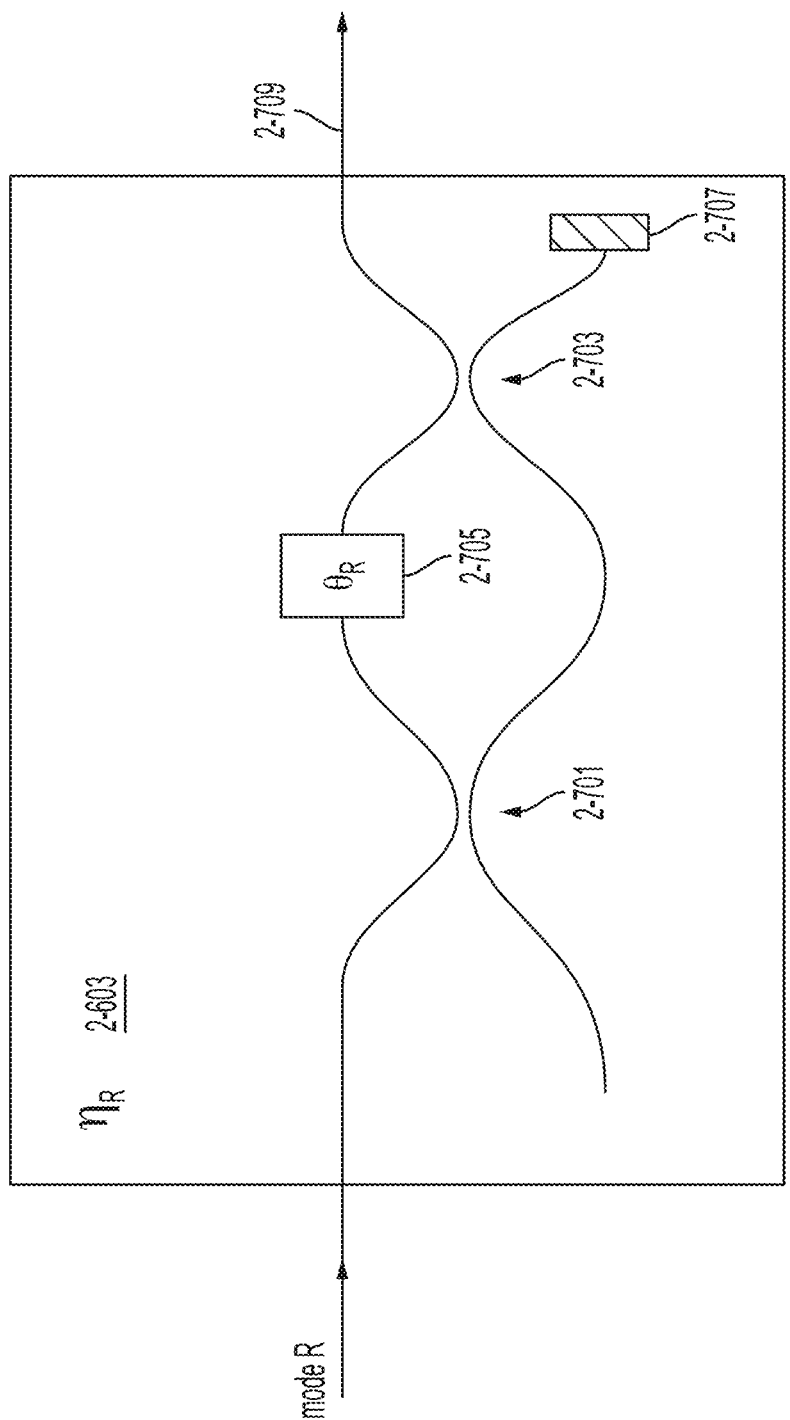
Figures 2, 3, 4, 5, 6, 7, 8:
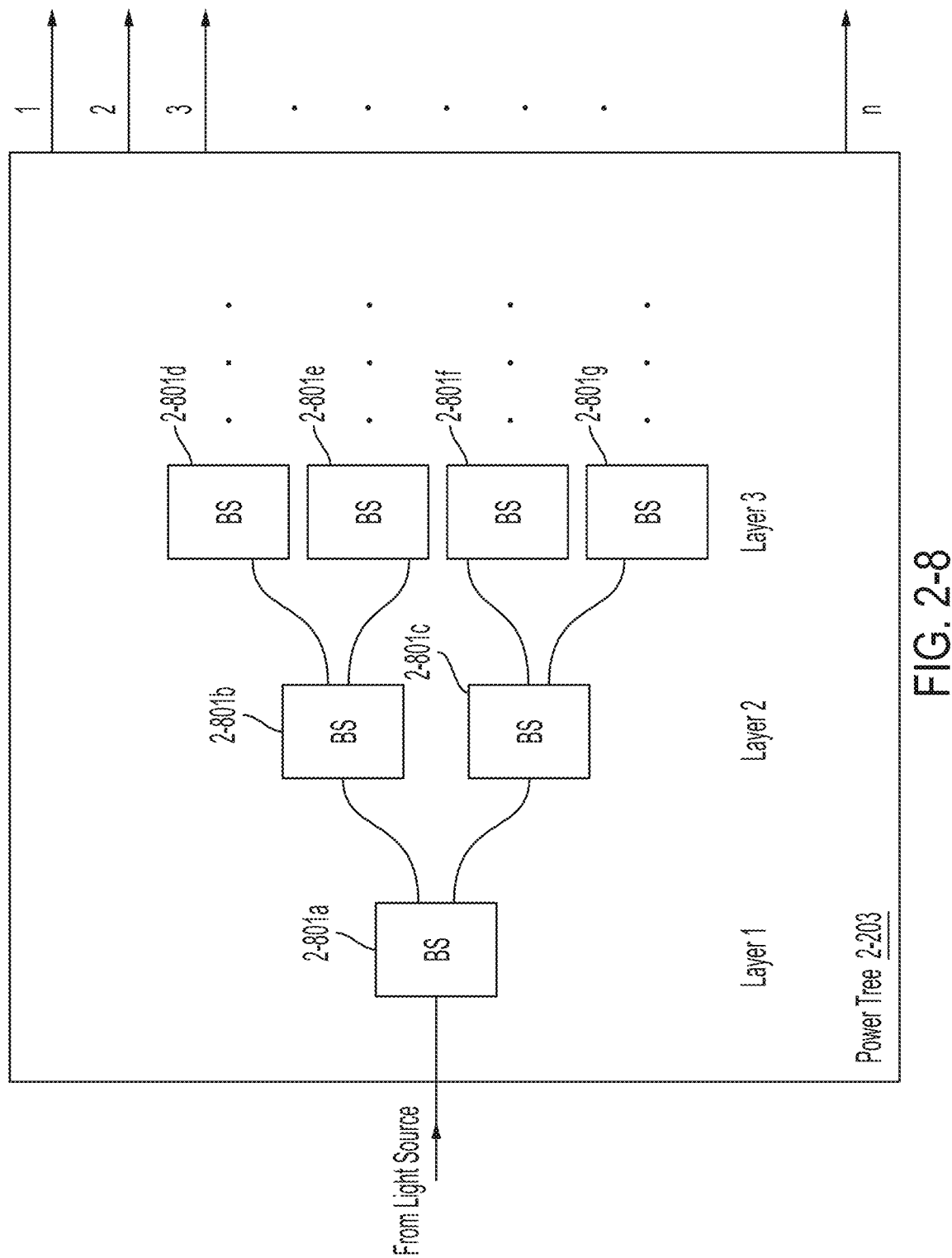
Figures 2, 3, 4, 5, 6, 7, 8, 9:
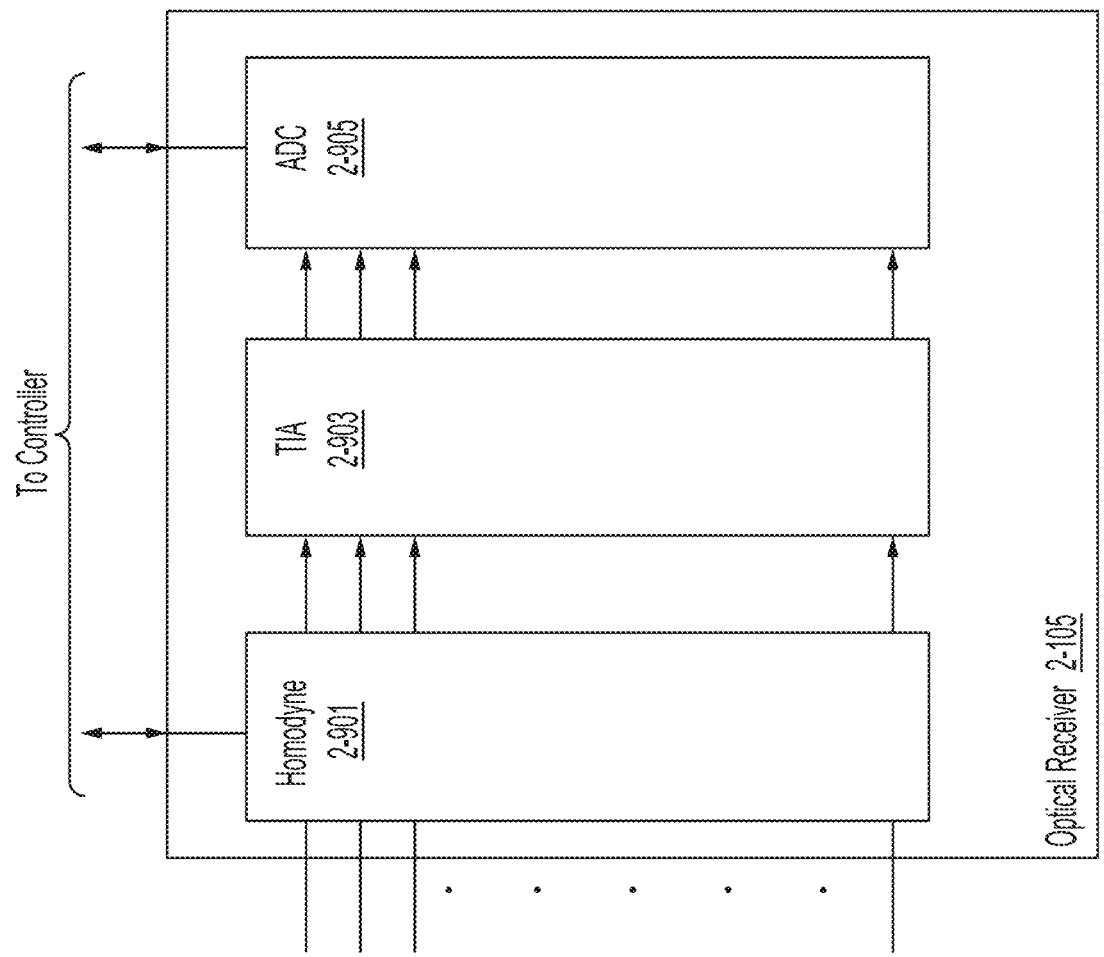
Figures 2, 3, 4, 5, 6, 7, 8, 9, 10:
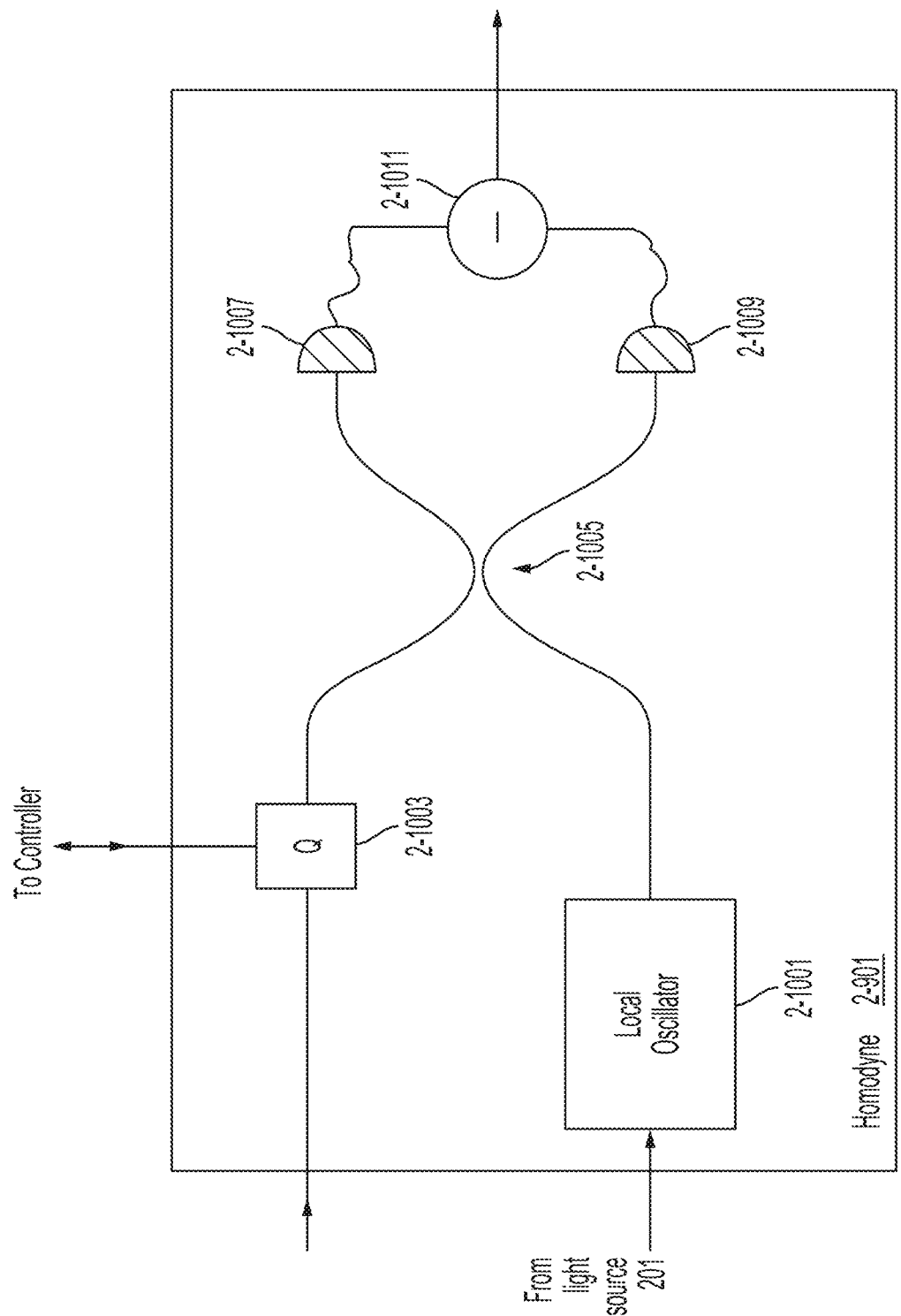
Figures 2, 3, 4, 5, 6, 7, 8, 9, 10, 11:
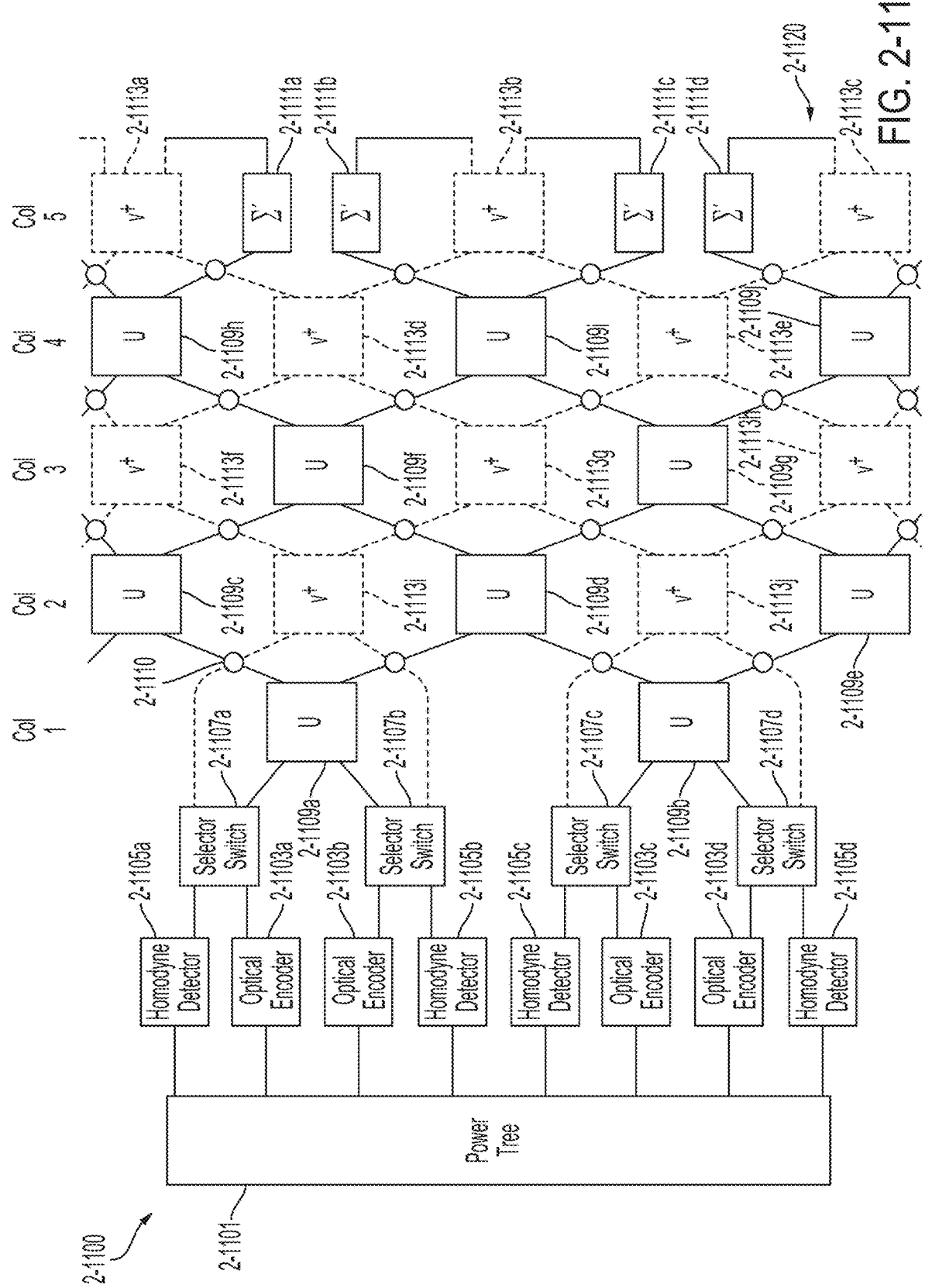
Figures 2, 3, 4, 5, 6, 7, 8, 9, 10, 11, 12, 12A:
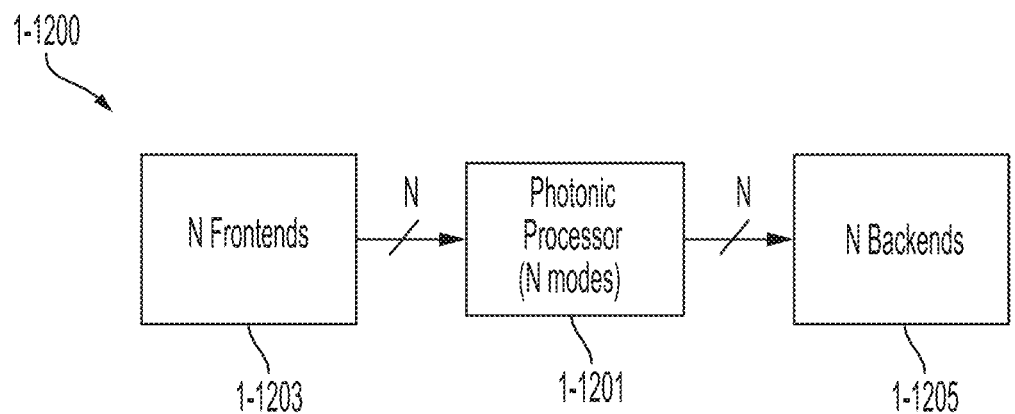
Figures 2, 3, 4, 5, 6, 7, 8, 9, 10, 11, 12, 12B:
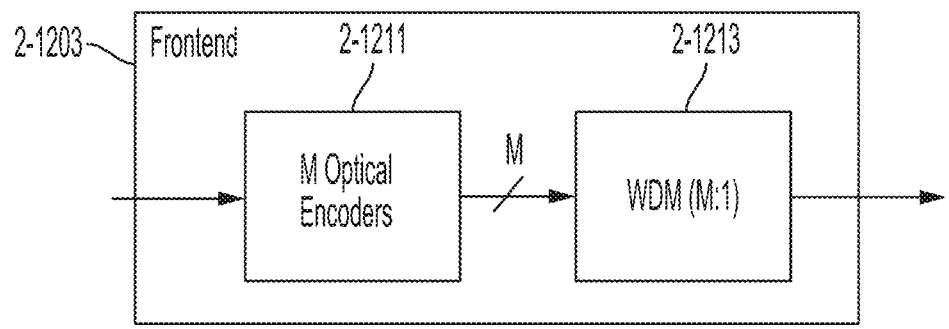
Figures 2, 3, 4, 5, 6, 7, 8, 9, 10, 11, 12, 12C:
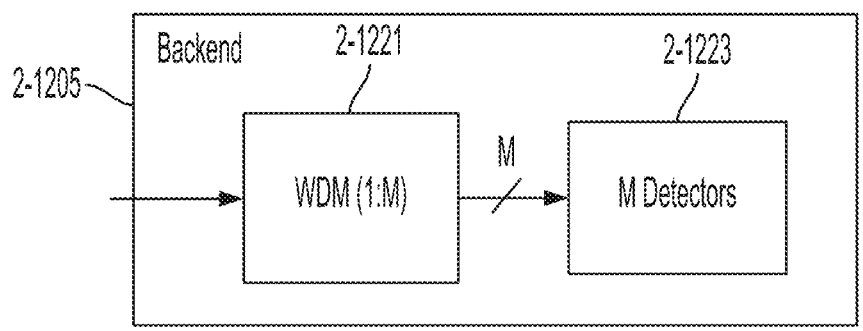
Figures 2, 3, 4, 5, 6, 7, 8, 9, 10, 11, 12, 13:
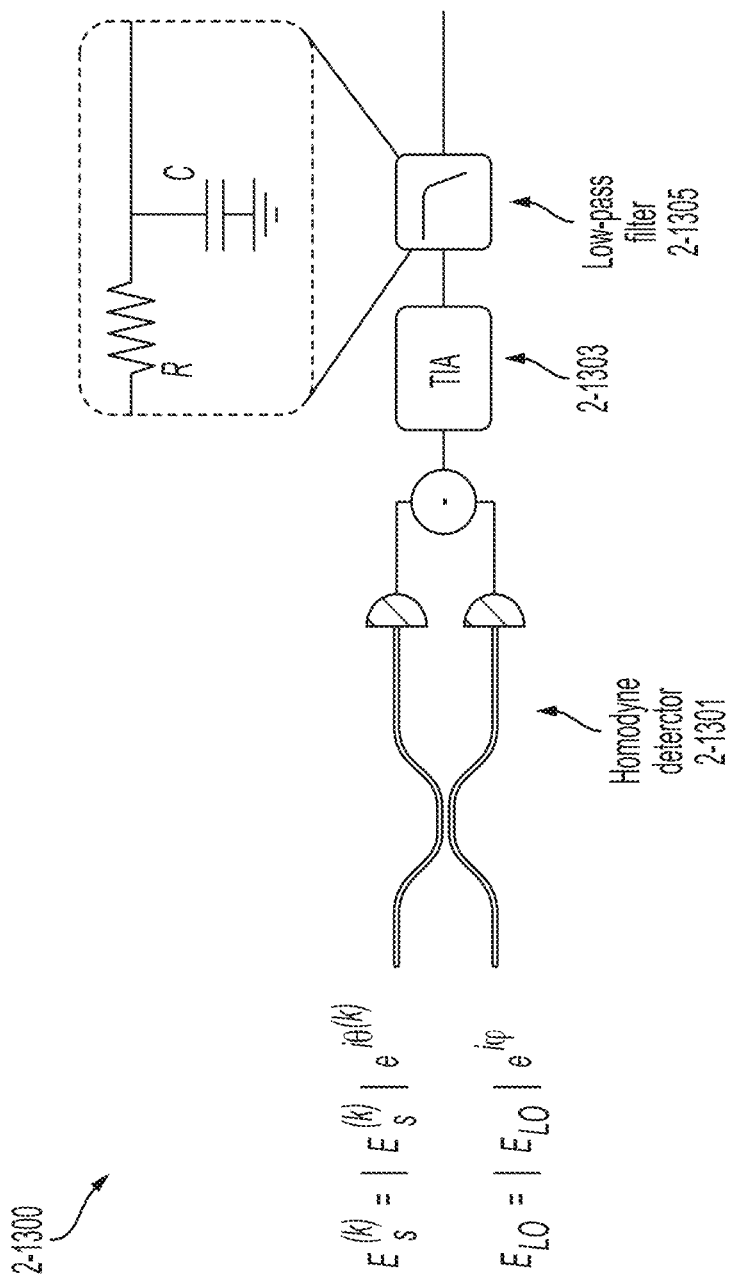
Figures 2, 3, 4, 5, 6, 7, 8, 9, 10, 11, 12, 13, 14:
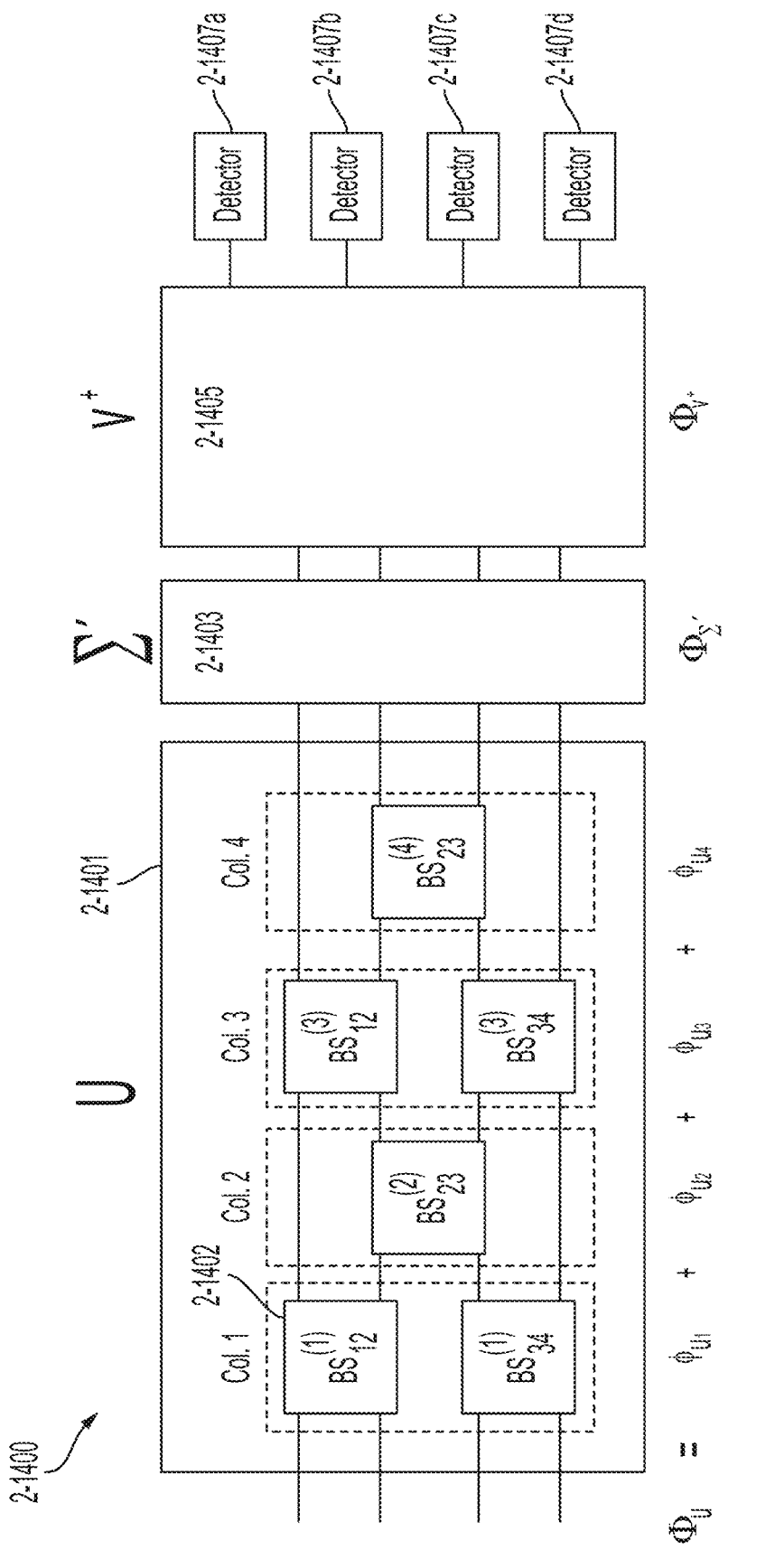
Figures 2, 3, 4, 5, 6, 7, 8, 9, 10, 11, 12, 13, 14, 15:
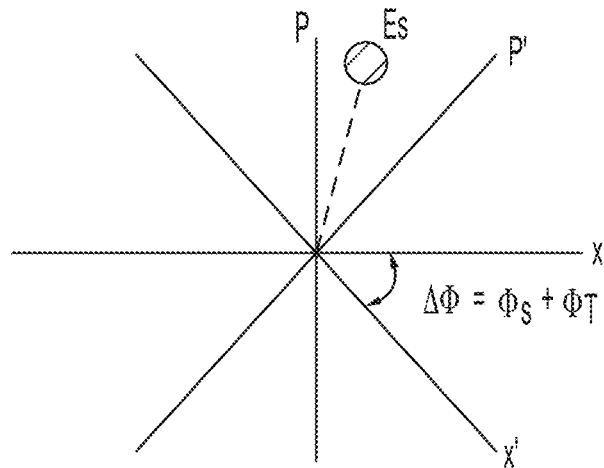
Figures 2, 3, 4, 5, 6, 7, 8, 9, 10, 11, 12, 13, 14, 15, 16:
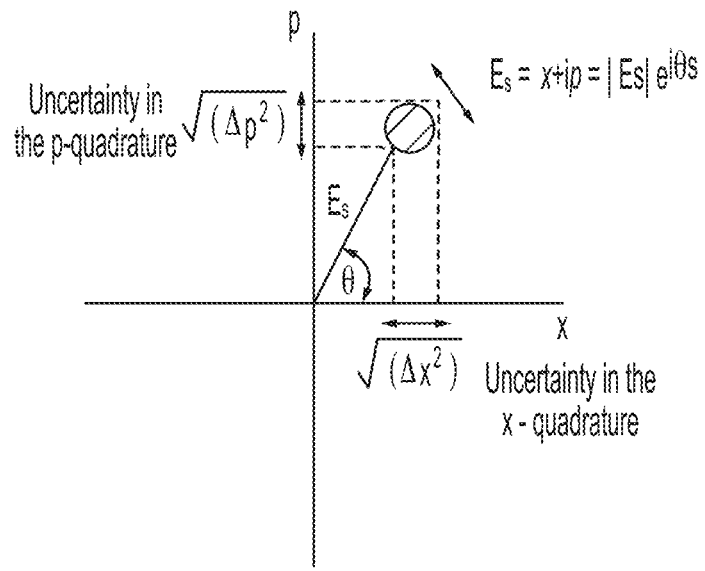
Figures 2, 3, 4, 5, 6, 7, 8, 9, 10, 11, 12, 13, 14, 15, 16, 17:
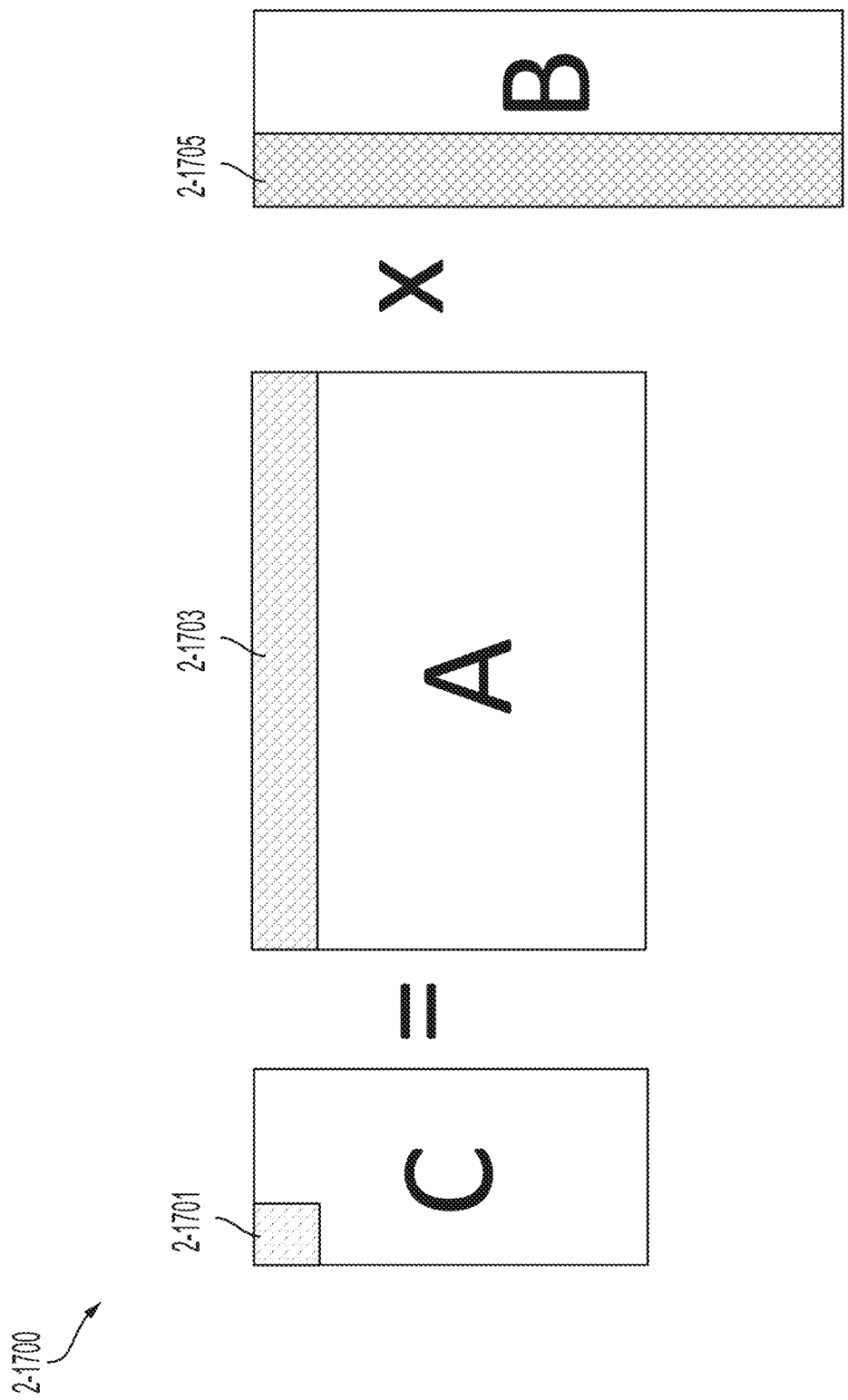
Figures 2, 3, 4, 5, 6, 7, 8, 9, 10, 11, 12, 13, 14, 15, 16, 17, 18:
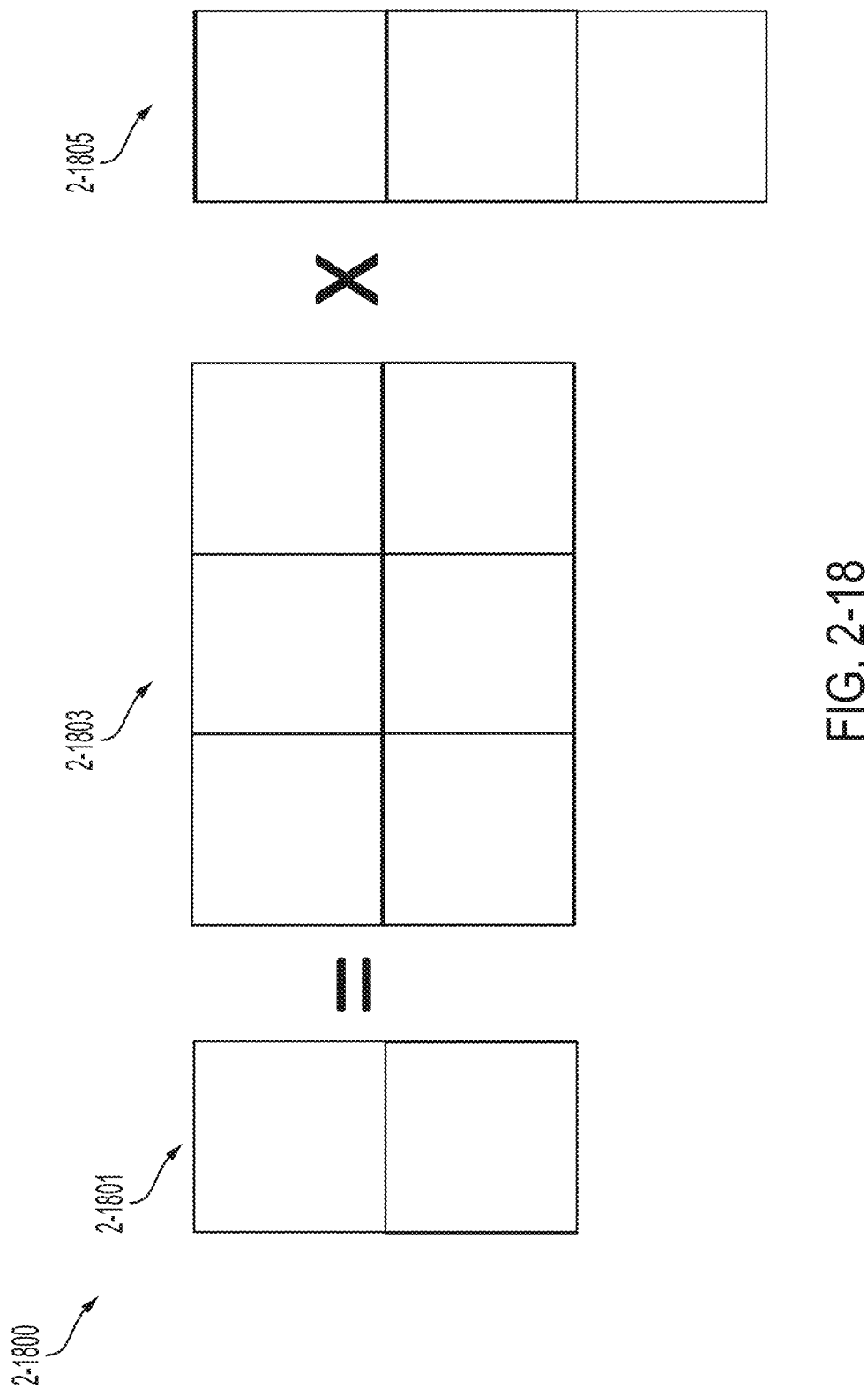
Figures 2, 3, 4, 5, 6, 7, 8, 9, 10, 11, 12, 13, 14, 15, 16, 17, 18, 19:
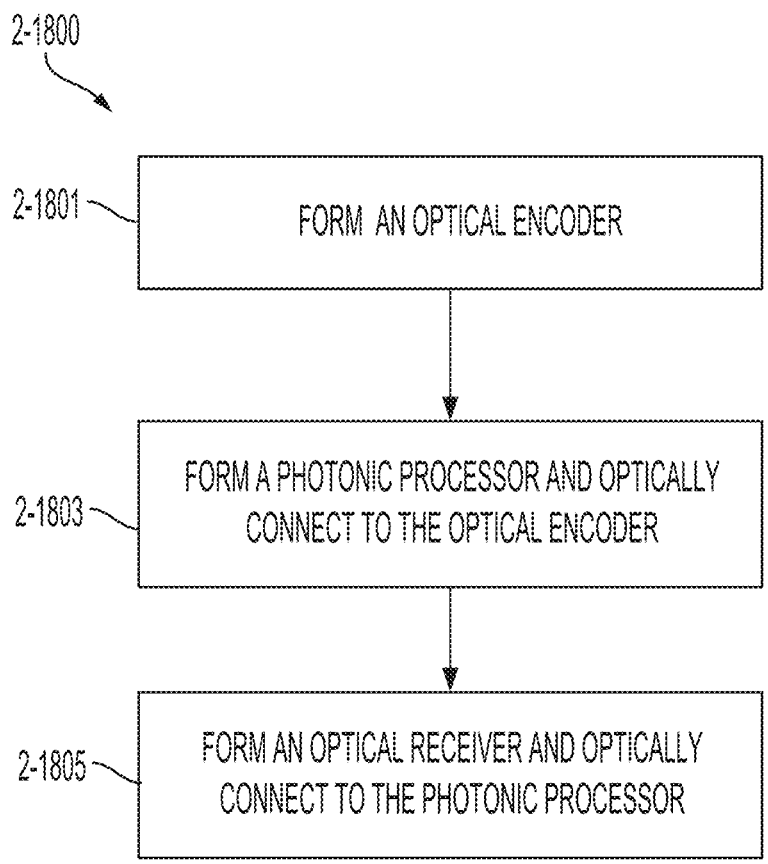
Figures 2, 3, 4, 5, 6, 7, 8, 9, 10, 11, 12, 13, 14, 15, 16, 17, 18, 19, 20:
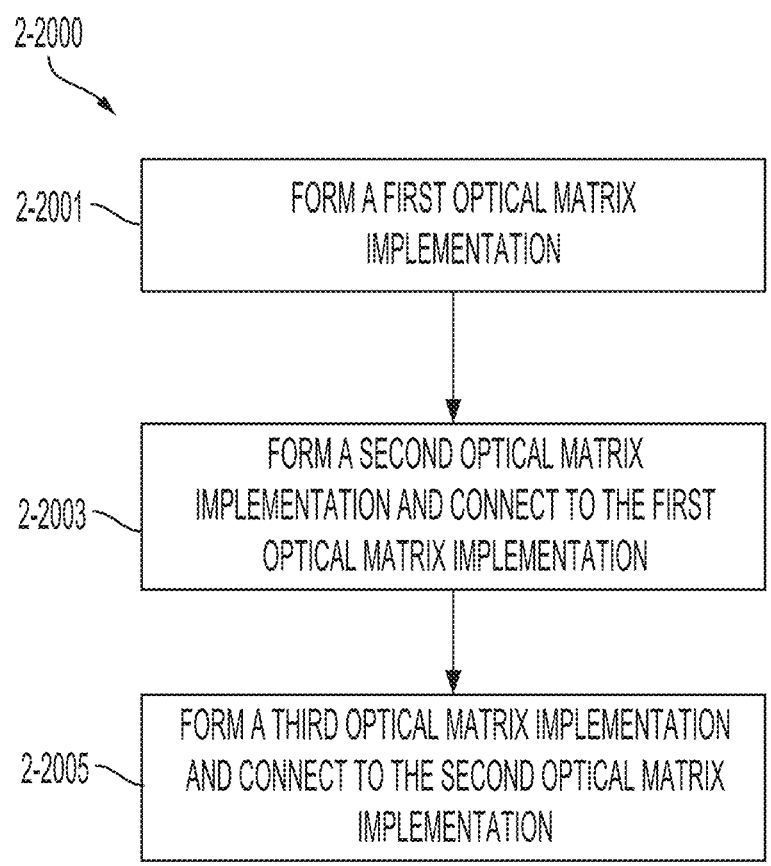
Figures 2, 3, 4, 5, 6, 7, 8, 9, 10, 11, 12, 13, 14, 15, 16, 17, 18, 19, 20, 21:
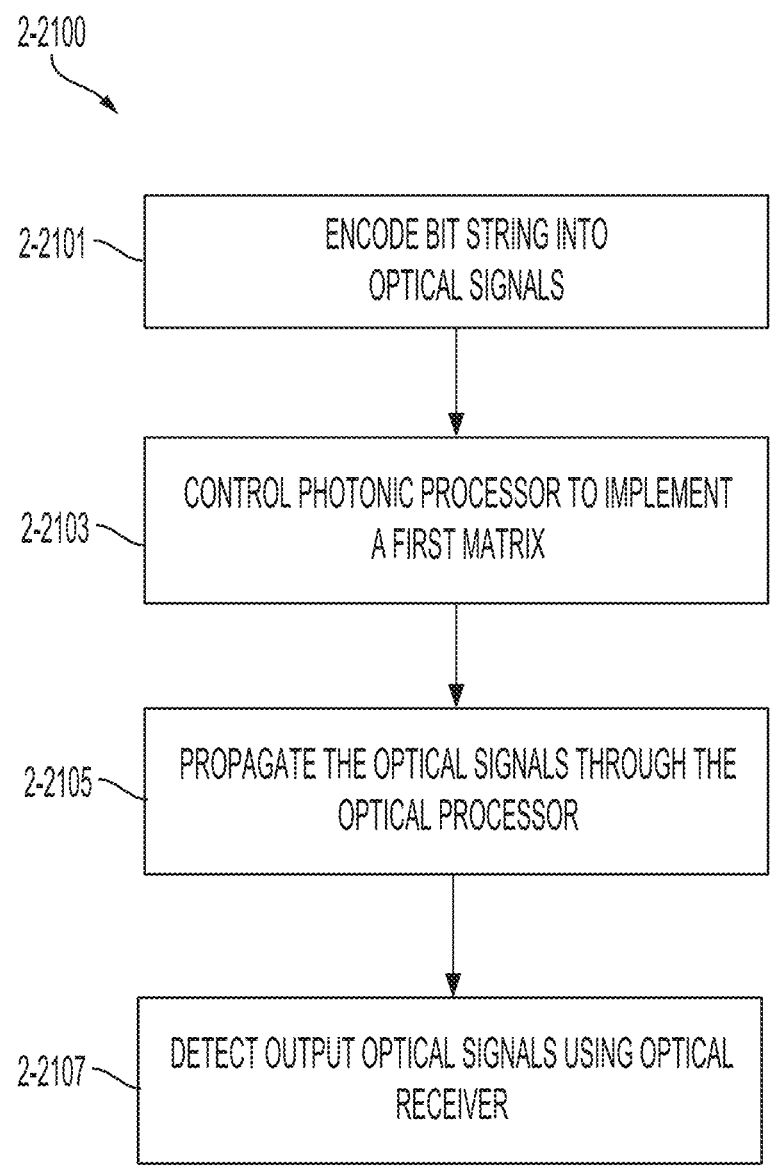

Referring to FIG. 2-4, the first and third matrix implementation 2-301 and 2-305 are implemented as an array of VBSs 2-401, according to some embodiments. For the sake of simplicity, only n=6 input optical pulses (the number of rows) are illustrated resulting in a "circuit depth" (e.g., the number of columns) equal to the number of input optical pulses (e.g., six). For the sake of clarity, only a single VBS 2-401 is labeled with a reference numeral. The VBS are labeled, however, with subscripts that identify which optical modes are being mixed by a particular VBS and a super script labeling the associated column. Each VBS 2-401 implements a complex Givens rotation, $T(i,j,\theta,\phi)$, as discussed above, where i and j are equivalent to the subscript labels of the VBSs 2-401, $\theta$ is the rotation angle of the Givens rotation, and $\phi$ is the additional phase associated with the generalized rotation.

Referring to FIG. 2-5, each VBS 2-401 may be implemented using a MZI 2-510 and at least one external phase shifter 2-507. In some embodiments, a second external phase shifter 2-509 may also be included. The MZI 2-510 includes a first evanescent coupler 2-501 and a second evanescent coupler 2-503 for mixing the two input modes of the MZI 2-510. An internal phase shifter 2-505 modulates the phase $\theta$ in one arm of the MZI 2-510 to create a phase difference between the two arms. Adjusting the phase $\theta$ causes the intensity of light output by the VBS 2-401 to vary from one output mode of the MZI 2-510 to the other thereby creating a beam splitter that is controllable and variable. In some embodiments, a second internal phase shifter can be applied on the second arm. In this case, it is the difference between the two internal phase shifters that cause the output light intensity to vary. The average between the two internal phases will impart a global phase to the light that enter mode i and mode j. Thus the two parameters $\theta$ and $\phi$ may each be controlled by a phase shifter. In some embodiments, the second external phase shifter 2-509 may be used to correct for an unwanted differential phase across the output modes of the VBS due to static phase disorder.

In some embodiments, the phase shifters 2-505, 2-507 and 2-509 may include a thermo-optic, electro-optic, or optomechanic phase modulator. In other embodiments, rather than including an internal phase modulator 505 within an MZI 510, a NOEMS modulator may be used.

In some embodiments, the number of VBSs grows with the size of the matrix. The inventors have recognized and appreciated that controlling a large number of VBSs can be challenging and there is a benefit to sharing a single control circuit among multiple VBSs. An example of a parallel control circuit that may be used to control multiple VBSs is a digital-to-analog converter receives as an input a digital string that encodes the analog signal to be imparted on a specific VBS. In some embodiments, the circuit also receives a second input the address of the VBS that is to be controlled. The circuit may then impart analog signals on the addressed VBS. In other embodiments, the control circuit may automatically scan through a number of VBSs and impart analog signals on the multiple VBSs without being actively given an address. In this case, the addressing sequence is predefined such that it traverses the VBS array in known order.

Referring to FIG. 2-6, the second matrix implementation 2-303 implements multiplication by the diagonal matrix $\Sigma'=D_V \Sigma D_U$. This may be accomplished using two phase shifters 2-601 and 2-605 to implement the two phase screens and an amplitude modulator 2-603 to adjust the intensity of an associate optical pulse by an amount $\eta$. As mentioned above, in some embodiments only a single phase modulator 2-601 may be used, as the two phase screens can be combined together since the three constituent matrices that form $\Sigma'$ are diagonal and therefore commute.

In some embodiments, the amplitude modulators 2-603 may be implemented using an attenuator and/or an amplifier. If the value of the amplitude modulation $\eta$ is greater than one, the optical pulse is amplified. If the value of the amplitude modulation $\eta$ is less than one, the optical pulse is attenuated. In some embodiments, only attenuation is used. In some embodiments, the attenuation may be implemented by a column of integrated attenuators. In other embodiments, as illustrated in FIG. 2-7, the attenuation 2-603 may be implemented using a MZI that includes two evanescent couplers 2-701 and 2-703 and a controllable internal phase shifter 2-705 to adjust how much of the input light is transmitted from the input of the MZI to a first output port 2-709 of the MZI. A second output port 2-707 of the MZI may be ignored, blocked or dumped.

In some embodiments, the controller 2-107 controls the value of each phase shifter in the photonic processor 2-103. Each phase shifter discussed above may include a DAC similar to the DACs discussed in connection with the phase modulator 2-207 of the optical encoder 2-101.

The photonic processor 2-103 can include any number of input nodes, but the size and complexity of the interconnected VBS arrays 2-301 and 2-305 will increase as the number of input modes increases. For example, if there are n input optical modes, then the photonic processor 2-103 will have a circuit depth of 2n+1, where the first matrix implementation 2-301 and the second matrix implementation 2-305 each has a circuit depth n and the second matrix implementation 2-303 has a circuit depth of one. Importantly, the complexity in time of performing a single matrix multiplication is not even linear with the number of input optical pulses—it is always O(1). In some embodiments, this low order complexity afforded by the parallelization results in energy and time efficiencies that cannot be obtained using conventional electrical processors.

It is noted that, while embodiments described herein illustrate the photonic processor 2-103 as having n inputs and n outputs, in some embodiments, the matrix M implemented by the photonic processor 2-103 may not be a square matrix. In such embodiments, the photonic processor 2-103 may have a different number of outputs and inputs.

It is also noted that, due to the topology of the interconnections of the VBSs within the first and second matrix implementations 2-301 and 2-305, it is possible to subdivide the photonic processor 2-103 into non-interacting subsets of rows such that more than one matrix multiplication can be performed at the same time. For example, in the VBS array illustrated in FIG. 2-4, if each VBS 2-401 that couples optical modes 3 and 4 is set such that optical modes 3 and 4 do not couple at all (e.g., as if the VBSs 2-401 with subscript "34" were absent from FIG. 2-4) then the top three optical modes would operate completely independently from the bottom three optical modes. Such a subdivision may be done at a much larger scale with a photonic processor with a larger number of input optical modes. For example, an n=64 photonic processor may multiply eight eight-component input vectors by a respective 8×8 matrix simultaneously (each of the 8×8 matrices being separately programmable and controllable). Moreover, the photonic processor 2-103 need not be subdivided evenly. For example, an n=64 photonic processor may subdivide into seven different input vectors with 20, 13, 11, 8, 6, 4, and 2 components, respectively, each multiplied by a respective matrix simultaneously. It should be understood that the above numerical examples are for illustration purposes only and any number of subdivisions is possible.

Additionally, while the photonic processor 2-103 performs vector-matrix multiplication, where a vector is multiplied by a matrix by passing the optical signals through the array of VBSs, the photonic processor 2-103 may also be used to perform matrix-matrix multiplication. For example, multiple input vectors may be passed through the photonic processor 2-103, one after the other, one input vector at a time, where each input vector represents a column of an input matrix. After optically computing each of the individual vector-matrix multiplications (each multiplication resulting in an output vector that corresponds to a column of an output column of the resulting matrix), the results may be combined digitally to form the output matrix resulting from the matrix-matrix multiplication.

V. Optical Receiver

The photonic processor 2-103 outputs n optical pulses that are transmitted to the optical receiver 2-105. The optical receiver 2-105 receives the optical pulses and generates an electrical signal based on the received optical signals. In some embodiments, the amplitude and phase of each optical pulse is determined. In some embodiments, this is achieved using homodyne or heterodyne detection schemes. In other embodiments, simple phase-insensitive photodetection may be performed using conventional photodiodes.

Referring to FIG. 2-9, the optical receiver 2-105 includes a homodyne detector 2-901, a transimpedance amplifier 2-903 and an analog-to-digital converter (ADC) 2-905, according to some embodiments. While the components are shown as one element for all optical modes in FIG. 2-9, this is for the sake of simplicity. Each optical mode may have a dedicated homodyne detector 2-901, a dedicated transimpedance amplifier 2-903 and a dedicated ADC 2-905. In some embodiments, a transimpedance amplifier 2-903 may not be used. Instead, any other suitable electronic circuit that converts a current to a voltage may be used.

Referring to FIG. 2-10, the homodyne detector 2-903 includes a local oscillator (LO) 2-1001, a quadrature controller 2-1003, a beam splitter 2-1005 and two detectors 2-1007 and 2-1009, according to some embodiments. The homodyne detector 2-903 outputs an electrical current that is based on the difference between the current output by the first detector 2-1007 and the second detector 2-1009.

The local oscillator 2-1001 is combined with the input optical pulse at the beam splitter 2-1005. In some embodiments, a portion of the light source 2-201 is transmitted via an optical waveguide and/or an optical fiber to the homodyne detector 2-901. The light from the light source 2-201 may itself be used as the local oscillator 2-1001 or, in other embodiments, the local oscillator 2-1001 may be a separate light source that uses the light from the light source 2-201 to generate a phase matched optical pulse. In some embodiments, an MZI may replace the beam splitter 2-1005 such that adjustments can be made between the signal and the local oscillator.

The quadrature controller 2-1003 controls the cross-section angle in phase space in which the measurement is made. In some embodiments, the quadrature controller 2-1003 may be a phase shifter that controls the relative phase between the input optical pulse and the local oscillator. The quadrature controller 2-1003 is shown as a phase shifter in the input optical mode. But in some embodiments, the quadrature controller 2-1003 may be in the local oscillator mode.

The first detector 2-1007 detects light output by a first output of the beam splitter 2-1005 and the second detector 2-1009 detects light output by a second output of the beam splitter 2-1005. The detectors 2-1007 and 2-1009 may be photodiodes operated with zero bias.

A subtraction circuit 2-1011 subtracts the electrical current from the first detector 2-1007 from the electrical current from the second detector 2-1009. The resulting current therefore has an amplitude and a sign (plus or minus). The transimpedance amplifier 2-903 converts this difference in current into a voltage, which may be positive or negative. Finally, an ADC 2-905 converts the analog signal to a digital bit string. This output bit string represents the output vector result of the matrix multiplication and is an electrical, digital version of the optical output representation of the output vector that is output by the photonic processor 2-103. In some embodiments, the output bit string may be sent to the controller 2-107 for additional processing, which may include determining a next input bit string based on one or more output bit strings and/or transmitting the output bit string to an external processor, as described above.

The inventors have further recognized and appreciated that the components of the above-described photonic processing system 2-100 need not be chained together back-to-back such that there is a first matrix implementation 2-301 connected to a second matrix implementation 2-303 connected to a third matrix implementation 2-305. In some embodiments, the photonic processing system 2-103 may include only a single unitary circuit for performing one or more multiplications. The output of the single unitary circuit may be connected directly to the optical receiver 2-105, where the results of the multiplication are determined by detecting the output optical signals. In such embodiments, the single unitary circuit may, for example, implement the first matrix implementation 2-301. The results detected by the optical receiver 2-105 may then be transmitted digitally to a conventional processor (e.g., processor 2-111) where the diagonal second matrix implementation 2-303 is performed in the digital domain using a conventional processor (e.g., 2-111). The controller 2-107 may then reprogram the single unitary circuit to perform the third matrix implementation 2-305, determine an input bit string based on the result of the digital implementation of the second matrix implementation, and control the optical encoder to transmit optical signals, encoded based on the new input bit string, through the single unitary circuit with the reprogrammed settings. The resulting output optical signals, which are detected by the optical receiver 105, are then used to determine the results of the matrix multiplication.

The inventors have also recognized and appreciated that there can be advantages to chaining multiple photonic processors 2-103 back-to-back, in series. For example, to implement a matrix multiplication $M=M_1M_2$, where $M_1$ and $M_2$ are arbitrary matrices but $M_2$ changes more frequently than $M_1$ based on a changing input workload, the first photonic processor can be controlled to implement $M_2$ and the second photonic processor coupled optically to the first photonic processor can implement $M_1$ which is kept static. In this way, only the first photonic processing system needs to be frequently updated based on the changing input workload. Not only does such an arrangement speed up the computation, but it also reduces the number of data bits that travel between the controller 2-107 and the photonic processors.

VI. Folded Photonic Processing System

In FIG. 2-1, in such an arrangement, the optical encoder 2-101 and the optical receiver 2-105 are positioned on opposite sides of the photonic processing system 2-100. In applications where feedback from the optical receiver 2-105 is used to determine the input for the optical encoder 2-101 for a future iteration of the process, the data is transferred electronically from the optical receiver 2-105 to the controller 2-107 and then to the optical encoder 2-101. The inventors have recognized and appreciated that reducing the distance that these electrical signals need to travel (e.g., by reducing the length of electrical traces and/or wires) results in power savings and lower latency. Moreover, there is no need for the optical encoder 2-101 and optical receiver 2-105 to be placed on opposite ends of the photonic processing system.

Accordingly, in some embodiments, the optical encoder 2-101 and the optical receiver 2-105 are positioned near one another (e.g., on the same side of the photonics processor 2-103) such that the distance electrical signals have to travel between the optical encoder 2-101 and the optical receiver 2-105 is less than the width of the photonics processor 2-103. This may be accomplished by physically interleaving components of the first matrix implementation 2-301 and the third matrix implementation 2-305 such that they are physically in the same portion of the chip. This arrangement is referred to as a "folded" photonic processing system because the light first propagates in a first direction through the first matrix implementation 2-301 until it reaches a physical portion of the chip that is far from the optical encoder 2-101 and the optical receiver 2-105, then folds over such that the waveguides turn the light to be propagating in a direction opposite to the first direction when implementing the third matrix implementation 2-305. In some embodiments, the second matrix implementation 2-303 is physically located adjacent to the fold in the waveguides. Such an arrangement reduces the complexity of the electrical traces connecting the optical encoder 2-101, the optical receiver 2-105, and the controller 2-107 and reduces the total chip area used to implement the photonic processing system 2-100. For example, some embodiments using the folded arrangement only use 65% of the total chip area that would be needed if the back-to-back photonic arrangement of FIG. 2-1 was used. This may reduce the cost and complexity of the photonic processing system.

The inventors have recognized and appreciated that there are not only electrical advantages to a folded arrangement, but also optical advantages. For example, by reducing the distance that the light signal has to travel from the light source to be used as a local oscillator for the homodyne detection, the time-dependent phase fluctuations of the optical signal may be reduced, resulting in higher quality detection results. In particular, by locating the light source and the homodyne on the same side of the photonics processor, the distance traveled by the light signal used for the local oscillator is no longer dependent on the size of the matrix. For example, in the back-to-back arrangement of FIG. 2-1, the distance traveled by the light signal for the local oscillator scales linearly with the size of the matrix, whereas the distance traveled in the folded arrangement is constant, irrespective of the matrix size.

FIG. 2-11 is a schematic drawing of a folded photonic processing system 2-1100, according to some embodiments. The folded photonic processing system 2-1100 includes a power tree 2-1101, a plurality of optical encoders 2-1103a-2-1103d, a plurality of homodyne detectors 2-1105a-2-1105d, a plurality of selector switches 2-1107a-2-1107d, a plurality of U-matrix components 2-1109a-2-1109j, a plurality of diagonal-matrix components 2-1111a-2-1111d, and a plurality of V-matrix components 2-1113a-2-1113j. For the sake of clarity, not all components of the folded photonic processing system are shown in the figure. It should be understood that the folded photonic processing system 2-1100 may include similar components as the back-to-back photonic processing system 2-100.

The power tree 2-1101 is similar to the power tree 2-203 of FIG. 2 and is configured to deliver light from a light source (not shown) to the optical encoders 2-1103. However, a difference in the power tree 2-1101 and the power tree 2-203 is that the power tree delivers optical signals to the homodyne detectors 2-1105a directly. In FIG. 2, the light source 201 delivers a local oscillator signal to the homodyne detectors on the other side of the photonic processor by tapping off a portion of the optical signal from the light source and guiding the optical signal using a waveguide. In FIG. 2-11, the power tree 2-1101 includes a number of outputs that is equal to twice the number of spatial modes. For example, FIG. 2-11 illustrates only four spatial modes of a photonic processor, which results in eight output modes from the power tree 2-1101 one output directing light to each optical encoder 2-1103 and one output directing light to each homodyne detector 2-1105. The power tree may be implemented, for example, using cascading beam splitters or a multimode interferometer (MMI).

The optical encoders 2-1103 are similar to the power tree optical encoder 2-101 of FIG. 1 and are configured to encode information into the amplitude and/or phase of the optical signals received from the power tree 2-1101. This may be achieved, for example as described in connection with the optical encoder 2-101 of FIG. 2.

The homodyne detectors 2-1105 are located between the power tree 2-1101 and the U-matrix components 2-1109. In some embodiments, the homodyne detectors 2-1105 are physically positioned in a column with the optical encoder 2-1103. In some embodiments, the optical encoders 2-1103 and the homodyne detectors 2-1105 may be interleaved in a single column. In this way, the optical encoders 2-1103 and the homodyne detectors 2-1105 are in close proximity to one another, reducing the distance of electrical traces (not shown) used to connect the optical encoders 2-1103 and the homodyne detectors 2-1105 and a controller (not shown) which may be physically located adjacent to the column of the optical encoders 2-1103 and the homodyne detectors 2-1105.

Each of the optical encoders 2-1103 is associated with a respective homodyne detector 2-1105. Both the optical encoders 2-1103 and the homodyne detectors 2-1105 receive optical signals from the power tree 2-1101. The optical encoders 2-1103 use the optical signals to encode an input vector, as described above. The homodyne detectors 2-1105 use the received optical signals received from the power tree as the local oscillator, as described above.

Each pair of the optical encoders 2-1103 and the homodyne detectors 2-1105 is associated with and connected to a selector switch 2-1107 by a waveguide. The selector switches 2-1107a-2-1107d may be implemented using, for example, a conventional 2×2 optical switch. In some embodiments, the 2×2 optical switch is a MZI with an internal phase shifter to control the MZI's behavior from a crossing to a bar. The switch 2-1107 is connected to a controller (not shown) to control whether an optical signal received from the optical encoder 2-1103 will be guided towards the U-matrix components 2-1109 or the V-matrix components 2-1113. The optical switch is also controlled to guide light received from the U-matrix components 2-1109 and/or the V-matrix components 2-1113 toward the homodyne detectors 2-1105 for detection.

The techniques for implementing matrix multiplication is similar in the photonic folded photonic processing system 2-1100 as was described above in connection with the back-to-back system, described in FIG. 2-3. A difference between the two systems is in the physical placement of the matrix components and the implementation of a fold 2-1120, where the optical signals change from propagating approximately left to right in FIG. 2-11 to propagating approximately right to left. In FIG. 2-11, the connections between components may represent waveguides. The solid-lined connections represent portions of waveguide where the optical signals are propagating from left to right, in some embodiments, and the dashed-lined connections represent portions of waveguide where the optical signals are propagating from right to left, in some embodiments. In particular, given this nomenclature, the embodiment illustrated in FIG. 2-11 is an embodiment where the selector switches 2-1107 guide the optical signals to the U-matrix components 2-1109 first. In other embodiments, the selector switches 2-1107 may guide the optical signals to the V-matrix components 2-1113 first, in which case the dashed lines would represent portions of waveguide where the optical signals are propagating from left to right, and the solid-lined connections would represent portions of waveguide where the optical signals are propagating from right to left.

The U-matrix of the SVD of a matrix M is implemented in photonic processing system 2-1100 using U-matrix components 2-1109 that are interleaved with the V-matrix components 2-1113. Thus, unlike the embodiment of the back-to-back arrangement illustrated in FIG. 2-3, all of the U-matrix components 2-1109 and the V-matrix components 2-1113 are not physically located in a respective self-contained array within a single physical area. Accordingly, in some embodiments, the photonic processing system 2-1100 includes a plurality of columns of matrix components and at least one of the columns contains both U-matrix components 2-1109 and V-matrix components 2-1113. In some embodiments, the first column may only have U-matrix components 2-1109, as illustrated in FIG. 2-11. U-matrix components 2-1109 are implemented similarly to the first matrix implementation 2-301 of FIG. 3.

Due to the interleaving structure of the U-matrix components 2-1109 and the V-matrix components 2-1113, the folded photonic processing system 2-1100 includes waveguide crossovers 2-1110 at various locations between the columns of matrix elements. In some embodiments, the waveguide crossovers can be constructed using adiabatic evanescent elevators between two or more layers in an integrated photonics chip. In other embodiments, the U-matrix and the V-matrix may be positioned on different layers of the same chip and the waveguide crossovers are not used.

After optical signals propagate through all of the U-matrix components 2-1109, the optical signals propagate to the diagonal-matrix components 2-1111, which are implemented similarly to the second matrix implementation 2-303 of FIG. 2-3.

After optical signals propagate through all of the diagonal-matrix components 2-1111, the optical signals propagate to the V-matrix components 2-1113, which are implemented similarly to the third matrix implementation 2-305 of FIG. 2-3. The V-matrix of the SVD of a matrix M is implemented in photonic processing system 2-1100 using V-matrix components 2-1113 that are interleaved with the U-matrix components 2-1109. Thus, all of the V-matrix components 2-1113 are not physically located in a single self-contained array.

After the optical signals propagate through all of the V-matrix components 2-1113, the optical signals return to the selector switch 2-1107, which guides the optical signals to the homodyne detectors 2-1105 for detection.

The inventors have further recognized and appreciated that by including selector switches after the optical encoders and before the matrix components, the folded photonic processing system 2-1100 allows efficient bi-directionality of the circuit. Thus, in some embodiments, a controller, such as the controller 2-107 described in connection with FIG. 2-1, may control whether the optical signals are multiplied by the U matrix first or the $V^T$ matrix first. For an array of VBSs set to implement a unitary matrix U when propagating the optical signals from left to right, propagating the optical signals from right to left implements a multiplication by a unitary matrix $U^T$. Thus, the same settings for an array of VBSs can implement both U and $U^T$ depending which way the optical signals are propagated through the array, which may be controlled using the selector switch in 2-1107. In some applications, such as back-propagation used to train a machine learning algorithm, it may be desirable to run optical signals through one or more matrices backwards. In other applications, the bi-directionality can be used to compute the operation of an inverted matrix on an input vector. For example, for an invertible n×n matrix M, an SVD results in $M=V^T\Sigma U$. The inverse of this matrix is $M^{-1}=U^T\Sigma^{-1}V$, where $\Sigma^{-1}$ is the inverse of a diagonal matrix which can be computed efficiently by inverting each diagonal element. To multiply a vector by the matrix M, the switches are configured to direct the optical signals through the matrix U, then $\Sigma$, then $V^T$ in a first direction. To multiply a vector by the inverse $M^{-1}$, the singular values are first set to program the implementation of the $\Sigma^{-1}$ matrix. This constitutes changing the settings of only one column of VBSs instead of all 2n+1 columns of the photonic processor, which is the case for a single-directional photonic processing system such as the one illustrated in FIG. 2-3. The optical signals representing the input vector are then propagated through the matrix $V^T$, then $\Sigma^{-1}$, and then U in a second direction that is opposite the first direction. Using the selector switches 2-1107, the folded photonic processing system 2-1100 may be easily changed from implementing the U matrix (or its transpose) first and implementing the $V^T$ matrix (or its transpose) first.

VI. Wavelength Division Multiplexing

The inventors have further recognized and appreciated that there are applications where different vectors may be multiplied by the same matrix. For example, when training or using machine learning algorithms sets of data may be processed with the same matrix multiplications. The inventors have recognized and appreciated that this may be accomplished with a single photonic processor if the components before and after the photonic processor are wavelength-division-multiplexed (WDM). Accordingly, some embodiments include multiple frontends and backends, each associated with a different wavelength, while only using a single photonic processor to implement the matrix multiplication.

FIG. 2-12A illustrates a WDM photonic processing system 2-1200, according to some embodiments. The WDM photonic processing system 2-1200 includes N frontends 2-1203, a single photonic processor 2-1201 with N spatial modes, and N backends 2-1205.

The photonic processor 2-1201 may be similar to the photonic processor 2-103, with N input modes and N output modes. Each of the N frontends 2-1203 is connected to a respective input mode of photonic processor 2-1201. Similarly, each of the N backends 2-1205 is connected to a respective output mode of photonic processor 2-1201.

FIG. 2-12B illustrates details of at least one of the frontends 2-1203. As with the photonic processing system of other embodiments, the photonic processing system 2-1200 includes optical encoders 2-1211. But in this embodiment, there are M different optical encoders, where M is the number of wavelengths being multiplexed by the WDM photonic processing system 2-1200. Each of the M optical encoders 2-1211 receives light from a light source (not shown) that generates the M optical signals, each of a different wavelength. The light source may be, for example, an array of lasers, a frequency comb generator or any other light source that generates coherent light at different wavelengths. Each of the M optical encoders 2-1211 is controlled by a controller (not shown) to implement an appropriate amplitude and phase modulation to encode data into the optical signal. Then, the M encoded optical signals are combined into a single waveguide using an M:1 WDM 2-1213. The single waveguide then connects to the one of the N waveguides of the photonic processor 2-1201.

FIG. 2-12C illustrates details of at least one of the backends 2-1205. As with the photonic processing system of other embodiments, the photonic processing system 2-1200 includes detectors 2-1223, which may be phase-sensitive or phase-insensitive detectors. But in this embodiment, there are M different detectors 2-1223, where M is the number of wavelengths being multiplexed by the WDM photonic processing system 2-1200. Each of the M detectors 2-1223 receives light from a 1:M WDM 2-1221, which splits the single output waveguide from photonic processor 2-1201 into M different waveguides, each carrying an optical signal of a respective wavelength. Each of the M detectors 2-1223 may be controlled by a controller (not shown) to record measurement results. For example, each of the M detectors 1223 may be a homodyne detector or a phase insensitive photodetector.

In some embodiments, the VBSs in the photonic processor 2-1201 may be chosen to be non-dispersive within the M wavelengths of interest. As such, all the input vectors are multiplied by the same matrix. For example, an MMI can be used instead of a directional coupler. In other embodiments, the VBSs may be chosen to be dispersive within the M wavelengths of interest. In some applications related to stochastic optimization of the parameters of a neural network model, this is equivalent to adding noise when computing the gradient of the parameters; increased gradient noise may be beneficial for faster optimization convergence and may improve the robustness of a neural network.

While FIG. 2-12A illustrates a back-to-back photonic processing system, similar WDM techniques may be used to form a WDM folded photonic processor using the techniques described in relation to folded photonic processor 2-1100.

VII. Analog Summation of Outputs

The inventors have recognized and appreciated that there are applications where it is useful to calculate the sum or the average of the outputs from the photonic processor 2-103 over time. For example, when the photonic processing system 2-100 is used to compute a more exact matrix-vector multiplication for a single data point, one may want to run a single data point through the photonic processor multiple times to improve the statistical results of the calculation. Additionally or alternatively, when computing the gradient in a backpropagation machine learning algorithm, one may not want a single data point determining the gradient, so multiple training data points may be run through photonic processing system 2-100 and the average result may be used to calculate the gradient. When using a photonic processing system to perform a batched gradient based optimization algorithm, this averaging can increase the quality of the gradient estimate and thereby reduce the number of optimization steps required to achieve a high quality solution.

The inventors have further recognized and appreciated that the output signals may be summed in the analog domain, before converting the outputs to digital electrical signals. Thus, in some embodiments, a low pass filter is used to sum the outputs from the homodyne detectors. By performing the summation in the analog domain, the homodyne electronics may use a slow ADC rather than a costlier fast ADC (e.g., an ADC with high power consumption requirements) that would be required to perform a summation in the digital domain.

FIG. 2-13 illustrates a portion of an optical receiver 2-1300 and how a low pass filter 2-1305 may be used with a homodyne detector 2-1301, according to some embodiments. The homodyne detector 2-1301 performs a measurement of the field and phase of an incoming optical pulse. If k is the label for the different input pulses over time and there is a total of K inputs, the sum over k can be automatically performed in the analog domain using low-pass filter 2-1305. The main difference between this optical receiver 2-1300 and the optical receiver 2-105 illustrated in FIG. 2-9 is that the low-pass filter is after the transimpedance amplifier 2-1303 after the output of the homodyne detector. If a total of K signals (with components $y_i^{(k)}$), arrives at the homodyne detector within a single slow sampling period $T_s^{(slow)}$, the low-pass filter will have accumulated/removed the charges in the capacitor C according to the sign and value of $y_i^{(k)}$. The final output of the low-pass filter is proportional to $Y_i = \Sigma_{k=1}^K y_i^{(k)}$, which can be read once with a slower ADC (not shown) with a sampling frequency of $f_s^{(slow)} = 1/T_s^{(slow)}$ $=f_s/K$, where $f_s$ is the originally required sampling frequency. For an ideal system, the low-pass filter should have a 3-dB bandwidth: $h_{3\ dB}=f_s^{(slow)}/2$. For a low-pass filter using an RC circuit as shown in the embodiment of FIG. 2-13, $h_{3\ dB}=1/(2\pi RC)$, and the values of R and C can be chosen to obtain the desired sampling frequency: $f_s^{(slow)}$.

In some embodiments both a fast ADC and a slow ADC may be present. In this context, a fast ADC is an ADC that is configured to receive and convert each individual analog signal into a digital signal (e.g., an ADC with a sampling frequency equal to or greater than the frequency at which the analog signals arrive at the ADC), and a slow ADC is an ADC that is configured to receive multiple analog signals and convert the sum or average of multiple received analog signals into a single digital signal (e.g., an ADC with a sampling frequency less than the frequency at which the analog signals arrive at the ADC). An electrical switch may be used to switch the electrical signal from the homodyne detector and possibly transimpedance amplifier to the low-pass filter with a slow ADC or to the fast ADC. In this way, the photonic processing system of some embodiments may switch between performing analog summation using the slow ADC and measuring every optical signal using the fast ADC.

VIII. Stabilizing Phases

The inventors have recognized and appreciated that it is desirable to stabilize the phase of the local oscillator used for performing phase-sensitive measurements (e.g., homodyne detection) to ensure accurate results. The photonic processors of the embodiments described herein perform matrix operations by interfering light between N distinct spatial modes. The results are measured, in some embodiments, with phase sensitive detectors, such as homodyne or heterodyne detectors. Thus, to ensure the matrix operations are accurately performed, the phase imparted at various portions of the photonic processor should be as accurate as possible and the phase of the local oscillator used to perform phase-sensitive detection should be precisely known.

The inventors have recognized and appreciated that parallel interference operations, such as those performed within a single column of VBSs of the photonic processor, must not only impart the correct phases using the phase modulators controlling the relative phase within the MZI of the VBS and the phase and the relative phase of the output of the MZI, but each VBS in a column should impart the same global phase shift across all the spatial modes of photonic processor. In this application, the global phase shift for a column of VBSs in the photonic processor is referred to as the "column-global phase." The column-global phase is the phase imparted due to effects not related to the programmed phases associated with the VBS, such as phases imparted due to propagation through the waveguide or phases due to temperature shifts. These phases need not be imparted exactly simultaneously within a column on VBSs, but only need be imparted as a result of traversing the column in question. Ensuring the column-global phase is uniform between the different spatial modes of the column is important because the output optical signals from one column will likely be interfered at one or more VBSs at a subsequent column. The subsequent interference—and therefore the accuracy of the calculation itself—would be incorrect if the column-global phase at the previous columns is not uniform.

FIG. 2-14 illustrates the column-global phases and total global phase for a photonic processing system 2-1400. Similar to the above-described embodiments of photonic processing systems, the photonic processing system 2-1400 includes a U-matrix implementation 2-1401, a diagonal matrix implementation 2-1403, a V-matrix implementation 2-1405, and a plurality of detectors 2-1407a-2-1407d. These implementations are similar to the first, second and third matrix implementations described above. For the sake of simplicity, only four modes of the photonic processing system 2-1400 are shown, though it should be understood that any larger number of modes may be used. Also for simplicity, only the VBSs associated with the U-matrix implementation 2-1401 are illustrated. The arrangement of components of the diagonal matrix implementation 2-1403 and a V-matrix implementation 2-1405 are similar to the third and fourth matrix implementations described above.

The U-matrix implementation 2-1401 includes a plurality of VBSs 2-1402, though only a single VBS 2-1402 is labeled for the sake of clarity. The VBSs are labeled, however, with subscripts that identify which optical modes are being mixed by a particular VBS and a superscript labeling the associated column.

As illustrated in FIG. 2-14, each column is associated with a column-global phase that is ideally uniform for every element of the column. For example, column 1 of the U-matrix implementation 2-1401 is associated with a column-global phase $\phi_{U_1}$, column 2 of the U-matrix implementation 2-1401 is associated with a column-global phase $\phi_{U_2}$, column 3 of the U-matrix implementation 2-1401 is associated with a column-global phase $\phi_{U_3}$, and column 4 of the U-matrix implementation 2-1401 is associated with a column-global phase $\phi_4$.

In some embodiments, the column-global phases can be made uniform at least in part by implementing each VBS 2-1402 as a MZI in a push-pull configuration. Alternatively or additionally, external phase shifter can be added to the output of each MZI to correct for any phase error imparted from the phase elements of the MZIs (e.g., the phase shifters).

The inventors have further recognized and appreciated that even if the conditions are such that each column of the photonic processing system 2-1400 provides a uniform column-global phase, phases can be accrued as the signal propagates from the first column to the last. There is a global U-matrix phase, $\Phi_U$, associated with the entire U-matrix implementation 2-1401 and is equal to the sum of the individual column-global phase. Similarly, the diagonal-matrix implementation 2-1403 is associated with a global diagonal-matrix phase, $\Phi_\Sigma$, and the V-matrix implementation 2-1405 is associated with a global diagonal-matrix phase, $\Phi_{V^\dagger}$. A total global phase $\Phi_G$ for the entire photonic processing system 2-1400 is then given by the sum of the three individual global matrix phases. This total global phase may be set to be uniform between all the output modes, but the local oscillator that is used for phase-sensitive detection did not propagate through the photonic processor and did not experience this total global phase. The total global phase $\Phi_G$, if not accounted for, can lead to an error in the values read out by the homodyne detectors 2-1407a-2-1407d.

The inventors have further recognized that errors in the multiplication operation may result from changes in temperature, which change a waveguide's effective refractive index $n_{eff}$. Accordingly, in some embodiments, either the temperature of each column is set to be uniform or stabilization circuits can be placed at each column such that the phases imparted to all the modes of a single column are actively tuned to be uniform. Additionally, as the light signal for the local oscillator propagates through a different part of the system, the temperature difference between different parts of the system can cause errors in the phase-sensitive measurements. The amount of phase difference between the signal and the local oscillator is $$\Phi_T = \frac{2\pi}{\lambda}(n_{\it eff}(T_s)L_s - n_{\it eff}(T_{LO})L_{LO}),$$

where $T_s$ and $T_{LO}$ are the temperatures of the signal waveguide in the photonic processor and the local oscillator waveguide, respectively, $n_{\it eff}(T)$ is the effective index of refraction as a function of temperature, $\lambda$ is the average wavelength of the light, and $L_s$ and $L_{LO}$ are the propagation lengths through the signal waveguide in the photonic processor and the local oscillator waveguide, respectively. Assuming that the difference in temperature $\Delta T = T_{LO} - T_S$ is small, then the effective index can be rewritten as:

$$n_{\it eff}(T_{LO}) \approx n_{\it eff}(T_S) + \left.\frac{dn_{\it eff}}{dT}\right|_{T=T_S} \Delta T.$$

Therefore, the phase difference between the signal and the LO can be well approximated by $$\Phi_T = \frac{2\pi}{\lambda} \left.\frac{dn_{\it eff}}{dT}\right|_{T=T_S} L \cdot \Delta T,$$

which increases linearly with longer propagation length L. Therefore, for a sufficiently long propagation distance, a small change in temperature can result in a large phase shift (on the order of one radian). Importantly, the values of $L_S$ does not need to be the same as the value of $L_{LO}$, and the maximum difference between the two is determined by the coherence length of the light source $L_{coh}$. For a light source with a bandwidth of $\Delta v$, the coherence length can be well approximated by $L_{coh} \approx c_{\it eff} \Delta v$, where $c_{\it eff}$ is the speed of light in the transmission medium. As long as the length difference between $L_S$ and $L_{LO}$ is much shorter than $L_{coh}$, interference between the signal and the local oscillator will be possible for the correct operation of the photonic processing system.

Based on the foregoing, the inventors have identified at least two sources of possible phase errors between the output signals of the photonic processor and the local oscillator used for homodyne detection in some embodiments. Thus, where an ideal homodyne detector would measure the magnitude and phase of the signal output by subtracting the outputs of the two photodetectors, resulting in a phase sensitive intensity output measurement of $I_{out} \propto |E_s||E_{LO}|\cos(\theta_s - \theta_{LO} + \Phi_G + \Phi_T)$, where $E_s$ is the electric field magnitude of the optical signal from the output of the photonic processor, $E_{LO}$ is the electric field magnitude of the local oscillator, $\theta_s$ is the phase shift imparted by the photonic processor that is desired to be measured, $\Phi_G$ is the total global phase, and $\Phi_T$ is the phase shift caused by temperature differences between the local oscillator and the optical signal. Consequently, if the total global phase and the phase shift due to temperature differences are not accounted for, the result of the homodyne detection can be erroneous. Therefore, in some embodiments the total systematic phase error, $\Delta\Phi = \Phi_G + \Phi_T$, is measured and the system is calibrated based on that measurement. In some embodiments, the total systematic phase error includes contributions from other sources of error that are not necessarily known or identified.

According to some embodiments, the homodyne detectors may be calibrated by sending pre-computed test signals to the detectors and using the difference between the pre-computed test signals and the measured test signals to correct for the total systematic phase error in the system.

In some embodiments, rather than considering the total global phase, $\Phi_G$, and the phase shift caused by temperature differences, $\Phi_T$, as being related to the optical signals propagating through the photonic processor, they can be described as the signal not accruing any phase shift at all but the LO having a total systematic phase error $-\Delta\Phi$. FIG. 2-15 illustrates the effect on the results of the homodyne measurements in such a situation. The original (correct) vector of quadrature values of the signal $[x,p]^T$ is rotated by a rotation matrix parameterized by $\Delta\Phi$ producing an incorrect quadrature values of $[x',p']^T$.

Based on the rotation in quadrature due to the total systematic error, in some embodiments, the value of $\Delta\Phi$ is obtained as follows. First, a vector $\vec{v}_{in}$ is selected (e.g., a random vector), using, e.g., the controller 2-107. The vector is of a type that can be prepared by the optical encoders of the photonic processing system. Second, the output value of $\vec{v}_{out} = M\vec{v}_{in}$, where M is the matrix implemented by the photonic processor in the ideal case assuming that there is no unaccounted phase accrued of $\Delta\Phi$, is calculated using, for example, the controller 2-107 or some other computing device. As a result, each element of $\vec{v}_{out}$ corresponds to $x_k + ip_k$, where k labels each of the output modes of the photonic processor.

In some embodiments, loss in propagating the random vector through the photonic processor may be considered when calculating the theoretical prediction $x_k + ip_k$. For example, for a photonic processor with transmission efficiency $\eta$, the field signal of $x_k + ip_k$ will become $$\sqrt{\eta}(x_k + ip_k).$$

Next, the random vector $\vec{v}_{in}$ is prepared by the optical encoder of the actual system, propagated through the photonic processor, and each element of the output vector is measured in both quadratures to obtain $x_k' + ip_k'$. The phase difference $\Delta\Phi_k$ between the local oscillator and the signal of output mode k is given by $$\Delta\Phi_k = \tan^{-1}\left(\frac{p_k' x_k - x_k' p_k}{x_k x_k' + p_k p_k'}\right).$$

(Generally, the phase difference $\Delta\Phi_k \neq \Delta\Phi_l$ for $k \neq l$ as the path length of the LO to the detector for mode k can be different to that for mode l).

Finally, the local oscillator phase shifter used to select the measurement quadrature of the homodyne detector is controlled to impart $\theta_{LO,k} = \Delta\Phi_k$. As a result, the axes (x,p) will align with the axes (x',p'), as illustrated in FIG. 2-15. The calibration may be checked at this stage to ensure it is accurate by propagating the vector $\vec{v}_{in}$ once again to see that the obtained measurement results are equal to the predicted $\vec{v}_{out}$ when both quadratures are measured.

Generally, the value of $\Delta\Phi_k$ can be determined more precisely if the field amplitude $|E_{s,k}| = \sqrt{x_k^2 + p_k^2} = \sqrt{x_k'^2 + p_k'^2}$ is as large as possible. For example, if the field $E_{s,k}$ is considered to be a coherent signal, e.g. from a laser source, then the optical signal may be theoretically modeled as a coherent state. The intuitive picture is given in FIG. 2-16, where the signal is the amplitude $|E_{S,k}|$ and the noise is given by the standard deviation of the Gaussian coherent state. The coherent state $|\alpha_k\rangle$ in mode k is the eigenstate of the annihilation operator $a_k$, i.e. $a_k|\alpha_k\rangle = \alpha_k|\alpha_k\rangle$. The electric field of mode k with a single frequency $\omega$ is described by $E_{S,k}^{(+)}(t)=a_k e^{-i\omega t}$, which is also an eigenstate of the coherent state: $E_{S,k}^{(+)}(t)|\alpha_k\rangle = \alpha_k e^{-i\omega t}|\alpha_k\rangle$. A homodyne detector with a local oscillator of the same frequency $\omega$ performs the quadrature measurements $x_k=(a_k+a_k^\dagger)/2$ when $\theta_{LO}=0$ and $p_k=(a_k-a_k^\dagger)/2i$ when $\theta_{LO}=\pi/2$. An ideal homodyne detector will find that these measurements have an intrinsic quantum noise of $\sqrt{\langle\Delta x_k^2\rangle}=\frac{1}{2}$ and $\sqrt{\langle\Delta p_k^2\rangle}=\frac{1}{2}$. This noise is related to the quantum uncertainties, and it can be reduced by squeezing on the quadratures. The precision at which the angle $\Delta\Phi_k$ can be determined is directly related to the signal-to-noise ratio (SNR) of these measurements. For a coherent-state signal $E_{S,k}$ with a total of $N_{ph}$ photons (i.e. $E_{S,k}=|\sqrt{N_{ph}}e^{i\theta_S}\rangle$, the SNR of both $x_k$ and $p_k$ is upper bounded by:

$$SNR_x = \frac{\langle x_k\rangle^2}{\langle\Delta x_k^2\rangle} \leq 4N_{ph} \text{ and } SNR_p = \frac{\langle p_k\rangle^2}{\langle\Delta p_k^2\rangle} \leq 4N_{ph}.$$

(The bound of $SNR_x$ is saturated when $\theta_S=0$ or $\pi$, and the bound on $SNR_p$ is saturated when $\theta_S=\pi/2$ or $3\pi/2$). Therefore, to increase the SNR and to determine the values of $\Delta\Phi_k$ more accurately, some embodiments may propagate a few different choices of vector $\vec{v}_{in}$ (e.g., multiple different random vectors). In some embodiments, the choices of $\vec{v}_{in}$ are chosen to maximize the amplitude $|E_{S,k}|=N_{ph}$ for one value of k at a time.

There may be phase drift during the operation of the photonic processing system, e.g., due to temperature fluctuations over time. Thus, in some embodiments, the aforementioned calibration procedure may be performed repeatedly during the operation of the system. For example, in some embodiments, the calibration procedure is performed regularly at a time scale that is shorter than the natural timescale of the phase drift.

The inventors have further recognized and appreciated that it is possible to perform signed matrix operations without the need of phase-sensitive measurements at all. Therefore, in applications, each homodyne detector at each output mode may be replaced by a direct photodetector which measures the intensity of the light at that output mode. As there is no local oscillator in such a system, the systematic phase error $\Delta\Phi$ is non-existent and meaningless. Thus, according to some embodiments, phase-sensitive measurements, such as homodyne detection, may be avoided such that the systematic phase error is insignificant. For example, when computing matrix operations of signed matrices and vectors, complex matrices and vectors, and hypercomplex (quaternion, octonion, and other isomorphisms (e.g., elements of unital algebra)) matrices and vectors using unsigned matrices do not require phase-sensitive measurements.

To illustrate how phase-sensitive measurements are not necessary, consider the case of performing matrix multiplication between a signed matrix M and a signed vector $\vec{v}_{in}$. To compute the value of signed output $\vec{v}_{out}=M\vec{v}_{in}$, the following procedure may be performed by, for example, the controller 2-107. First, the matrix M is split into $M_+$ and $M_-$, where $M_+$ ($M_-$) is a matrix that contains all the positive (negative) entries of M. In this case, $M=M_+-M_-$. Second, the vector is split in a similar manner such that the vector $\vec{v}_{in}=\vec{v}_{in,+}-\vec{v}_{in,-}$, where $\vec{v}_{in,+}$ ($\vec{v}_{in,-}$) is a vector that contains all the positive (negative) entries of $\vec{v}_{in}$. As a result of the splittings, $\vec{v}_{out}=M\vec{v}_{in}=(M_+-M_-)(\vec{v}_{in,+}-\vec{v}_{in,-})=(M_+\vec{v}_{in,+}+M_-\vec{v}_{in,-})-(M_+\vec{v}_{in,-}+M_-\vec{v}_{in,+})$. Each term of this final equation corresponds to a separate operation ($M_+\vec{v}_{in,+}$, $M_-\vec{v}_{in,-}$, $M_+\vec{v}_{in,-}$, and $M_-\vec{v}_{in,+}$) that may be performed individually by the photonic processing system. The output of each operation is a vector of a single (positive) sign, and therefore can be measured using a direct detection scheme without the need for homodyne detection. The photodetector scheme will measure the intensity, but the square root of the intensity may be determined, resulting in the electric field amplitude. In some embodiments, each operation is performed separately and the results are stored in a memory (e.g., memory 2-109 of controller 2-107) until all of the separate operations are performed and the results may be digitally combined to obtain the final result of the multiplication, $\vec{v}_{out}$.

The above scheme works because $M_+$ and $M_-$ are both matrices of all positive entries. Similarly, $\vec{v}_{in,+}$ and $\vec{v}_{in,-}$ are both vectors of all positive entries. Therefore, the results of their multiplications will be vectors of all positive entries—regardless of the combination.

The inventors have further recognized and appreciated that the above splitting technique may be extended to complex-valued vectors/matrices, quaternion-valued vectors/matrices, octonion-valued vectors/matrices, and other hypercomplex representations. Complex numbers employ two different fundamental units $\{1, i\}$, Quaternions employ four different fundamental units $\{1, i, j, k\}$, and octonions employ eight fundamental units $\{e_0\equiv 1, e_1, e_2, \ldots, e_7\}$.

In some embodiments, a complex vector may be multiplied by a complex matrix without the need for phase-sensitive detection by splitting the multiplication into separate operations similar to the procedure described above for signed matrices and vectors. In the case of complex numbers, the multiplication splits into 16 separate multiplications of all-positive matrices and all-positive vectors. The results of the 16 separate multiplications may then be digitally combined to determine the output vector result.

In some embodiments, a quaternion-valued vector may be multiplied by a quaternion-valued matrix without the need for phase-sensitive detection by splitting the multiplication into separate operations similar to the procedure described above for signed matrices and vectors. In the case of quaternion-valued numbers, the multiplication splits into 64 separate multiplications of all-positive matrices and all-positive vectors. The results of the 64 separate multiplications may then be digitally combined to determine the output vector result.

In some embodiments, a octonion-valued vector may be multiplied by a octonion-valued matrix without the need for phase-sensitive detection by splitting the multiplication into separate operations similar to the procedure described above for signed matrices and vectors. In the case of octonion-valued numbers, the multiplication splits into 256 separate multiplications of all-positive matrices and all-positive vectors. The results of the 256 separate multiplications may then be digitally combined to determine the output vector result.

The inventors have further recognized and appreciated that temperature-dependent phase $\Phi_T$ can be corrected by placing a temperature sensor next to each MZI of the photonic processor. The results of the temperature measurement may then be used as an input to a feedback circuitry that controls the external phases of each MZI. The external phases of the MZI are set to cancel the temperature-dependent phase accrued at every MZI A similar temperature feedback loop can be used on the local oscillator propagation path. In this case, the temperature measurement results are used to inform the settings of the homodyne detector quadrature-selecting phase shifter to cancel the phase accrued by the local oscillator due to detected temperature effects.

In some embodiments, the temperature sensors can be those conventionally used in semiconductor devices, e.g. p-n junction or bipolar junction transistor, or they can be photonic temperature sensors, e.g. using resonators whose resonance changes with temperatures. External temperature sensors such as thermocouples or thermistors may also be used in some embodiments.

In some embodiments, the phases accrued may be directly measured by, for example, tapping some light at every column and performing homodyne detection with the same global local oscillator. This phase measurement can directly inform the values of external phases used at each MZI to correct for any phase error. In the case of directly measured phase errors, the errors do not need to be column-global to be corrected.

IX. Intermediary Computation for Large Data

The inventors have recognized and appreciated that the matrix vector product performed by the photonic processor 2-103, and/or any other photonic processor according to other embodiments described in the present disclosure, can be generalized into tensor (multidimensional array) operations. For example, the core operation of $M\vec{x}$ where M is a matrix and $\vec{x}$ is a vector can be generalized into a matrix-matrix product: MX where both M and X are matrices. In this particular example, consider the n-by-m matrix X to be a collection of m column vectors each consisting of n elements, i.e. $X=[\vec{x}_1, \vec{x}_2, \ldots, \vec{x}_m]$. A photonic processor can complete the matrix-matrix product MX one column vector at a time with a total of m matrix-vector products. The computation can be distributed among multiple photonic processors as the computation is a linear operation, which is perfectly parallelizable, e.g., any one matrix-vector product output does not depend on the results of the other matrix-vector products. Alternatively, the computation can be performed by a single photonic processor serially over time, e.g., by performing each matrix-vector product ones at a time and combining the results digitally after performing all of the individual matrix-vector multiplications to determine the result of the matrix-matrix product (e.g., by storing the results in an appropriate memory configuration).

The concept above can be generalized into computing a product (e.g., a dot product) between two multidimensional tensors. The general algorithm is as follows and may be performed, at least in part, by a processor such as the processor 2-111: (1) Take a matrix slice of the first tensor; (2) Take a vector slice of the second tensor; (3) Perform a matrix-vector product, using the photonic processor, between the matrix slice in step 1 and the vector slice in step 2, resulting in an output vector; (4) Iterate over the tensor indices from which the matrix slice (from step 1) was obtained and the tensor indices from which the vector slice (from step 2) was obtained. It should be noted that when taking the matrix slice and the vector slice (steps 1 and 2), multiple indices can be combined into one. For example, a matrix can be vectorized by stacking all the columns into a single column vector, and in general a tensor can be matricized by stacking all the matrices into a single matrix. Since all the operations are fully linear, they are again can be highly parallelized where each of a plurality of photonic processor does not need to know whether the other photonic processors have completed their jobs.

By way of a non-limiting example, consider the multiplication between two three-dimensional tensors $C_{ijlm}=\Sigma_k A_{ijk} B_{klm}$. The pseudocode based on the prescription above is as follows:

(1) Take a matrix slice: $A_i \leftarrow A[i, :, :]$;

(2) Take a vector slice: $\vec{b}_{lm} \leftarrow B[:, l, m]$;

(3) Compute $\vec{c}_{ilm}=A_i\vec{b}_{lm}$, where $C[i, :, l, m] \leftarrow \vec{c}_{ilm}$; and (4) Iterate over the indices i, l, and m to reconstruct the four-dimensional tensor $C_{ijlm}$, where the values of all elements indexed by j is fully determined with a single matrix-vector multiplication.

The inventors have further recognized and appreciated that the size of the matrices/vectors to be multiplied can be larger than the number of modes supported by the photonic processor. For example, a convolution operation in a convolutional neural network architecture may use only a few parameters to define a filter, but may consist of a number of matrix-matrix multiplications between the filter and different patches of the data. Combining the different matrix-matrix multiplications result in two input matrices that are larger than the size of the original filter matrix or data matrix.

The inventors have devised a method of performing matrix operations using the photonic processor when the matrices to be multiplied are larger than the size/the number of modes possessed by the photonic processor being used to perform the calculation. In some embodiments, the method involves using memory to store intermediate information during the calculation. The final calculation result is computed by processing the intermediate information. For example, as illustrated in FIG. 2-17, consider the multiplication 2-1700 between an I×J matrix A and a J×K matrix B to give a new matrix C=AB, which has I×K elements, using an n×n photonic processing system with n≤I, J, K. In FIG. 2-17, the shaded elements simply illustrate that the element 2-1701 of matrix C is calculated using the elements of row 2-1703 of matrix A and column 2-1705 of matrix B. The method illustrated by FIGS. 2-17 and 2-18 is as follows:

Construct n×n submatrix blocks of within matrices A and B. Label the blocks by the parenthesis superscript $A^{(ij)}$ and $B^{(jk)}$, where i∈{1, ..., ceil(I/n)}, j∈{1, ..., ceil(J/n)}, and k∈{1, ..., ceil(K/n)}. When the values of I, J, or K are not divisible by n, the matrices may be padded with zeros such that the new matrix has dimensions that are divisible by n—hence the ceil function in the indexing of i, j, and k. In the example multiplication 2-1800 illustrated in FIG. 2-18, matrix A is split into six n×n submatrix blocks 2-1803 and matrix B is split into three n×n submatrix blocks 2-1805, resulting in a resulting matrix C that is comprised of two n×n submatrix blocks 2-1801.

To compute the n×n submatrix block $C^{(ik)}$ within matrix C, perform the multiplications $C^{(ik)}=\Sigma_{j=1}^{ceil(J/n)} A^{(ij)} B^{(jk)}$ in the photonic processor by, for example:

(1) Controlling the photonic processor to implement the submatrix $A^{(ij)}$ (e.g., one of the submatrices 2-1803);
(2) Encoding optical signals with the column vectors of one of the submatrices $B^{(jk)}$ (e.g., one of the submatrices 2-1805) and propagating the signals through the photonic processor;
(3) Storing the intermediate results of each matrix-vector multiplication in memory;
(4) Iterating over the values of j, repeating steps (a)(c); and
(5) Computing the final submatrix $C^{(ik)}$ (e.g., one of the submatrices 2-1801) by combining the intermediate results with digital electronics, e.g., a processor.

As described above and shown in FIG. 2-17 and FIG. 2-18, the method may include expressing the matrix multiplication using parentheses index notation and performing the operation of the matrix-matrix multiplication using the parentheses superscript indices instead of the subscript indices, which are used to describe the matrix elements in this disclosure. These parentheses superscript indices correspond to the n×n block of submatrix. In some embodiments, the method can be generalized to tensor-tensor multiplications by breaking up the multidimensional arrays into n×n submatrix block slices, for example, by combining this method with the tensor-tensor multiplication described above.

In some embodiments, an advantage of processing blocks of submatrices using a photonic processor with fewer number of modes is that it provides versatility with regards to the shape of the matrices being multiplied. For example, in a case where I≫J, performing singular value decompositions will produce a first unitary matrix of size $I^2$, a second unitary matrix of size $J^2$, and a diagonal matrix with J parameters. The hardware requirements of storing or processing $I^2$ matrix elements, which are much larger than the number of elements of the original matrix, can be too large for the number of optical modes included in some embodiments of the photonic processor. By processing submatrices rather than the entire matrix all at once, any size matrices may be multiplied without imposing limitations based on the number of modes of the photonic processor.

In some embodiments, the submatrices of B are further vectorized. For example, the matrix A may be first padded to a $[(n \cdot \lceil I/n \rceil) \times (n \cdot \lceil J/n \rceil)]$ matrix and then partitioned into a $[\lceil I/n \rceil \times \lceil J/n \rceil]$ grid of submatrices (each of size [n×n]) and $A^{(ij)}$ is the [n×n] submatrix in the $i^{th}$ row and $j^{th}$ column of this grid, B has been first padded to a $[(n \cdot \lceil J/n \rceil) \times K]$ matrix and then partitioned into a $[\lceil J/n \rceil \times 1]$ grid of submatrices (each of size [n×K]) and $B^{(j)}$ is the [n×K] submatrix in the $j^{th}$ row of this grid, and C has been first padded to a $[(n \cdot \lceil J/n \rceil) \times K]$ matrix and then partitioned into a $[\lceil I/n \rceil \times 1]$ grid of submatrices (each of size [n×K]) and $C^{(i)}$ is the [n×K] submatrix in the $i^{th}$ row of this grid. In this vectorized form, the computation is denoted by: $C^{(i)} = \Sigma_{j=1}^{\lfloor J/n \rfloor} A^{(ij)} B^{(j)}$.

Using the above vectorization process, a photonic processor can compute any GEMM by loading ($\lceil I/n \rceil \cdot \lceil J/n \rceil$) different matrices into the photonic array and, for each loaded matrix, propagating K different vectors through the photonic array. This yields $\lceil I/n \rceil \cdot \lceil J/n \rceil \cdot K$ output vectors (each comprised of n elements), a subset of which may be added together to yield the desired [I×K] output matrix, as defined by the equation above.

X. Precision of the Computation

The inventors have recognized and appreciated that the photonic processor 2-103, and/or any other photonic processor according to other embodiments described in the present disclosure, is an instance of analog computer and, as most data in this information age are stored in a digital representation, the digital precision of the computation performed by the photonic processor is important to quantify. In some embodiments, the photonic processor according to some embodiments performs a matrix-vector product: $\vec{y} = M\vec{x}$, where $\vec{x}$ is the input vector, M is an n×n matrix, and $\vec{y}$ is the output vector. In index notation, this multiplication is written as $y_i = \Sigma_{j=1}^n M_{ij} x_j$ which is the multiplication between n elements of $M_{ij}$ (iterate over j) and n elements of $x_j$ (iterate over j) and then summing the results altogether. As the photonic processor is a physical analog system, in some embodiments the elements $M_{ij}$ and $x_j$ are represented with a fixed point number representation. Within this representation, if $M_{ij} \in \{0,1\}^{m_1}$ is an $m_1$-bit number and $x_j \in \{0,1\}^{m_2}$ is an $m_2$-bit number, then a total of $m_1 + m_2 + \log_2(n)$ bits are used to fully represent the resulting vector element $y_i$. In general, the number of bits used to represent the result of a matrix-vector product is larger than the number of bits required to represent the inputs of the operation. If the analog-to-digital converter (ADC) used is unable to read out the output vector at full precision, then the output vector elements may be rounded to the precision of the ADC.

The inventors have recognized and appreciated that constructing an ADC with a high bit-precision at bandwidths that correspond to the rate at which input vectors in the form of optical signals are sent through the photonic processing system can be difficult to achieve. Therefore, in some embodiments, the bit precision of the ADC may limit the bit precision at which the matrix elements $M_{ij}$ and the vector element $x_j$ are represented (if a fully precise computation is desired). Accordingly, the inventors have devised a method of obtaining an output vector at its full precision, which can be arbitrarily high, by computing partial products and sums. For the sake of clarity, it will be assumed that the number of bits needed to represent either $M_{ij}$ or $x_j$ is the same, i.e. $m_1 = m_2 = m$. However, this assumption however can obviated in general and does not limit the scope of embodiments of the present disclosure.

The method, according to some embodiments, as a first act, includes dividing the bit-string representation of the matrix element $M_{ij}$ and the vector element $x_j$ into d divisions with each division containing k=m/d bits. (If k is not an integer, zeros may be appended until m is divisible by d.) As a result, the matrix element $M_{ij} = M_{ij}^{[0]} 2^{k(d-1)} + M_{ij}^{[1]} 2^{k(d-2)} + \ldots + M_{ij}^{[d-1]} 2^0$, where $M_{ij}^{[a]}$ is the k-bit value of the a-th most significant k-bit string of $M_{ij}$. In terms of bit string, one writes $M_{ij} = M_{ij}^{[0]} M_{ij}^{[1]} \ldots M_{ij}^{[d-1]}$. Similarly, one can also obtain $x_j = x_j^{[0]} 2^{k(d-1)} + x_j^{[1]} 2^{k(d-2)} + \ldots + x_j^{[d-1]} 2^0$, where the vector element $x_j = x_j^{[0]} x_j^{[1]} \ldots x_j^{[d-1]}$ in terms of its bit string. The multiplication $y_i = \Sigma_j M_{ij} x_j$ can be broken down in terms of these divisions as: $y_i = \Sigma_{p=0}^{2(d-1)} ((\Sigma_{a,b \in S_p} \Sigma_j M_{ij}^{[a]} x_j^{[b]}) 2^{2k(d-1-p)}$, where the set $S_p$ is the set of all integer values of a and b, where a+b=p.

The method, as a second act, includes controlling the photonic processor to implement the matrix $M_{ij}^{[a]}$ and propagating the input vector $x_j^{[b]}$, each of which is only k-bit precise, through the photonic processor in the form of encoded optical signals. This matrix-vector product operation performs $y_i^{[a,b]} = \Sigma_j M_{ij}^{[a]} x_j^{[b]}$. The method includes, storing the output vector $y_i^{[a,b]}$ which is precise up to $2k + \log_2(n)$ bits.

The method further includes iterating over the different values of a, b within the set $S_p$ and repeating the second act for each of the different values of a, b and storing the intermediate results $y_i^{[a,b]}$.

As a third act, the method includes computing the final result $\Sigma_{a,b \in S_p} \Sigma_j M_{ij}^{[a]} x_j^{[b]} = \Sigma_{a,b \in X_p} y_i^{[a,b]}$ by summing over the different iterations of a and b with digital electronics, such as a processor.

The precision of the ADC used to capture a fully precise computation according to some embodiments of this method is only $2k+\log_2(n)$ bits, which is fewer than the $2m+\log_2(n)$ bits of precision needed if the computation is done using only a single pass.

The inventors have further recognized and appreciated that embodiments of the foregoing method can be generalized to operate on tensors. As previously described, the photonic processing system can perform tensor-tensor multiplications by using matrix slices and vector slices of the two tensors. The method described above can be applied to the matrix slices and vector slices to obtain the output vector slice of the output tensor at full precision.

Some embodiments of the above method use the linearity of the elementary representation of the matrix. In the description above, the matrix is represented in terms of its Euclidean matrix space and the matrix-vector multiplication is linear in this Euclidean space. In some embodiments, the matrix is represented in terms of the phases of the VBSs and therefore the divisions may be performed on the bit strings representing the phases, instead of the matrix elements directly. In some embodiments, when the map between the phases to the matrix elements is a linear map, then the relationship between the input parameters—the phases of the VBSs and the input vector elements in this case—and the output vector is linear. When this relationship is linear, the method described above is still applicable. However, in general, a nonlinear map from the elementary representation of the matrix to the photonic representation may be considered, according to some embodiments. For example, the bit-string division of the Euclidean space matrix elements from their most-significant k-bit string to the least-significant k-bit string may be used to produce a series of different matrices that are decomposed to a phase representation and implementing using a photonic processor.

The divisions need not be performed on both the matrix elements and the input vector elements simultaneously. In some embodiments, the photonic processor may propagate many input vectors for the same matrices. It may be efficient to only perform the divisions on the input vectors and keep the VBS controls at a set precision (e.g., full precision) because the digital-to-analog converters (DACs) for the vector preparations may operate at a high bandwidth while the DACs for the VBSs may be quasi-static for multiple vectors. In general, including a DAC with a high bit precision at higher bandwidth is more difficult than designing one at a lower bandwidth. Thus, in some embodiments, the output vector elements may be more precise than what is allowed by the ADC, but the ADC will automatically perform some rounding to the output vector value up to the bit precision allowed by the ADC.

XI. Method of Manufacture

Embodiments of the photonic processing system may be manufactured using conventional semiconductor manufacturing techniques. For example, waveguides and phase shifters may be formed in a substrate using conventional deposition, masking, etching, and doping techniques.

FIG. 2-19 illustrates an example method 2-1900 of manufacturing a photonic processing system, according to some embodiments. At act 2-1901, the method 2-1900 includes forming an optical encoder using, e.g., conventional techniques. For example, a plurality of waveguides and modulators may be formed in a semiconductor substrate. The optical encoder may include one or more phase and/or amplitude modulators as described elsewhere in this application.

At act 2-1903, the method 2-1900 includes forming a photonic processor and optically connecting the photonic processor to the optical encoder. In some embodiments, the photonic processor is formed in the same substrate as the optical encoder and the optical connections are made using waveguides formed in the substrate. In other embodiments, the photonic processor is formed in a separate substrate from the substrate of the optical encoder and the optical connection is made using optical fiber.

At act, 2-1905, the method 2-1900 include forming an optical receiver and optically connecting the optical receiver to the photonic processor. In some embodiments, the optical receiver is formed in the same substrate as the photonic processor and the optical connections are made using waveguides formed in the substrate. In other embodiments, the optical receiver is formed in a separate substrate from the substrate of the photonic processor and the optical connection is made using optical fiber.

FIG. 2-20 illustrates an example method 2-2000 of forming a photonic processor, as shown in act 2-1903 of FIG. 2-19. At act 2-2001, the method 2-2000 includes forming a first optical matrix implementation, e.g., in a semiconductor substrate. The first optical matrix implementation may include an array of interconnected VBSs, as described in the various embodiments above.

At act 2-2003, the method 2-2000 include forming a second optical matrix implementation and connecting the second optical matrix implementation to the first optical matrix implementation. The second optical matrix implementation may include one or more optical components that are capable of controlling the intensity and phase of each optical signal received from the first optical matrix implementation, as described in the various embodiments above. The connections between the first and second optical matrix implementation may include waveguides formed in the substrate.

At act 2-2005, the method 2-2000 includes forming a third optical matrix implementation and connecting the third optical matrix implementation to the second optical matrix implementation. The third optical matrix implementation may include an array of interconnected VBSs, as described in the various embodiments above. The connections between the second and third optical matrix implementation may include waveguides formed in the substrate.

In any of the above acts, the components of the photonic processor may be formed in a same layer of the semiconductor substrate or in different layers of the semiconductor substrate.

XII. Method of Use

FIG. 2-21 illustrates a method 2-2100 of performing optical processing, according to some embodiments. At act 2-2101, the method 2-2100 includes encoding a bit string into optical signals. In some embodiments, this may be performed using a controller and optical encoder, as described in connection with various embodiments of this application. For example, a complex number may be encoded into the intensity and phase of an optical signal.

At act 2-2103, the method 2-2100 includes controlling a photonic processor to implement a first matrix. As described above, this may be accomplished by having a controller perform an SVD on the matrix and break the matrix into three separate matrix components that are implemented using separate portions of a photonic processor. The photonic processor may include a plurality of interconnected VBSs that control how the various modes of the photonic processor are mixed together to coherently interfere the optical signals when they are propagated through the photonic processor.

At act 2-2105, the method 2-2100 includes propagating the optical signals though the optical processor such that the optical signals coherently interfere with one another in a way that implements the desired matrix, as described above.

At act, 2-2107, the method 2-2100 includes detecting output optical signals from the photonic processor using an optical receiver. As discussed above, the detection may use phase-sensitive or phase-insensitive detectors. In some embodiments, the detection results are used to determine a new input bit string to be encoded and propagated through the system. In this way, multiple calculations may be performed in serial where at least one calculation is based on the results of a previous calculation result.

XIII. Conclusions

Aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

Aspects of the present application provide a photonic processor capable of performing matrix multiplication at speeds far greater than conventional techniques. The new optical-based processor architecture described herein increases both the speed and energy efficiency of matrix-multiplying processors.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure. For example, the folded photonic processing system may be implemented with the phase stabilizing capabilities described above.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A photonic system comprising:
a modulator configured to be driven by a single electrical modulating signal;
a coherent receiver; and
an optical transformation unit optically coupled between the modulator and the coherent receiver, wherein the optical transformation unit comprises:
a first array of interconnected variable beam splitters (VBSs) comprising a first plurality of optical inputs and a first plurality of optical outputs;
a second array of interconnected VBSs comprising a second plurality of optical inputs and a second plurality of optical outputs; and
a plurality of controllable optical elements, each of the plurality of optical elements coupling a single one of the first plurality of optical outputs of the first array to a respective single one of the second plurality of optical inputs of the second array.

2. The photonic system of claim 1, further comprising an electronic encoder configured to encode a signed, real number onto the single electrical modulating signal.

3. The photonic system of claim 1, wherein the modulator, the coherent receiver and the optical transformation unit are disposed on a common semiconductor substrate.

4. The photonic system of claim 1, wherein the modulator is configured to modulate an optical input signal based on the single electrical modulating signal in accordance with an on-off keying (OOK) modulation scheme.

5. The photonic system of claim 1, wherein the modulator is configured to modulate an intensity and a phase of an optical input signal based on the single electrical modulating signal.

6. The photonic system of claim 5, wherein the modulator is configured to impart the single electrical modulating signal onto the intensity of the optical input signal.

7. The photonic system of claim 1, wherein the modulator is configured to output a modulated optical signal and a reference signal including an optical carrier, and wherein the coherent receiver is configured to beat the modulated optical signal as transformed by the optical transformation unit with the reference signal.

8. The photonic system of claim 1, wherein the coherent receiver comprises a local oscillator and a photodetector.

9. The photonic system of claim 1, wherein the optical transformation unit comprises an optical fiber.

10. The photonic system of claim 1, wherein each of the VBSs of the first and second array comprises a Mach-Zehnder interferometer comprising:
a first beam splitter;
a second beam splitter; and
a first phase modulator configured to modulate a phase of light of an optical mode that couples the first beam splitter and the second beam splitter.

11. The photonic system of claim 1, wherein each of the plurality of controllable optical elements comprises a phase shifter.

12. The photonic system of claim 11, wherein each of the plurality of controllable optical elements further comprises an amplitude modulator.

13. The photonic system of claim 1, further comprising a power tree having an input and a plurality of outputs, one of the plurality of outputs being coupled to the modulator.

14. The photonic system of claim 1, further comprising at least one digital-to-analog converter (DAC) configured to adjust one or more parameters of the first plurality of interconnected VBSs.

15. The photonic system of claim 1, wherein each of the controllable optical elements comprises a variable attenuator and at least one phase shifter.

16. The photonic processor of claim 15, wherein each of the variable attenuators of the controllable optical elements comprises a Mach-Zehnder interferometer.

17. A method for optically processing signed, real numbers, the method comprising:
providing a value representative of a first real number;
modulating, based on the value, a phase of an optical signal and an intensity of the optical signal, the modulating comprising driving a modulator using a single electrical modulating signal;
transforming the modulated optical signal;
mixing the transformed, modulated optical signal with a reference optical signal to obtain an electric output signal; and
obtaining a second value representative of a second real number based on the electric output signal,
wherein transforming the modulated optical signal comprises:
coupling a plurality of optical pulses to a first array of interconnected variable beam splitters (VBSs);
coupling each of a plurality of optical outputs of the first array to one of a plurality of controllable electro-optic elements; and
coupling each of a plurality of optical outputs of the plurality of controllable electro-optic elements to a second array of interconnected VBSs.

18. The method of claim 17, wherein transforming the modulated optical signal further comprises modulating a phase of the modulated optical signal and an intensity of the modulated optical signal.

19. The method of claim 17, wherein the mixing the transformed, modulated optical signal with the reference optical signal comprises mixing the transformed, modulated optical signal with the reference optical signal using a coherent receiver.

20. The method of claim 17, further comprising transmitting the reference optical signal from the modulator to the coherent receiver.

21. The method of claim 17, further comprising generating the reference optical signal having a wavelength substantially equal to a wavelength of the optical signal.

22. The method of claim 17, wherein the modulator comprises a resonant modulator, and wherein the modulating comprises varying a resonance characteristic of the resonant modulator based on the single electrical modulating signal.

23. The method of claim 17, further comprising setting a phase of the reference optical signal to a reference phase, and determining the second real number from the second value based on the reference phase.

24. The method of claim 23, wherein determining the second real number from the second value based on the reference phase comprises accessing a look-up table (LUT) mapping real numbers based on reference phase values.

25. The method of claim 17, wherein transforming the modulated optical signal comprises transmitting the modulated optical signal through an optical fiber.

26. A method for fabricating a photonic system comprising:
fabricating a modulator configured to be driven by a single electrical modulating signal;
fabricating a coherent receiver; and
fabricating an optical transformation unit optically coupled between the modulator and the coherent receiver, wherein fabricating the optical transformation unit comprises:
fabricating a first array of interconnected variable beam splitters (VBSs) comprising a first plurality of optical inputs and a first plurality of optical outputs;
fabricating a second array of interconnected VBSs comprising a second plurality of optical inputs and a second plurality of optical outputs; and
fabricating a plurality of controllable electro-optic elements, each of the plurality of electro-optic elements coupling a single one of the first plurality of optical outputs of the first array to a respective single one of the second plurality of optical inputs of the second array.

27. The method of claim 26, wherein fabricating the modulator, coherent receiver and optical transformation unit comprises fabricating the modulator, coherent receiver and optical transformation unit on a common substrate.

28. The method of claim 26, wherein fabricating the first array of interconnected VBSs comprises fabricating a first plurality of Mach-Zehnder interferometers.

29. The method of claim 28, wherein fabricating the second array of interconnected VBSs comprises fabricating a second plurality of Mach-Zehnder interferometers.

* * * * *